(12) United States Patent
Laurendeau

(10) Patent No.: US 10,613,629 B2
(45) Date of Patent: Apr. 7, 2020

(54) SYSTEM AND METHOD FOR FORCE FEEDBACK INTERFACE DEVICES

(71) Applicant: Chad Laurendeau, Westlake Village, CA (US)

(72) Inventor: Chad Laurendeau, Westlake Village, CA (US)

(73) Assignee: Chad Laurendeau, Westlake Village, CA (US)

( * ) Notice: Subject to any disclaimer, the term of this patent is extended or adjusted under 35 U.S.C. 154(b) by 360 days.

(21) Appl. No.: 15/072,235

(22) Filed: Mar. 16, 2016

(65) Prior Publication Data
US 2016/0282943 A1    Sep. 29, 2016

Related U.S. Application Data

(60) Provisional application No. 62/139,575, filed on Mar. 27, 2015.

(51) Int. Cl.
| | |
|---|---|
| *G06F 3/01* | (2006.01) |
| *G06F 3/0484* | (2013.01) |
| *G06F 3/0362* | (2013.01) |
| *G06F 3/038* | (2013.01) |
| *G06F 30/20* | (2020.01) |

(52) U.S. Cl.
CPC .............. *G06F 3/016* (2013.01); *G06F 3/038* (2013.01); *G06F 3/0362* (2013.01); *G06F 3/04845* (2013.01); *G06F 30/20* (2020.01)

(58) Field of Classification Search
CPC ...... G06F 17/5009; G06F 3/016; G06F 3/038; G06F 3/0362; G06F 3/04845
See application file for complete search history.

(56) References Cited

U.S. PATENT DOCUMENTS

| | | |
|---|---|---|
| 5,184,319 A | 2/1993 | Kramer |
| 5,185,561 A | 2/1993 | Good et al. |
| 5,220,260 A | 6/1993 | Schuler |
| 5,235,868 A | 8/1993 | Culver |

(Continued)

FOREIGN PATENT DOCUMENTS

| | | |
|---|---|---|
| CN | 102218217 B | 1/2016 |
| TW | I462768 B | 12/2014 |

OTHER PUBLICATIONS

International Search Report of Application No. PCT/US2016/022823; dated Jun. 8, 2019.

(Continued)

*Primary Examiner* — Malina D. Blaise
(74) *Attorney, Agent, or Firm* — Ferguson Case Orr Paterson

(57) ABSTRACT

This application is directed to systems, methods, and program code directed to providing accurate interactions with simulations. The present invention provides various embodiments of executing a simulation, including detecting user inputs via an interface device, converting inputs to torque and/or position information for control, adapting this information to specific object or vehicle parameters, combining with vehicle parameters and in simulation information, and outputting new interface device setpoints to the interface device via a continuous control loop. Further, providing stiff position control with variable compliance of this interface device.

23 Claims, 28 Drawing Sheets

(56) References Cited

U.S. PATENT DOCUMENTS

| | | | |
|---|---|---|---|
| 5,389,865 A | 2/1995 | Jacobus et al. | |
| 5,414,337 A | 5/1995 | Schuler | |
| 5,438,529 A | 8/1995 | Rosenberg et al. | |
| 5,459,382 A | 10/1995 | Jacobus et al. | |
| 5,482,056 A | 1/1996 | Kramer | |
| 5,559,412 A | 9/1996 | Schuler | |
| 5,576,727 A | 11/1996 | Rosenberg et al. | |
| 5,589,854 A | 12/1996 | Tsai | |
| 5,592,401 A | 1/1997 | Kramer | |
| D377,932 S | 2/1997 | Schena et al. | |
| 5,623,582 A | 4/1997 | Rosenberg | |
| 5,629,594 A | 5/1997 | Jacobus et al. | |
| 5,631,861 A | 5/1997 | Kramer | |
| 5,666,138 A | 9/1997 | Culver | |
| 5,676,157 A | 10/1997 | Kramer | |
| 5,691,898 A | 11/1997 | Rosenberg et al. | |
| 5,701,140 A | 12/1997 | Rosenberg et al. | |
| 5,721,566 A | 2/1998 | Rosenberg et al. | |
| 5,724,264 A | 3/1998 | Rosenberg et al. | |
| 5,731,804 A | 3/1998 | Rosenberg et al. | |
| 5,734,373 A | 3/1998 | Rosenberg et al. | |
| 5,739,811 A | 4/1998 | Rosenberg et al. | |
| 5,754,023 A | 5/1998 | Roston et al. | |
| 5,767,839 A | 6/1998 | Rosenberg | |
| 5,769,640 A | 6/1998 | Jacobus et al. | |
| 5,805,140 A | 9/1998 | Rosenberg et al. | |
| 5,821,920 A | 10/1998 | Rosenberg et al. | |
| 5,825,308 A | 10/1998 | Rosenberg | |
| 5,828,197 A | 10/1998 | Martin et al. | |
| 5,857,986 A | 1/1999 | Moriyasu | |
| 5,880,714 A | 3/1999 | Rosenberg et al. | |
| 5,907,487 A | 5/1999 | Rosenberg et al. | |
| 5,929,607 A | 7/1999 | Rosenberg et al. | |
| 5,929,846 A | 7/1999 | Rosenberg et al. | |
| 5,930,741 A | 7/1999 | Kramer | |
| 5,956,484 A | 9/1999 | Rosenberg et al. | |
| 5,959,613 A | 9/1999 | Rosenberg et al. | |
| 5,999,168 A | 12/1999 | Rosenberg et al. | |
| 6,015,473 A | 1/2000 | Rosenberg et al. | |
| 6,020,875 A | 2/2000 | Moore et al. | |
| 6,020,876 A | 2/2000 | Rosenberg et al. | |
| 6,020,967 A | 2/2000 | Gregorio et al. | |
| 6,024,576 A | 2/2000 | Bevirt et al. | |
| 6,028,593 A | 2/2000 | Rosenberg et al. | |
| 6,037,927 A | 3/2000 | Rosenberg | |
| 6,042,555 A | 3/2000 | Kramer et al. | |
| 6,046,727 A | 4/2000 | Rosenberg et al. | |
| 6,050,718 A | 4/2000 | Schena et al. | |
| 6,050,962 A | 4/2000 | Kramer et al. | |
| 6,057,828 A | 5/2000 | Rosenberg et al. | |
| 6,061,004 A | 5/2000 | Rosenberg | |
| 6,067,077 A | 5/2000 | Martin et al. | |
| 6,078,308 A | 6/2000 | Rosenberg et al. | |
| 6,078,876 A | 6/2000 | Rosenberg et al. | |
| D427,635 S | 7/2000 | Turchi et al. | |
| 6,088,017 A | 7/2000 | Tremblay et al. | |
| 6,088,019 A | 7/2000 | Rosenberg | |
| 6,100,874 A | 8/2000 | Schena et al. | |
| 6,101,530 A | 8/2000 | Rosenberg et al. | |
| 6,104,379 A | 8/2000 | Petrich et al. | |
| 6,104,382 A | 8/2000 | Martin et al. | |
| 6,106,301 A | 8/2000 | Merril | |
| 6,110,130 A | 8/2000 | Kramer | |
| 6,125,337 A | 9/2000 | Rosenberg et al. | |
| 6,125,385 A | 9/2000 | Wies et al. | |
| 6,128,006 A | 10/2000 | Rosenberg et al. | |
| 6,134,506 A | 10/2000 | Rosenberg et al. | |
| 6,147,674 A | 11/2000 | Rosenberg et al. | |
| 6,148,280 A | 11/2000 | Kramer | |
| 6,154,198 A | 11/2000 | Rosenberg | |
| 6,154,201 A | 11/2000 | Levin et al. | |
| 6,161,126 A | 12/2000 | Wies et al. | |
| 6,166,723 A | 12/2000 | Schena et al. | |
| 6,169,540 B1 | 1/2001 | Rosenberg et al. | |
| 6,184,868 B1 | 2/2001 | Shahoian et al. | |
| 6,191,774 B1 | 2/2001 | Schena et al. | |
| 6,195,618 B1 | 2/2001 | Rosenberg et al. | |
| 6,201,533 B1 | 3/2001 | Rosenberg et al. | |
| 6,211,861 B1 | 4/2001 | Rosenberg et al. | |
| 6,215,470 B1 | 4/2001 | Rosenberg et al. | |
| 6,219,032 B1 | 4/2001 | Rosenberg et al. | |
| 6,219,033 B1 | 4/2001 | Rosenberg et al. | |
| 6,232,891 B1 | 5/2001 | Rosenberg | |
| 6,243,078 B1 | 6/2001 | Rosenberg | |
| 6,246,390 B1 | 6/2001 | Rosenberg | |
| 6,252,579 B1 | 6/2001 | Rosenberg et al. | |
| 6,252,583 B1 | 6/2001 | Braun et al. | |
| 6,256,011 B1 | 7/2001 | Culver | |
| 6,259,382 B1 | 7/2001 | Rosenberg | |
| 6,271,828 B1 | 8/2001 | Rosenberg et al. | |
| 6,271,833 B1 | 8/2001 | Rosenberg et al. | |
| 6,275,213 B1 | 8/2001 | Tremblay et al. | |
| 6,278,439 B1 * | 8/2001 | Rosenberg | A63F 13/06 345/157 |
| 6,281,651 B1 | 8/2001 | Haanpaa et al. | |
| RE37,374 E | 9/2001 | Roston et al. | |
| 6,285,351 B1 | 9/2001 | Chang et al. | |
| 6,288,705 B1 | 9/2001 | Rosenberg et al. | |
| 6,292,170 B1 | 9/2001 | Chang et al. | |
| 6,292,174 B1 | 9/2001 | Mallett et al. | |
| 6,300,936 B1 | 10/2001 | Braun et al. | |
| 6,300,937 B1 | 10/2001 | Rosenberg | |
| 6,300,938 B1 | 10/2001 | Culver | |
| 6,304,091 B1 | 10/2001 | Shahoian et al. | |
| 6,310,605 B1 | 10/2001 | Rosenberg et al. | |
| 6,317,116 B1 | 11/2001 | Rosenberg et al. | |
| 6,323,837 B1 | 11/2001 | Rosenberg | |
| 6,342,880 B2 | 1/2002 | Rosenberg et al. | |
| 6,343,349 B1 | 1/2002 | Braun et al. | |
| 6,348,911 B1 | 2/2002 | Rosenberg et al. | |
| 6,353,427 B1 | 3/2002 | Rosenberg | |
| 6,353,850 B1 | 3/2002 | Wies et al. | |
| 6,366,272 B1 | 4/2002 | Rosenberg et al. | |
| 6,366,273 B1 | 4/2002 | Rosenberg et al. | |
| 6,374,255 B1 | 4/2002 | Peurach et al. | |
| 6,380,925 B1 | 4/2002 | Martin et al. | |
| 6,396,232 B2 | 5/2002 | Haanpaa et al. | |
| 6,400,352 B1 | 6/2002 | Bruneau et al. | |
| 6,408,253 B2 | 6/2002 | Rosenberg et al. | |
| 6,411,276 B1 | 6/2002 | Braun et al. | |
| 6,413,229 B1 | 7/2002 | Kramer et al. | |
| 6,424,333 B1 | 7/2002 | Tremblay et al. | |
| 6,424,356 B2 | 7/2002 | Chang et al. | |
| 6,428,490 B1 | 8/2002 | Kramer et al. | |
| 6,429,846 B2 | 8/2002 | Rosenberg et al. | |
| 6,437,771 B1 | 8/2002 | Rosenberg et al. | |
| 6,445,284 B1 | 9/2002 | Cruz-Hernandez et al. | |
| 6,448,977 B1 | 9/2002 | Braun et al. | |
| 6,469,692 B2 | 10/2002 | Rosenberg | |
| 6,470,302 B1 | 10/2002 | Cunningham et al. | |
| 6,486,872 B2 | 11/2002 | Rosenberg et al. | |
| 6,497,672 B2 | 12/2002 | Kramer | |
| 6,563,487 B2 | 5/2003 | Martin et al. | |
| 6,564,168 B1 | 5/2003 | Hasser | |
| 6,580,417 B2 | 6/2003 | Rosenberg et al. | |
| 6,636,161 B2 | 10/2003 | Rosenberg | |
| 6,636,197 B1 | 10/2003 | Goldberg et al. | |
| 6,639,581 B1 | 10/2003 | Moore et al. | |
| 6,654,000 B2 | 11/2003 | Rosenberg | |
| 6,661,403 B1 | 12/2003 | Rosenberg et al. | |
| 6,680,729 B1 | 1/2004 | Shahoian et al. | |
| 6,683,437 B2 | 1/2004 | Tierling | |
| 6,686,901 B2 | 2/2004 | Rosenberg | |
| 6,686,911 B1 | 2/2004 | Levin et al. | |
| 6,693,622 B1 | 2/2004 | Shahoian et al. | |
| 6,693,626 B1 | 2/2004 | Rosenberg | |
| 6,697,043 B1 | 2/2004 | Shahoian | |
| 6,697,044 B2 | 2/2004 | Shahoian et al. | |
| 6,697,048 B2 | 2/2004 | Rosenberg et al. | |
| 6,697,086 B2 | 2/2004 | Rosenberg et al. | |
| 6,697,748 B1 | 2/2004 | Rosenberg et al. | |
| 6,701,296 B1 | 3/2004 | Kramer et al. | |
| 6,703,550 B2 | 3/2004 | Chu | |
| 6,704,001 B1 | 3/2004 | Schena et al. | |

(56) References Cited

U.S. PATENT DOCUMENTS

| | | |
|---|---|---|
| 6,704,002 B1 | 3/2004 | Martin et al. |
| 6,704,683 B1 | 3/2004 | Hasser |
| 6,705,871 B1 | 3/2004 | Bevirt et al. |
| 6,707,443 B2 | 3/2004 | Bruneau et al. |
| 6,715,045 B2 | 3/2004 | Braun et al. |
| 6,717,573 B1 | 4/2004 | Shahoian et al. |
| 6,750,877 B2 | 6/2004 | Rosenberg et al. |
| 6,762,745 B1 | 7/2004 | Braun et al. |
| 6,781,569 B1 | 8/2004 | Gregorio et al. |
| 6,816,148 B2 | 11/2004 | Mallett et al. |
| 6,817,973 B2 | 11/2004 | Merril et al. |
| 6,822,635 B2 | 11/2004 | Storimans |
| 6,833,846 B2 | 12/2004 | Hasser |
| 6,850,222 B1 | 2/2005 | Rosenberg |
| 6,859,819 B1 | 2/2005 | Rosenberg et al. |
| 6,864,877 B2 | 3/2005 | Braun et al. |
| 6,894,678 B2 | 5/2005 | Rosenberg et al. |
| 6,904,823 B2 | 6/2005 | Levin et al. |
| 6,906,697 B2 | 6/2005 | Rosenberg |
| 6,903,721 B2 | 8/2005 | Braun et al. |
| 6,924,787 B2 | 8/2005 | Kramer et al. |
| 6,928,386 B2 | 8/2005 | Hasser |
| 6,929,481 B1 | 8/2005 | Alexander et al. |
| 6,933,920 B2 | 8/2005 | Lacroix et al. |
| 6,937,033 B2 | 8/2005 | Boronkay et al. |
| 6,946,812 B1 | 9/2005 | Martin et al. |
| 6,956,558 B1 | 10/2005 | Rosenberg et al. |
| 6,965,370 B2 | 11/2005 | Gregorio et al. |
| 6,982,696 B1 | 1/2006 | Shahoian |
| 6,982,700 B2 | 1/2006 | Rosenberg et al. |
| 6,987,504 B2 | 1/2006 | Rosenberg et al. |
| 6,995,744 B1 | 2/2006 | Moore et al. |
| 7,023,423 B2 | 4/2006 | Rosenberg et al. |
| 7,024,625 B2 | 4/2006 | Shalit |
| 7,027,032 B2 | 4/2006 | Shalit |
| 7,038,657 B2 | 5/2006 | Rosenberg et al. |
| 7,038,667 B1 | 5/2006 | Vassallo et al. |
| 7,039,866 B1 | 5/2006 | Rosenberg et al. |
| 7,050,955 B1 | 5/2006 | Carmel et al. |
| 7,054,775 B2 | 5/2006 | Rosenberg et al. |
| 7,056,123 B2 | 6/2006 | Gregorio et al. |
| 7,061,466 B1 | 6/2006 | Moore et al. |
| 7,061,467 B2 | 6/2006 | Rosenberg |
| 7,070,571 B2 | 7/2006 | Kramer et al. |
| 7,084,854 B1 | 8/2006 | Kramer et al. |
| 7,084,884 B1 | 8/2006 | Kramer et al. |
| 7,091,948 B2 | 8/2006 | Chang et al. |
| 7,091,950 B2 | 8/2006 | Rosenberg et al. |
| 7,096,852 B2 | 8/2006 | Gregorio |
| 7,102,541 B2 | 9/2006 | Rosenberg |
| 7,104,152 B2 | 9/2006 | Levin et al. |
| 7,106,305 B2 | 9/2006 | Rosenberg |
| 7,106,313 B2 | 9/2006 | Schena et al. |
| 7,112,737 B2 | 9/2006 | Ramstein |
| 7,113,166 B1 | 9/2006 | Rosenberg et al. |
| 7,116,317 B2 | 10/2006 | Gregorio et al. |
| 7,131,073 B2 | 10/2006 | Rosenberg et al. |
| 7,136,045 B2 | 11/2006 | Rosenberg et al. |
| 7,148,875 B2 | 12/2006 | Rosenberg et al. |
| 7,151,432 B2 | 12/2006 | Tierling |
| 7,151,527 B2 | 12/2006 | Culver |
| 7,154,470 B2 | 12/2006 | Tierling |
| 7,158,112 B2 | 1/2007 | Rosenberg et al. |
| 7,159,008 B1 | 1/2007 | Wies et al. |
| 7,161,580 B2 | 1/2007 | Bailey et al. |
| 7,168,042 B2 | 1/2007 | Braun et al. |
| 7,182,691 B1 | 2/2007 | Schena |
| 7,193,607 B2 | 3/2007 | Moore et al. |
| 7,196,688 B2 | 3/2007 | Schena |
| 7,198,137 B2 | 4/2007 | Olien |
| 7,198,269 B2 | 4/2007 | Burgel |
| 7,199,790 B2 | 4/2007 | Rosenberg et al. |
| 7,202,851 B2 | 4/2007 | Cunningham et al. |
| 7,205,981 B2 | 4/2007 | Cunningham |
| 7,208,671 B2 | 4/2007 | Chu |
| 7,209,028 B2 | 4/2007 | Boronkay et al. |
| 7,209,117 B2 | 4/2007 | Rosenberg et al. |
| 7,209,118 B2 | 4/2007 | Shahoian et al. |
| 7,215,326 B2 | 5/2007 | Rosenberg |
| 7,218,310 B2 | 5/2007 | Tierling et al. |
| 7,233,313 B2 | 6/2007 | Levin et al. |
| 7,233,315 B2 | 6/2007 | Gregorio et al. |
| 7,233,476 B2 | 6/2007 | Goldenberg et al. |
| 7,236,157 B2 | 6/2007 | Schena et al. |
| 7,245,202 B2 | 7/2007 | Levin |
| 7,249,951 B2 | 7/2007 | Bevirt et al. |
| 7,253,803 B2 | 8/2007 | Schena et al. |
| 7,265,750 B2 | 9/2007 | Rosenberg |
| 7,280,095 B2 | 10/2007 | Grant |
| 7,283,120 B2 * | 10/2007 | Grant ..................... G06F 3/016 345/156 |
| 7,283,123 B2 | 10/2007 | Braun et al. |
| 7,289,106 B2 | 10/2007 | Bailey et al. |
| RE39,906 E | 11/2007 | Roston et al. |
| 7,299,321 B2 | 11/2007 | Braun et al. |
| 7,307,619 B2 | 12/2007 | Cunningham et al. |
| 7,308,831 B2 | 12/2007 | Cunningham et al. |
| 7,319,374 B2 | 1/2008 | Shahoian |
| 7,327,348 B2 | 2/2008 | Goldenberg et al. |
| 7,336,260 B2 | 2/2008 | Martin et al. |
| 7,336,266 B2 | 2/2008 | Hayward et al. |
| 7,339,572 B2 | 3/2008 | Schena |
| RE40,341 E | 5/2008 | Salcudean et al. |
| 7,369,115 B2 | 5/2008 | Cruz-Hernandez et al. |
| 7,386,415 B2 | 6/2008 | Gomez et al. |
| 7,404,716 B2 | 7/2008 | Gregorio et al. |
| 7,405,729 B2 | 7/2008 | Gregorio et al. |
| 7,406,943 B2 | 8/2008 | Gregorio |
| 7,423,631 B2 | 9/2008 | Shahoian et al. |
| 7,425,675 B2 | 9/2008 | Chu |
| 7,432,910 B2 | 10/2008 | Shahoian |
| 7,439,951 B2 | 10/2008 | Rosenberg et al. |
| 7,446,752 B2 | 11/2008 | Goldenberg et al. |
| 7,447,604 B2 | 11/2008 | Braun et al. |
| 7,450,110 B2 | 11/2008 | Shahoian et al. |
| 7,453,039 B2 | 11/2008 | Ramstein |
| 7,456,821 B2 | 11/2008 | Yu |
| 7,460,105 B2 | 12/2008 | Rosenberg et al. |
| 7,472,047 B2 | 12/2008 | Kramer et al. |
| 7,477,237 B2 | 1/2009 | Anastas et al. |
| 7,489,309 B2 | 2/2009 | Levin et al. |
| 7,493,365 B2 | 2/2009 | Weis et al. |
| 7,500,853 B2 | 3/2009 | Bevirt et al. |
| 7,502,011 B2 | 3/2009 | Braun et al. |
| 7,505,030 B2 | 3/2009 | Cunningham et al. |
| 7,511,706 B2 | 3/2009 | Schena |
| 7,535,454 B2 | 5/2009 | Jasso et al. |
| RE40,808 E | 6/2009 | Shahoian et al. |
| 7,548,232 B2 | 6/2009 | Shahoian et al. |
| 7,557,794 B2 | 7/2009 | Rosenberg et al. |
| 7,561,141 B2 | 7/2009 | Shahoian et al. |
| 7,561,142 B2 | 7/2009 | Shahoian et al. |
| 7,564,444 B2 | 7/2009 | Rosenberg et al. |
| 7,567,232 B2 | 7/2009 | Rosenberg |
| 7,567,243 B2 | 7/2009 | Hayward |
| 7,573,461 B2 | 8/2009 | Rosenberg |
| 7,589,717 B2 | 9/2009 | Gregorio et al. |
| 7,592,999 B2 | 9/2009 | Rosenberg et al. |
| 7,602,384 B2 | 10/2009 | Rosenberg et al. |
| 7,605,800 B2 | 10/2009 | Rosenberg |
| 7,623,114 B2 | 11/2009 | Rank |
| 7,626,579 B2 | 12/2009 | Hague et al. |
| 7,636,080 B2 | 12/2009 | Rosenberg |
| 7,639,232 B2 | 12/2009 | Grant et al. |
| 7,650,810 B2 | 1/2010 | Levin et al. |
| 7,656,388 B2 | 2/2010 | Schena et al. |
| 7,659,473 B2 | 2/2010 | Ramstein |
| 7,667,687 B2 | 2/2010 | Cruz-Hernandez et al. |
| 7,676,356 B2 | 3/2010 | Carmel et al. |
| 7,679,611 B2 | 3/2010 | Schena |
| 7,688,310 B2 | 3/2010 | Rosenberg |
| 7,696,978 B2 | 4/2010 | Mallett et al. |
| 7,701,438 B2 | 4/2010 | Chang et al. |
| 7,706,000 B2 | 4/2010 | Cohen et al. |

(56) References Cited

U.S. PATENT DOCUMENTS

| | | |
|---|---|---|
| 7,710,399 B2 | 5/2010 | Bruneau et al. |
| 7,728,820 B2 | 6/2010 | Rosenberg et al. |
| 7,742,036 B2 | 6/2010 | Grant et al. |
| 7,755,602 B2 | 7/2010 | Tremblay et al. |
| 7,764,268 B2 | 7/2010 | Gomez et al. |
| 7,765,182 B2 | 7/2010 | Peurach et al. |
| 7,765,333 B2 | 7/2010 | Cruz-Hernandez et al. |
| 7,768,504 B2 | 8/2010 | Rosenberg et al. |
| 7,769,417 B2 | 8/2010 | Tierling et al. |
| 7,777,716 B2 | 8/2010 | Rosenberg et al. |
| 7,779,166 B2 | 8/2010 | Grant et al. |
| 7,791,588 B2 | 9/2010 | Tierling et al. |
| 7,792,334 B2 | 9/2010 | Cohen et al. |
| 7,797,849 B2 | 9/2010 | Gomez et al. |
| 7,806,696 B2 | 10/2010 | Alexander et al. |
| 7,808,488 B2 | 10/2010 | Martin et al. |
| 7,812,493 B2 | 10/2010 | Kobo et al. |
| 7,815,436 B2 | 10/2010 | Cunningham et al. |
| 7,818,153 B2 | 10/2010 | Kramer et al. |
| 7,819,799 B2 | 10/2010 | Merril et al. |
| 7,821,496 B2 | 10/2010 | Rosenberg et al. |
| 7,821,498 B2 | 10/2010 | Kramer et al. |
| 7,825,903 B2 | 11/2010 | Anastas et al. |
| 7,833,018 B2 | 11/2010 | Alexander et al. |
| 7,835,892 B2 | 11/2010 | Butsev et al. |
| 7,839,269 B2 | 11/2010 | Steger et al. |
| 7,843,277 B2 | 11/2010 | Gregorio et al. |
| 7,843,424 B2 | 11/2010 | Rosenberg et al. |
| 7,864,164 B2 | 1/2011 | Cunningham et al. |
| 7,877,243 B2 | 1/2011 | Olien et al. |
| 7,889,174 B2 | 2/2011 | Culver |
| 7,890,863 B2 | 2/2011 | Grant et al. |
| RE42,183 E | 3/2011 | Culver |
| 7,898,396 B2 | 3/2011 | Ulrich et al. |
| 7,916,121 B2 | 3/2011 | Braun et al. |
| 7,920,694 B2 | 4/2011 | Cruz-Hernandez et al. |
| 7,931,470 B2 | 4/2011 | Alexander et al. |
| 7,938,009 B2 | 5/2011 | Grant et al. |
| 7,944,435 B2 | 5/2011 | Rosenberg et al. |
| 7,946,271 B2 | 5/2011 | Gregorio |
| 7,952,559 B2 | 5/2011 | Bailey et al. |
| 7,965,276 B1 | 6/2011 | Martin et al. |
| 7,969,288 B2 | 6/2011 | Braun et al. |
| 7,969,416 B2 | 6/2011 | Tremblay et al. |
| 7,973,769 B2 | 7/2011 | Olien |
| 7,978,183 B2 | 7/2011 | Rosenberg et al. |
| 7,978,186 B2 | 7/2011 | Vassallo et al. |
| 7,979,146 B2 | 7/2011 | Ulrich et al. |
| 7,979,797 B2 | 7/2011 | Schena |
| 7,982,711 B2 | 7/2011 | Anastas et al. |
| 7,982,720 B2 | 7/2011 | Rosenberg et al. |
| 7,986,303 B2 | 7/2011 | Braun et al. |
| 8,000,825 B2 | 8/2011 | Ullrich et al. |
| 8,002,089 B2 | 8/2011 | Jasso et al. |
| 8,004,391 B2 | 8/2011 | Cruz-Hernandez |
| 8,004,492 B2 | 8/2011 | Kramer et al. |
| 8,005,659 B2 | 8/2011 | Nelson et al. |
| 8,007,282 B2 | 8/2011 | Gregorio et al. |
| 8,013,847 B2 | 9/2011 | Anastas |
| 8,018,434 B2 | 9/2011 | Gomez et al. |
| 8,020,095 B2 | 9/2011 | Braun et al. |
| 8,028,431 B2 | 10/2011 | Gomez et al. |
| 8,031,172 B2 | 10/2011 | Kruse et al. |
| 8,031,181 B2 | 10/2011 | Rosenberg et al. |
| 3,063,893 A1 | 11/2011 | Rosenberg et al. |
| 8,049,734 B2 | 11/2011 | Rosenberg et al. |
| 8,059,088 B2 | 11/2011 | Eid et al. |
| 8,059,104 B2 | 11/2011 | Shahoian et al. |
| 8,059,105 B2 | 11/2011 | Rosenberg et al. |
| 8,063,892 B2 | 11/2011 | Rosenberg et al. |
| 8,072,422 B2 | 12/2011 | Rosenberg et al. |
| 8,073,501 B2 | 12/2011 | Tierling et al. |
| 8,077,145 B2 | 12/2011 | Rosenberg et al. |
| 8,093,995 B2 | 1/2012 | Steger et al. |
| 8,098,234 B2 | 1/2012 | Lacroix et al. |
| 8,098,235 B2 | 1/2012 | Heubel et al. |
| 8,102,364 B2 | 1/2012 | Tierling |
| 8,103,472 B2 | 1/2012 | Braun et al. |
| 8,123,660 B2 | 2/2012 | Kruse et al. |
| 8,125,442 B2 | 2/2012 | Chu |
| 8,125,453 B2 | 2/2012 | Shahoian et al. |
| 8,154,512 B2 | 4/2012 | Olien et al. |
| 8,154,537 B2 | 4/2012 | Olien |
| 8,156,809 B2 | 4/2012 | Tierling et al. |
| 8,157,650 B2 | 4/2012 | Grant et al. |
| 8,159,461 B2 | 4/2012 | Martin et al. |
| 8,164,573 B2 | 4/2012 | DaCosta et al. |
| 8,167,813 B2 | 5/2012 | Cohen et al. |
| 8,169,402 B2 | 5/2012 | Shahoian et al. |
| 8,174,372 B2 | 5/2012 | da Costa |
| 8,174,512 B2 | 5/2012 | Ramsein et al. |
| 8,179,202 B2 | 5/2012 | Cruz-Hernandez et al. |
| 8,180,296 B2 | 5/2012 | Flaherty |
| 8,184,094 B2 | 5/2012 | Rosenberg et al. |
| 8,188,981 B2 | 5/2012 | Shahoian et al. |
| 8,188,989 B2 | 5/2012 | Levin et al. |
| 8,212,772 B2 | 7/2012 | Shahoian |
| 8,216,212 B2 | 7/2012 | Grant et al. |
| 8,217,769 B2 | 7/2012 | Ulich et al. |
| 8,232,969 B2 | 7/2012 | Grant et al. |
| 8,244,506 B2 | 8/2012 | Butsev et al. |
| 8,248,363 B2 | 8/2012 | Anastas et al. |
| 8,260,972 B2 | 9/2012 | Cruz-Hernandez et al. |
| 8,264,465 B2 | 9/2012 | Grant et al. |
| 8,279,052 B2 | 10/2012 | Heubel et al. |
| 8,279,172 B2 | 10/2012 | Braun et al. |
| 8,279,193 B1 | 10/2012 | Birnbaum et al. |
| 8,313,330 B2 | 11/2012 | Maspoli et al. |
| 8,315,652 B2 | 11/2012 | Grant et al. |
| 8,316,166 B2 | 11/2012 | Grant et al. |
| 8,325,144 B1 | 12/2012 | Tierling et al. |
| 8,342,853 B2 | 1/2013 | Cohen |
| 8,345,013 B2 | 1/2013 | Goliro et al. |
| 8,351,299 B2 | 1/2013 | Cohen et al. |
| 8,352,643 B2 | 1/2013 | Birnbaum et al. |
| 8,362,882 B2 | 1/2013 | Heubel et al. |
| 8,364,342 B2 | 1/2013 | Springer et al. |
| 8,368,641 B2 | 2/2013 | Tremblay et al. |
| 8,378,795 B2 | 2/2013 | Steger et al. |
| 8,378,964 B2 | 2/2013 | Ullrich et al. |
| 8,378,965 B2 | 2/2013 | Gregorio et al. |
| 8,380,561 B1 | 2/2013 | Viegas et al. |
| 8,390,439 B2 | 3/2013 | Cruz-Hernandez |
| 8,390,594 B2 | 3/2013 | Modarres et al. |
| 8,405,612 B2 | 3/2013 | Krause et al. |
| 8,427,286 B2 | 4/2013 | Grant et al. |
| 8,428,326 B2 | 4/2013 | Falk et al. |
| 8,441,433 B2 | 5/2013 | Olien et al. |
| 8,441,437 B2 | 5/2013 | Rank |
| 8,441,444 B2 | 5/2013 | Moore et al. |
| 8,442,806 B2 | 5/2013 | Ikits et al. |
| 8,451,245 B2 | 5/2013 | Heubel et al. |
| RE44,277 E | 6/2013 | Schena |
| 8,462,116 B2 | 6/2013 | Bruneau et al. |
| 8,462,125 B2 | 6/2013 | Birnbaum et al. |
| 8,469,806 B2 | 6/2013 | Grant et al. |
| 8,480,406 B2 | 7/2013 | Alexander et al. |
| 8,487,873 B2 | 7/2013 | Rosenberg |
| 8,493,177 B2 | 7/2013 | Flaherty |
| 8,493,354 B1 | 7/2013 | Birnbaum et al. |
| 8,502,651 B2 | 8/2013 | Birnbaum |
| 8,502,792 B2 | 8/2013 | Anastas et al. |
| 8,505,469 B2 | 8/2013 | Liu et al. |
| 8,506,369 B2 | 8/2013 | Grant et al. |
| 8,508,486 B2 | 8/2013 | Grant et al. |
| 8,519,947 B2 | 8/2013 | Cruz-Hernandez et al. |
| 8,523,740 B2 | 9/2013 | Kruse et al. |
| 8,527,873 B2 | 9/2013 | Braun et al. |
| 8,531,485 B2 | 9/2013 | Birnbaum et al. |
| 8,540,571 B2 | 9/2013 | Grant et al. |
| 8,542,105 B2 | 9/2013 | Grant et al. |
| 8,542,216 B2 | 9/2013 | Heubel et al. |
| 8,551,002 B2 | 10/2013 | Grant et al. |
| 8,552,982 B2 | 10/2013 | Martin et al. |

(56) References Cited

U.S. PATENT DOCUMENTS

| | | |
|---|---|---|
| 8,554,408 B2 | 10/2013 | Springer et al. |
| 8,564,535 B2 | 10/2013 | Ullrich et al. |
| 8,570,161 B2 | 10/2013 | Ramsay et al. |
| 8,570,296 B2 | 10/2013 | Birnbaum et al. |
| 8,572,293 B2 | 10/2013 | Cruz-Hernandez et al. |
| 8,576,171 B2 | 11/2013 | Grant |
| 8,576,174 B2 | 11/2013 | Cruz-Hernandez et al. |
| 8,581,710 B2 | 11/2013 | Folladare et al. |
| 8,587,417 B2 | 11/2013 | Birnbaum et al. |
| 8,588,758 B2 | 11/2013 | Ullrich |
| 8,590,379 B2 | 11/2013 | Tierling et al. |
| 8,593,269 B2 | 11/2013 | Grant et al. |
| 8,593,409 B1 | 11/2013 | Heubel et al. |
| 8,610,549 B2 | 12/2013 | Modarres et al. |
| 8,619,031 B2 | 12/2013 | Hayward |
| 8,619,051 B2 | 12/2013 | Lacroix et al. |
| 8,621,348 B2 | 12/2013 | Ramsay et al. |
| 8,624,714 B2 | 1/2014 | Gosline et al. |
| 8,624,864 B2 | 1/2014 | Birnbaum et al. |
| 8,629,954 B2 | 1/2014 | Olien et al. |
| 8,638,301 B2 | 1/2014 | Birnbaum et al. |
| 8,638,308 B2 | 1/2014 | Cunningham et al. |
| 8,639,485 B2 | 1/2014 | Connacher et al. |
| 8,648,829 B2 | 2/2014 | Shahoian et al. |
| 8,652,046 B2 | 2/2014 | Ramstein et al. |
| 8,659,210 B2 | 2/2014 | Jiang et al. |
| 8,659,571 B2 | 2/2014 | Birnbaum et al. |
| 8,660,748 B2 | 2/2014 | Springer et al. |
| 8,665,241 B2 | 3/2014 | Heubel et al. |
| 8,686,941 B2 | 4/2014 | Rank |
| 8,688,251 B2 | 4/2014 | Ullrich et al. |
| 2002/0033841 A1 | 3/2002 | Rosenberg |
| 2002/0108804 A1* | 8/2002 | Park ................ B62D 5/005 180/444 |
| 2004/0143379 A1* | 7/2004 | Borroni-Bird ......... B60K 37/06 701/36 |
| 2004/0224766 A1* | 11/2004 | Burgel ................ A63F 13/06 463/37 |
| 2006/0176272 A1 | 1/2006 | Rosenberg |
| 2006/0197741 A1* | 9/2006 | Biggadike ............ B62D 5/006 345/156 |
| 2008/0032794 A1* | 2/2008 | Ware ................... A63F 13/00 463/32 |
| 2009/0099824 A1* | 4/2009 | Falash ................. G09B 9/00 703/8 |
| 2012/0038582 A1* | 2/2012 | Grant .................. G06F 3/016 345/174 |
| 2012/0065784 A1* | 3/2012 | Feldman .............. G06F 3/016 700/280 |
| 2013/0328762 A1* | 12/2013 | McCulloch .......... G02B 27/017 345/156 |
| 2015/0276405 A1* | 10/2015 | Rastegar ............ G01C 19/5783 73/504.12 |
| 2016/0293133 A1* | 10/2016 | Dutt ..................... G06F 8/20 |
| 2016/0317383 A1* | 11/2016 | Stanfield ............. A61H 9/0078 |

OTHER PUBLICATIONS

European Office Action of Application No. 16713237.2-1221; dated Feb. 26, 2019.

European Office Action of Application No. 16713237.2-1221; dated Dec. 20, 2019.

The Simpit: 11 Accuforce Steering Wheel Exclusive Hands on First Look 11, YouTube, Jan. 4, 2015 (Jan. 4, 2015), pp. 1-1, XP054976566, Retrieved from the Internet: URL:https://www.youtube.com/watch?v=iHvVIW WaH8E.

Taiwanese Office of Application No. 105109530; dated Jul. 14, 2017.

Office Action dated Jul. 29, 2019 for ROC (Taiwan) Patent Application No. 107111364.

* cited by examiner

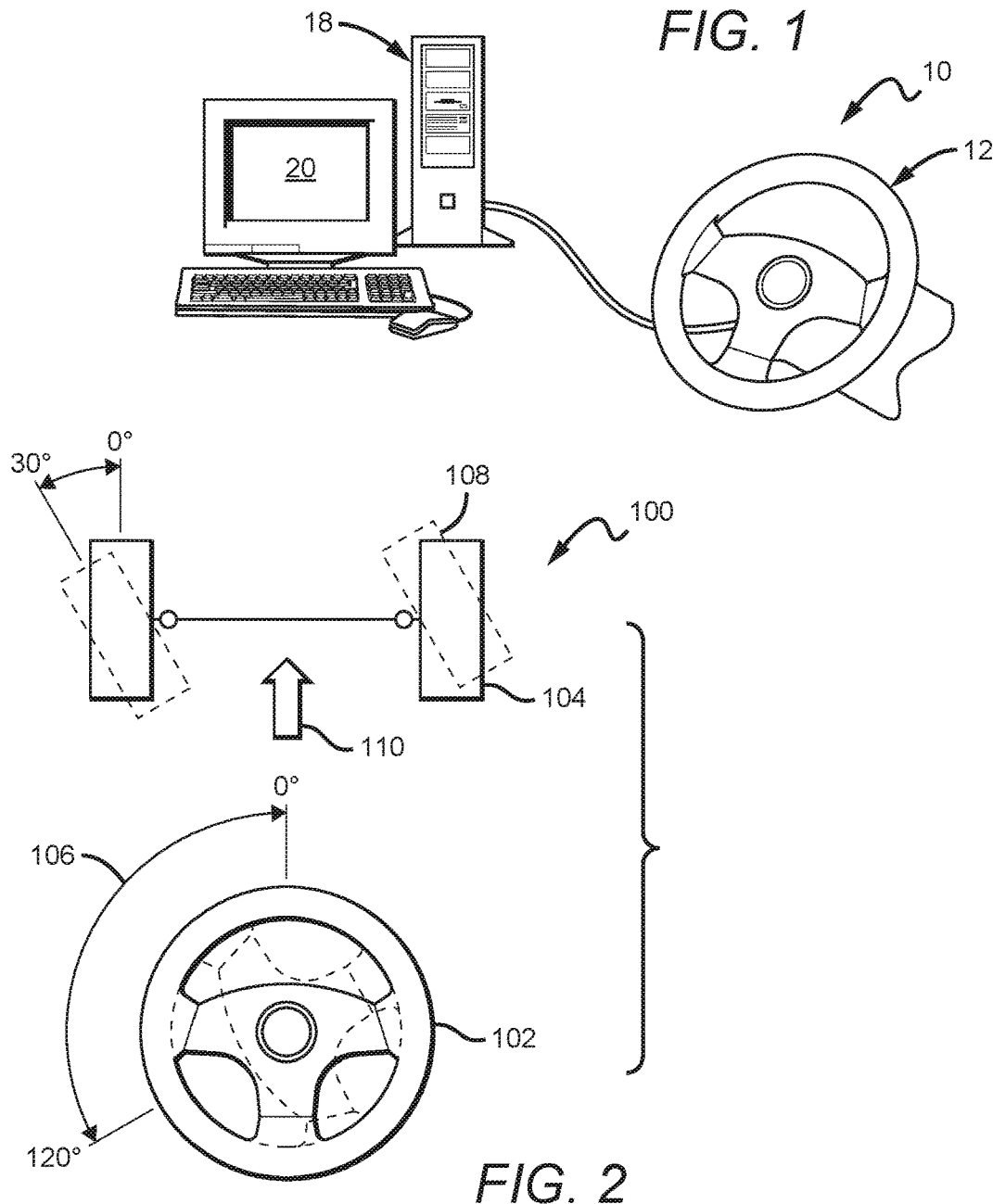
FIG. 1
FIG. 2
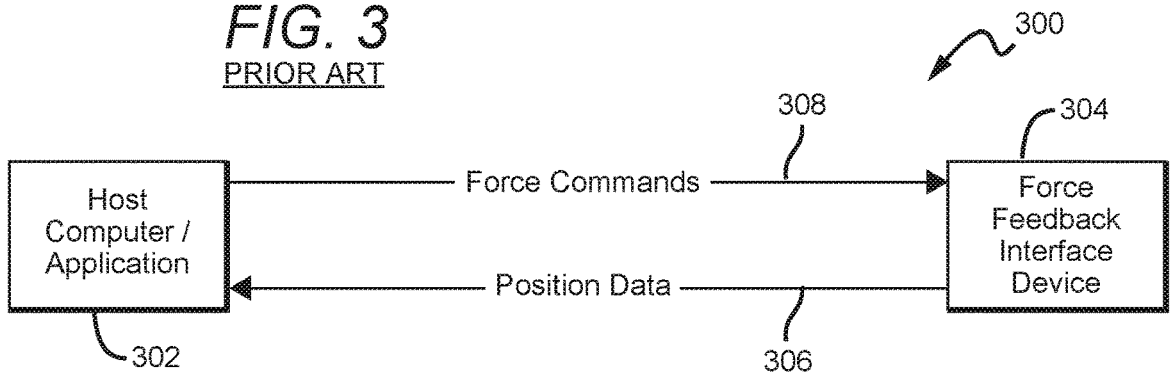
FIG. 3
PRIOR ART

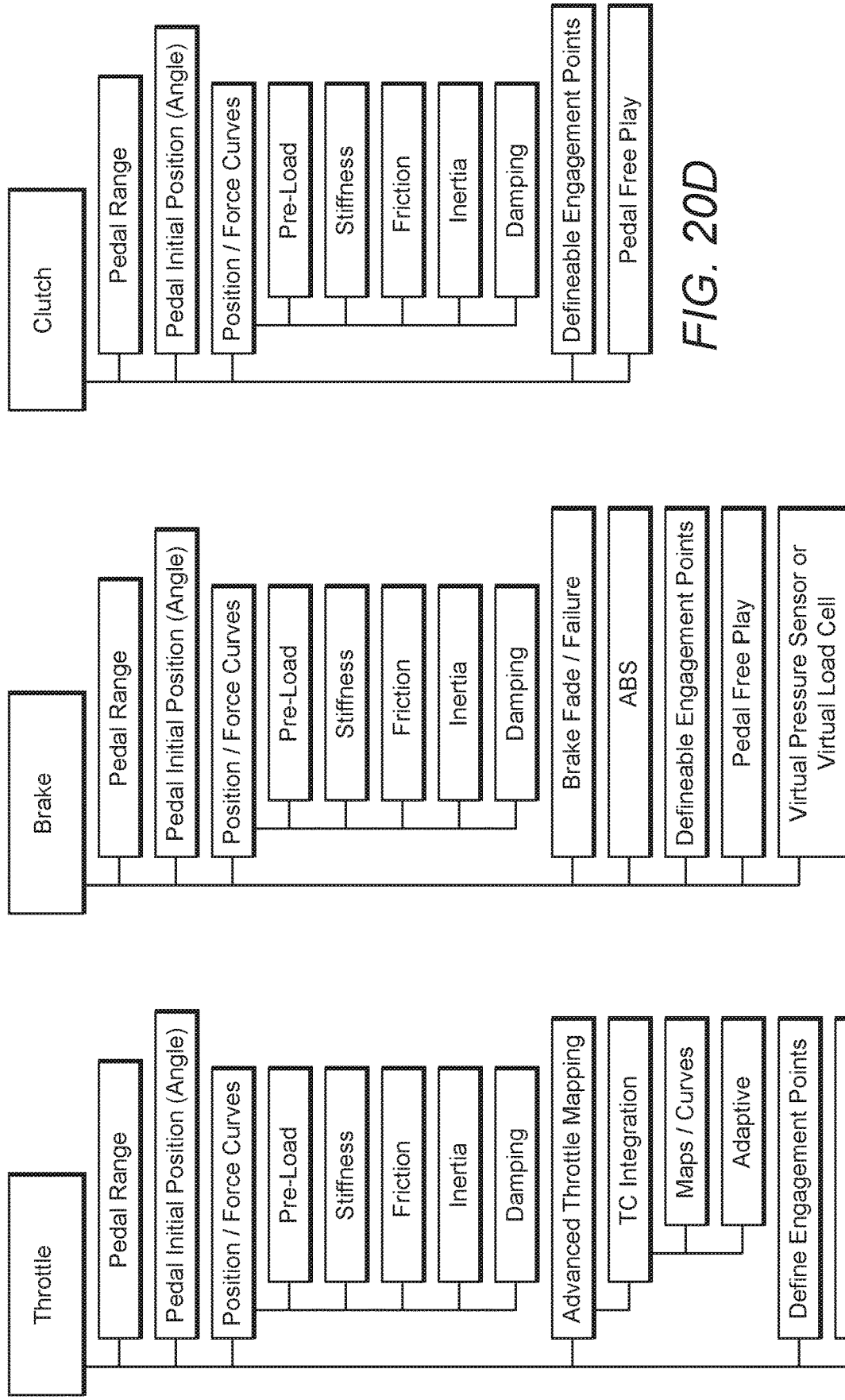

SYSTEM AND METHOD FOR FORCE FEEDBACK INTERFACE DEVICES

CROSS-REFERENCE TO RELATED APPLICATIONS

This application claims the benefit of provisional U.S. Patent Application Ser. No. 62/139,575 to Chad Laurendeau and entitled "SYSTEM AND METHOD FOR FORCE FEEDBACK INTERFACE DEVICES," filed on Mar. 27, 2015, which is incorporated herein by reference in its entirety.

BACKGROUND OF THE INVENTION

Field of the Invention

The present invention relates generally to interface devices and systems of the same between humans and computers, and more particularly to interface devices that provide force feedback to the user.

Description of the Related Art

Computer controlled simulations, games, and training are used extensively in many different industries. Applications can be executed on a vast array of available hardware platforms, from workstations to PCs to game consoles. These hardware types may collectively be referred to as computer systems within this description. Applications are designed to allow a user to interact in a virtual or simulated environment. A computer system displays a visual environment to the user on a display screen, and a user can interact with the simulated environment with a human-computer control input or interface device. Depending on a given hardware implementation, users may have many different types of control input or interface devices at their disposal to interact with a game or simulation. For example, force feedback interface devices can include remotes, joysticks, mice and keyboards, steering wheels, new novel controllers, and others. In some devices, "haptic" feedback is also provided to the user, more generally known as "force feedback." These types of devices can provide physical sensations to the user of the input or interface device corresponding to the object being controlled in the game or simulation. However, these sensations have not been providing an accurate simulation experience.

In most cases, the physical sensations output by the interface device are achieved by the use of one or more active, passive or hybrid actuators. These actuators are controlled by the host computer system and are coupled to the interface device. Typically, the computer system receives sensor signals from the interface device and, in response, sends the appropriate force feedback signals to the actuators of the interface device in conjunction with simulation or game events. The actuators then provide forces on the interface device. The computer system can thus convey "physical sensations" to the user by means of an interface device in conjunction with visual and auditory representation of the object in a simulated environment. For example, in many applications, the feedback provided is in a rumble or vibration form.

The physical sensations—namely force feedback, conveyed by the interface device should mimic the simulated object's real life counterpart as closely as possible to provide an enjoyable, realistic and immersive experience. However, currently this feedback is not realistic. This type of vibration force feedback should indicate when a simulated entity has hit an object or some other experience, which may cause a bump or vibration. Unfortunately, these rumbles or vibrations are not comprehensive when providing some simulated experiences, like a driving experience simulation, as a driving experience is both based on the inputs provided by the user and the feedback of forces provided by the vehicle, such as movement of the steering wheel in response to interaction with the driving surface.

An example of a system that uses an interface device for use with a driving simulation is shown in FIG. 1. In FIG. 1, a force feedback system 10 includes a force feedback interface device 12 and a host computer 18. The illustrated system 10 can be used for a video game, training program or simulation, or other application. A user can manipulate an interface device 12 in one or more degrees of freedom of motion to control objects within an application on a host computer 18. Images are displayed on a display apparatus, such as screen 20, of the computer 18 in response to such manipulations. The computer 18 may be any device with a processing ability, such as a personal computer, workstation, video game console, or other computing or display device. Host computer 18 preferably implements a host application program with which a user is interacting via device 12 and other peripherals, if appropriate, and which can include force feedback functionality. The host computer 18 may run an application, such as a simulation, video game, virtual reality training program or application, or other application program that utilizes input from interface device 12 and outputs force feedback commands to the interface device 12.

Initially, prior art force feedback devices focused on providing maximum haptic fidelity. However, due to the costs associated with the hardware capable of providing the necessary performance, these devices were expensive and impractical for mainstream markets. Therefore, to make force-enabled devices more accessible to the mainstream mass market, more cost effective solutions have been utilized. These solutions use similar design approaches based on limitations related to the technology available to the mainstream consumer at the time, such as PCs and game consoles. This technology has limitations in the areas of communication bandwidth, processing power, and lack of a standardized language for communicating between the host application and interface device. Therefore, manufacturers devised solutions to overcome these limitations in the form of shared force effect processing or "dual-architecture" systems, and the creation of standardized application programming interfaces ("API").

Dual-architecture systems were designed to accommodate the communication bandwidth limitations, as well as the limited processing power of host PCs, by moving the control aspects of the force feedback effects to the interface device. Providing the devices with a local microprocessor allows the storage, management, and computation of the force effects to be done locally. This on-device approach was pursued to reduce the latency effects from time loops associated with sending data to-and-from the device and host for computation.

The dual-architecture hardware system became an industry standard, especially with the introduction of the DirectInput component of the DirectX API from the Microsoft Corporation. DirectInput allowed for standardization of the architecture or system having low level high-frequency force-effects stored and implemented on a local microprocessor, while the high-level supervisory low-frequency force-commands are computed by the host application and transmitted to the interface device.

This standard is pervasive, in-part, due to the popularity of the Windows-based operating system for PCs. Therefore, most force feedback interface devices are now designed, based on DirectInput's capabilities. DirectInput, as a component of DirectX, allows communication in a standardized way with interface devices by utilizing lower levels of programming overhead. This standardization was further enhanced by the creation of a portfolio of force feedback "effects" universal to interface hardware, and easily implemented by application developers through the API. The effects defined in the API are a collection of predefined conditions and forces designed to be executed, based on the "movement" or "position" of the interface device. This creates two control modes of operation: rate control and position control. Rate control is an abstraction, which makes force feedback less intuitive because there is no direct physical mapping between the interface device motion and the commanded motion of the simulated computer entity or game entity. Position control refers to a mapping in which the displacement of the interface device directly dictates displacement of a simulated computer entity or game entity. Although, position control mapping is more intuitive than rate control, it is limited because the simulated entity cannot move unless the user's interface device object is in motion. This is yet another abstraction, and therefore another limitation to the levels of performance of force feedback technology in certain applications.

Currently, force feedback is not realistic and not consistent across devices. Various interface devices function differently and vehicle simulations are governed by the devices. Driving and vehicle simulations should feel uniform, based on the vehicle characteristic, regardless of the device used. Therefore calibration & adjustment of devices to a normalized setting to provide a consistent experience is desired. FIG. 2 shows an exemplary relationship 100 between the interface device 102 and in-game vehicle tires 104. Currently, displacement 106 of the device 102 causes displacement of the tires 108. However, this communication 110 is one directional. Events in the simulation or game do not cause displacement of the tires 108, and therefore the device 102 is not displaced because of in-game forces, instead only displaced by effects, which are passed to the device 102 as force feedback. For example, currently if force feedback is disabled in simulation, the vehicle wheels will not move in response to in-game or in-simulation events. Because force feedback is only provided to the wheel as an effect, not to provide realistic control of the vehicle, tire movement in response to in-simulation events or conditions are not used when force feedback is not on.

This is shown in FIG. 3, which shows an exemplary force feedback information loop 300. This loop is between the host computer or application 302 and the interface device 304. As shown, the interface device 304 sends position data 306 to the application 302. This position data 306 instructs the in-simulation vehicle or tires to move. The application then sends force feedback commands 308 back to the interface device 304. This is unrealistic as actual in-simulation interactions do not impact vehicle or interface device movement, therefore, the completion of this feedback loop, such that in-simulation events impact both vehicle control and the interface device is desirable.

The limitations of the prior art force feedback architecture become apparent in vehicle simulation, gaming, and training applications because the lack of realism, immersion, and overall "feel". For example, in real life an interface device of a vehicle, a steering wheel, is part of a vehicle steering system, which is designed to impart changes in the direction of the vehicle. When the steering wheel is turned by the driver applying rotational force, it converts that force into a steering wheel displacement about its axis, which is governed by the steering ratio. The steering ratio is the ratio of the number of degrees turned at the steering wheel versus the number of degrees the front wheels are deflected about their axis. But, most importantly, steering ratio is also the mechanical advantage dictating the "force" required at the steering wheel necessary to deflect the front wheels about their axis. Therefore, force applied to the steering wheel, according to the real-time system dynamics, will dictate the amount of displacement of the front wheels. And, considering the link between the vehicle and steering wheel consists of a mechanically connected system operating in a closed-loop, the cause and effect of turning the steering wheel is equally valid in reverse. Therefore, "forces" acting on the front wheels, causing them to deflect about their steering axis, will translate through steering system dynamics into a corresponding change in rotational "position" and "force" upon the steering wheel. This bi-directional "position and force" translation in the steering system is governed by kinematic equations and vehicle-specific parameters and therefore not constant across all vehicles.

A problem evident when using prior art force feedback interface devices in vehicle simulation, gaming, and training applications is the current architecture's lack of capability to provide the needed bi-directional simultaneous control of "both" position and force. Considering the pervasiveness of the DirectInput model; the interface hardware, firmware, and host application software have all been shaped by its limitations. The shared-processing DirectInput model, even with advanced combinations of hardware and firmware, is still constrained by the original fundamental relationships inherent in the force feedback control loop. These relationships are illustrated when examining the prior art force feedback loop, as noted in FIG. 3 described above. As mentioned before, the predefined collection of DirectInput API effects are designed to be executed based on the "movement" or "position" of the interface device object—they are not designed to "control the position" of the interface device object. Therefore, as shown in FIG. 3, the current control loop architecture is incapable of bi-directional control, as needed for realistic vehicle simulation.

Additionally, in current simulations, each vehicle's kinematic relationship is the same due to the interface device dynamics (inertia, friction, damping, etc.). These should differ for each different vehicle. For example, currently the same force applied to an interface device, such as a ConstantForce signal of −5,000, will move the wheel the same distance for a formula car vs. a power-assisted SUV, which is unrealistic. Therefore, it is desirable to adjust the interpretation of device data for each vehicle. Additionally, vehicle dynamics should not vary for the same vehicle from device to device, as this also impacts vehicle performance. In simulations, the interface device dictates movement of a simulated vehicle's steering system. This is why there is a desire for "position feedback" in place of the traditional force feedback. The forces felt by a driver through the steering wheel or column are a by-product of the position. Also, with a ConstantForce signal, the application sends a force command and the rotation is based on wheel dynamics. Therefore, the same force command does not provide the same result with different devices.

Another problem evident in prior art haptic interface systems, when used with vehicle simulation, gaming, and training applications is the "offloading" of the simulation of steering rack kinematics and tire force dynamics to the interface device. As described above, the vehicle and steering wheel is a mechanically connected system operating in a closed-loop with a bi-directional "position and force"

relationship dictated by vehicle-specific kinematic equations. However, currently, in simulations, that relationship is dictated by the unique mechanical dynamics of each specific interface device, which determines the device's response to standardized API commands. For example, the Constant-Force effect of the DirectInput library is an open loop vector force with a defined direction, magnitude, and duration, with a range between (−10,000 and 10,000). It is the effect most often used by host application developers to link physics-engine output of steering wheel forces to the interface device. However, a ConstantForce signal of (−5,000) for the exact same duration output by a host application, sent to two different manufacturer's interface devices, could rotate one device's steering wheel by −15° and the other by −45°, because of each interface device unique mechanical dynamics that output the same ConstantForce signal differently due to different motors, gearing, inertia, friction, power supply, etc.

This may be troublesome in the current force feedback loop architecture, as shown in FIG. 3, of first sending out a "force" demand, and then receiving back a steering wheel "position". If the same application, with the same vehicle in simulation, generates a physics-engine derived force of −5 Nm, that force should translate through vehicle-specific kinematics to a defined amount of steering wheel rotation with corresponding force. However, based on the above example with the exact same signal, the steering wheel rotation can vary as much as −30° depending on the interface device used. This −30° variance in the interface device steering wheel position translates to a −2° (based on 15:1 steering ratio) variance in the deflection of the simulated vehicle's front wheels about the steering axis. To underscore this point, a simulated vehicle's steering system dynamics are therefore variable and dictated by the interface device's mechanical dynamics, yielding a system not based in reality. It is desirable to provide a more realistic and consistent system.

Another shortcoming of prior art haptic interface systems in vehicle simulation, gaming, and training applications is the subjective "mapping" of physics-engine forces into the scaled range acceptable for the standardized APIs, and one that corresponds to the mechanical dynamics of the interface device. The host application developer uses a physics-engine to calculate forces; however, these forces usually have no direct correlation to the standardized API force range and especially the force range capable to be generated on the interface device. Lack of mapping leads to force feedback clipping. For example, if a host application's physics-engine calculates a −5 Nm force rotating the steering wheel to the "left" about its axis of rotation, the developer's discretion is used as to what value of DirectInput's ConstantForce effect is appropriate for mapping, i.e., −500 or −5,000. This is compounded by the fact that each interface device, with its own unique mechanical dynamics, would output the mapped ConstantForce signal in a different way. Additionally, currently, host application software in vehicle simulations do not look at force saturation, as force layering and force saturation are an issue, which is not being addressed.

Even though prior art force feedback interfaces and force feedback control systems have attempted to provide quality haptic feedback in vehicle simulation, gaming and training applications, the absence of vehicle-specific kinematic relationships, the lack of integration between interface hardware and host application software, and the limitations of the standardized force feedback application program interfaces ("API"), has led to a continued lack of realism and immersion for users in certain applications. Therefore, improvements and new approaches on these techniques are desirable. A need exists for a force feedback interface system that can allow the host application to function according to its intended design without regard to the dynamics of the interface device. A need exists for a system that can accommodate existing and future control input devices that can be readily connected to, or embedded within said devices. Finally, a need exists for a complete system that is realistic, accurate, reprogrammable, expandable, and most importantly, easily customizable by the user.

SUMMARY OF THE INVENTION

The present invention provides various embodiments of executing a simulation, including detecting user inputs via an interface device, converting inputs to torque and position information for steering, sending this information to a virtual steering rack ("VSR") for adaptation to specific object or vehicle parameters, combining with vehicle parameters and in simulation information, and outputting new interface device set points to the interface device via a continuous control loop.

The present invention is directed to a force feedback system for controlling and providing physical sensations to a user operating a human computer interface device. The interface device is connected to a controlling host computer and includes a separate microprocessor local to the interface device. The local microprocessor receives host commands and implements independent control processes.

More particularly, one embodiment of a system according to the present invention includes a system and method of the present invention for controlling an interface device manipulated by a user, which includes a host computer system for receiving an input control signal and for providing a host command. The host computer updates a host application process in response to the input control signal. An interface device includes a user manipulatable object physically contacted and moveable by a user, an actuator outputting forces felt by the user, a sensor detecting movement or force applied to the user manipulatable object, and a device microcontroller local to the interface apparatus and separate from the host computer for processing host commands, sending and receiving sensor signals, and outputting control values to the actuator.

The microcontroller manages host commanded closed loop stiff position control with position-based variable compliance in a high frequency closed loop control process, based at least in part on sensor signals describing position, motion, or torque of the user manipulatable object, and outputting processor control signals to the actuator. Variable compliance allows for deviations from a setpoint position, depending on applied external force.

The present invention can use a USB interface included on many computers to interface the host computer system with the local microprocessor. A clock is preferably coupled to the host computer system and/or the local processor, which can be accessed for timing data to help determine the signals output to the actuator.

The application process updated by the host computer system preferably includes application software that can be vehicle simulation, gaming, or training software, etc. The host computer system displays images on a visual output device, such as a display screen and synchronizes the images and visual events with the position and motion of the user object, as well as forces applied to the object. Although vehicles and vehicle simulations are specifically referred to in this disclosure, it should be understood that any simulated object may be controlled in this manner. For example, an in simulation entity, such as a person, or even an imagined entity, may be an in in simulation object which is being controlled via the force feedback interface device. Vehicles are specifically referred to in an exemplary manner. The term object may be interchangeably used for a vehicle or a portion of the vehicle such as a tire or tires.

Other innovative features of an embodiment according to the present disclosure are directed to providing improvements in the realism, accuracy and overall "feel" of force feedback systems, especially in the area of vehicle simulation, through the creation of "adaptive controls" which vary according to vehicle-specific parameters and real-time, application-generated telemetry output.

In one aspect of an embodiment, according to the present disclosure, an innovative method provides the functionality required to dynamically adjust the interface device in accordance with the vehicle-specific parameters of the vehicle object in simulation.

In another aspect of an embodiment according to the present disclosure, an innovative method provides the functionality required to simulate a "virtual steering rack" ("VSR") in accordance with the vehicle-specific parameters of the vehicle object in simulation by translating vehicle-specific kinematic forces into interface device position setpoints with corresponding levels of force at each setpoint.

In another aspect of an embodiment according to the present disclosure, an innovative method provides the functionality of a "virtual torque sensor" if the interface device is incapable of providing the required sensor data.

In another aspect of an embodiment according to the present disclosure, an innovative method provides the functionality required to simultaneously control both "position" and "force" of the actuators.

In another aspect of an embodiment according to the present disclosure, an innovative method provides the functionality required to effectuate closed-loop "stiff position control with position-based variable compliance" using standardized APIs, such as DirectInput from Microsoft Corporation.

In another aspect of an embodiment according to the present disclosure, an innovative method provides the functionality for "mapping" the input device's mechanical dynamics in accordance with the vehicle-specific parameters of the vehicle object in simulation.

An embodiment according to the present disclosure advantageously provides for a customizable system that uses a template and plugin-based architecture. The system is based on pre-defined templates of vehicle-specific kinematic settings. If the base settings do not provide a truly immersive experience as demanded by the user, the user can tweak the settings using an intuitive software interface, thereby creating the desired feel required. In addition to customization, the system is also designed for further expansion. This is achieved by the use of the plugin architecture and developer API, thereby allowing further enhancements, updates and increased functionality.

A better understanding of the features and advantages of the present embodiments will be obtained by reference to the following detailed description of the invention and accompanying drawings which set forth illustrative embodiments in which the principles of the invention are utilized.

BRIEF DESCRIPTION OF THE DRAWINGS

FIG. 3 shows a block diagram of prior art force feedback information flow;

FIGS. 20A-20E show diagrams illustrating various interface device configuration parameters according to an embodiment of the present disclosure;

DETAILED DESCRIPTION OF THE INVENTION

Figure 4:
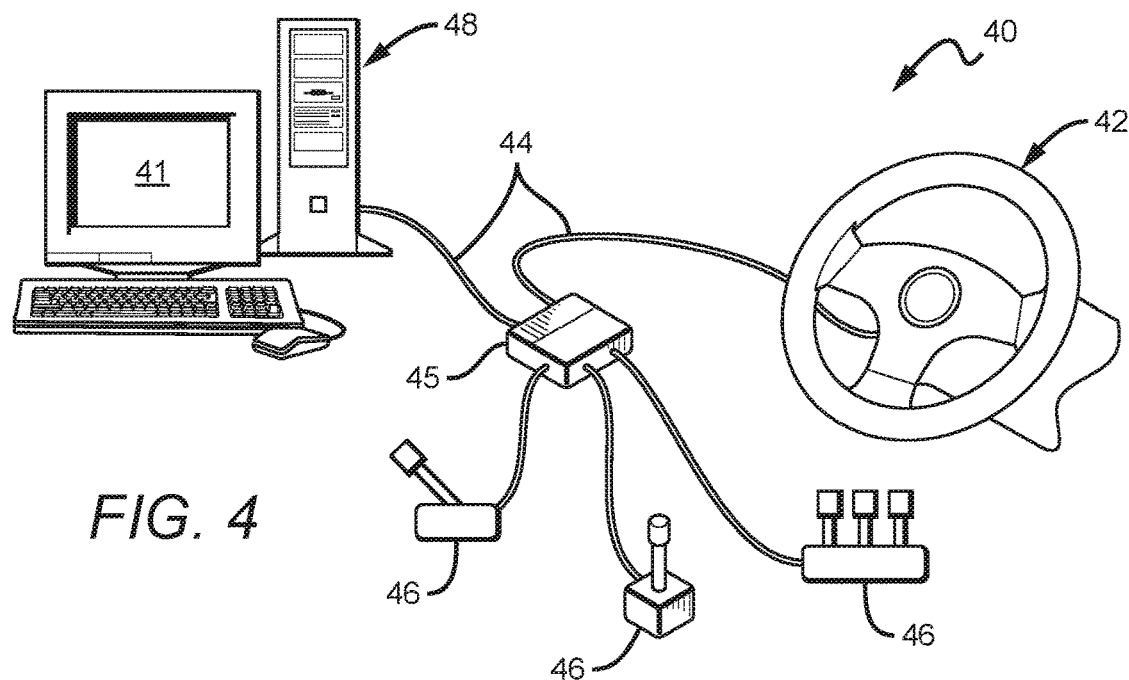
FIG. 4 shows a perspective view of another embodiment of a force feedback system which includes a host computer and a force feedback interface device.

Embodiments of the present invention provide improved force feedback systems. Embodiments according to the present disclosure may improve the realism, accuracy and overall "feel" of force feedback systems in vehicle simulation, gaming, and training through the creation of "adaptive controls," which vary according to vehicle-specific parameters and real-time dynamic application output. These improvements are achieved using a novel combination of hardware and software techniques, which provide for the standardization of force feedback "feel" across devices using vehicle specific kinematics through an innovative force-to-position interface with virtual torque sensing, coupled with a unique method of actuator control and a user customizable interface. To provide the required fidelity for host-controlled, closed-loop force feedback, one embodiment advantageously distributes the computational burden between a processor local to the interface device and the host computer system, while another innovative embodiment manages the required level of control on the host computer utilizing standardized APIs, such as DirectInput from Microsoft Corporation. These and other inventive methods and embodiments of the system are described herein.

The present disclosure will now set forth detailed descriptions of various embodiments. These embodiments provide methods and devices pertaining to force feedback systems, the set ups for the same, and configurations of systems for the same.

The methods and embodiments described below may be implemented with program instructions or code stored on or transferred through a computer readable medium. Such a computer readable medium may be digital memory chips or other memory devices; magnetic media such as hard disk, floppy disk, or tape; or other media such as CD-ROM, DVD, PCMCIA cards, etc. The program instructions may also be transmitted through a channel (network, wireless transmission, etc.) to the host computer or device (where appropriate) from a different source. Some or all of the program instructions may also be implemented in hardware, e.g. using logic gates. In other embodiments, other computers, mediums, processing mechanisms or transmission methods may be used.

In the description that follows, numerous details are set forth in order to provide a thorough understanding of the invention. It will be appreciated by those skilled in the art that variations of these specific details are possible while still achieving the results of the invention. Well-known elements and processing steps are generally not described in detail in order to avoid unnecessarily obscuring the description of the invention.

Throughout this description, the preferred embodiment and examples illustrated should be considered as exemplars, rather than as limitations on the present invention. As used herein, the term "invention," "device," "method," "present invention," "present device" or "present method" refers to any one of the embodiments of the invention described herein, and any equivalents. Furthermore, reference to various feature(s) of the "invention," "device," "method," "present invention," "present device" or "present method" throughout this document does not mean that all claimed embodiments or methods must include the referenced feature(s).

It is also understood that when an element or feature is referred to as being "on" or "adjacent" to another element or feature, it can be directly on or adjacent the other element or feature or intervening elements or features may also be present. It is also understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "outer", "above", "lower", "below", "horizontal," "vertical" and similar terms, may be used herein to describe a relationship of one feature to another. It is understood that these terms are intended to encompass different orientations in addition to the orientation depicted in the figures.

It is understood that when a first element is referred to as being "between," "sandwiched," or "sandwiched between," two or more other elements, the first element can be directly between the two or more other elements or intervening elements may also be present between the two or more other elements. For example, if a first layer is "between" or "sandwiched between" a second and third layer, the first layer can be directly between the second and third layers with no intervening elements or the first layer can be adjacent to one or more additional layers with the first layer and these additional layers all between the second and third layers.

Although the terms first, second, etc. may be used herein to describe various elements or components, these elements or components should not be limited by these terms. These terms are only used to distinguish one element or component from another element or component. Thus, a first element or component discussed below could be termed a second element or component without departing from the teachings of the present invention. As used herein, the term "and/or" includes any and all combinations of one or more of the associated list items.

The terminology used herein is for describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to flowcharts and cross-sectional view illustrations that are schematic illustrations of embodiments of the invention. As such, the arrangements of components can be different, and variations from the shapes of the illustrations as a result, for example, of manufacturing techniques and/or tolerances are expected. Additionally, components shown as a singular component may include multiple components, while aspects shown as a multiple component may be a singular component. Embodiments of the invention should not be construed as limited to the particular arrangements, components, or shapes of the regions or components illustrated herein, but are to include deviations in shapes and components that result, for example, from manufacturing or actual used hardware. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Embodiments of the present disclosure may include both hardware and software components, and how these components work together, each of which are described below separately. With respect to hardware, the system may include a system similar to that shown in FIG. 4. In FIG. 4, a force feedback system 40 may include a force feedback interface device 42 and a host computer 48. The illustrated system 40 can be used for a video game, training program or simulation, or other application. The interface device 42 may be contacted by a user and manipulated in one or more degrees of freedom of motion. Images related to the game or simulation are displayed on a display apparatus, such as screen 41, of the computer 48 in response to such manipulations. In some embodiments, the computer may include a display device.

The computer 48 may be any computer with the ability to host or process the simulation or game, for example a personal computer, workstation, video game console, tablet, mobile computing device, or any other computing or display device. The computer system may be a personal or portable computer which operates under modern operating systems such as Windows™, OS X, Linux, or other operating systems. Alternatively, the host computer system 48 can be one of a variety of home video game systems, such as systems available from Nintendo, Microsoft, or Sony. Alternatively, the system may be a tablet, smart phone, smart TV, or other device capable of processing the game or simulation. In yet other embodiments, it may be possible that the host computer system is built into the interface device 42.

The software running on the host computer 48 may be of a wide variety. For example, the host application program can be a simulation, video game, virtual reality training program or application, or other application program that utilizes input of object 42 and outputs force feedback commands to the object 42. For example, many game application programs include traditional force feedback functionality and may communicate with the force feedback interface device 42 using standard protocols/drivers/APIs, such as DirectX™ from Microsoft. Herein, computer 48 may be referred as displaying "graphical objects" or "computer objects." These objects are not physical objects, but are logical software unit collections of data and/or procedures that may be displayed as images by computer 48 on a display screen 41, as is well known to those skilled in the art. A displayed vehicle, such as a car or an aircraft might be considered a graphical object.

Display device 41 can be included in host computer 48 or can be separate. A display device is anything which is capable of displaying the physical representations of the objects controlled by the interface device 42. Display devices may include standard display screens (LCD, CRT, etc.), 3-D goggles, or any other visual output device. Typically, the host application provides images to be displayed on display device 41 and/or other feedback, such as auditory signals. For example, display screen 41 can display images from a game program.

The interface device 42 as illustrated in FIG. 4 is used to provide an interface to the application running on host computer 48. For example, a device 42 contacted by the user may be a steering wheel movable in one or more degrees of freedom, as described in greater detail subsequently. It will be appreciated that a great number of other types of objects can be used with the method and apparatus of the present invention. In fact, the present invention can be used with any mechanical object where it is desirable to provide a human/computer interface. Such objects may include keyboards, mice, joysticks, pedals (pedal set comprising one or a plurality of pedals), shifters, hand brakes, flight sticks, etc. Though the figure shows a steering wheel and separate pedals or shifting knobs 46 connected via an interface 45, it should be known that these controls may be separated, as shown, incorporated into a single component, or separated in other groupings. In these illustrative embodiments, no specific limitation is intended for any or all of the connections 44 with regard to their particular form, whether analog, digital, wired, wireless, and so on.

The functionality of a steering wheel like input device is well known in the art. For example, these devices generally include a housing with a mechanical apparatus for interfacing mechanical input and output. The mechanical apparatus provides the degrees of freedom available to the device and allows sensors to sense movement in those degrees of freedom and actuators to provide forces in those degrees of freedom. The mechanical apparatus is described in greater detail below. The mechanical apparatus is adapted to provide data from which a computer or other computing device, such as a microprocessor can ascertain the position and/or orientation of the object as it moves in space. This information is then translated to control or impact an image on a display.

Systems may include a computer, such as a personal computer, workstation, video game console, or other computing or display device. Computer systems commonly include a microprocessor, random access memory (RAM), read-only memory (ROM), input/output (I/O) electronics, a clock, a display device, and an audio output device. Microprocessors can include a variety of commercially available microprocessors from Intel, AMD, or other manufacturers, and can be single chip, multiple chip, co-processors, etc. Microprocessors preferably retrieve and store instructions and other necessary data from RAM and ROM as is well known to those skilled in the art. Computer systems can also receive sensor data or a sensor signals. Such data may arrive from I/O devices or elsewhere. This information may be received wirelessly or via a bus from sensor(s) of devices and other information.

Clocks may include a standard clock crystal or equivalent component used by a computer to provide timing to electrical signals used by microprocessors and other components of the computer system and can be used to provide timing information that may be necessary in determining position/compliance values.

Sensor interfaces may optionally be included in electronic interfaces to convert sensor signals to signals that can be interpreted by the microprocessor and/or computer system. For example, sensor interfaces can receive and convert signals from a digital sensor, such as an encoder or from an analog sensor using an analog to digital converter (ADC). Alternately, microprocessors can perform these interface functions or sensor signals from the sensors can be provided directly to the computer system. Actuator interfaces can be optionally connected between the actuators of a device and microprocessors to convert signals from microprocessors into signals appropriate to drive the actuators. Interfaces can include power amplifiers, switches, digital to analog controllers (DACs), and other components well known to those skilled in the art. Alternately, microprocessors can perform these actuator interface functions.

An interface device may include sensors, actuators, and other mechanisms. Sensors sense the position, motion, and/or other characteristics of the device along one or more degrees of freedom and provide signals to microprocessors including information representative of those characteristics. Typically, a sensor is provided for each degree of freedom along which an object can be moved, or, a single compound sensor can be used for multiple degrees of freedom. Examples of sensors suitable for embodiments described herein are digital rotary optical encoders, which sense the change in position of an object about a rotational axis and provide digital signals indicative of the change in position. Linear optical encoders may similarly sense the change in position of an object along a linear degree of freedom. Alternatively, analog sensors, such as potentiometers, can be used. It is also possible to use non-contact sensors at different positions relative to a device, such as magnetic sensors for detecting magnetic fields from objects, or an optical sensor, such as a lateral effect photo diode having an emitter/detector pair. In addition, velocity sensors (e.g., tachometers) and/or acceleration sensors (e.g., accelerometers) can be used. Furthermore, either relative or absolute sensors can be employed.

Actuators transmit forces to objects in one or more directions along one or more degrees of freedom in response to signals output by microprocessors and/or a computer, i.e., they are "computer controlled." Typically, an actuator is provided for each degree of freedom along which forces are desired to be transmitted. Actuators can include three types: active actuators, passive actuators and hybrid actuators. Active actuators include linear current control motors, stepper motors, pneumatic/hydraulic active actuators, a torquer (motor with limited angular range), a voice coil actuator, and other types of actuators that transmit a force to an object. Passive actuators can also be used for actuators, such as magnetic particle brakes, friction brakes, or pneumatic/hydraulic passive actuators, and generate a damping resistance or friction in a degree of motion. Hybrid actuators include attributes of both active and passive actuators. In some embodiments, all or some of the sensors and actuators can be included together as a sensor/actuator pair transducer. An actuator interface can be optionally connected between actuators and microprocessors to convert signals from the microprocessor into signals appropriate to drive actuators. Optionally, some or all of the functionality of the sensor interface and/or actuator interface can be incorporated into the microprocessor, such as pulse width modulation (PWM) controllers for actuators, encoder processing circuitry, etc. Command values can be implemented as analog signals, PWM signals, or other signals that are input to the actuator.

Interface devices can be a steering wheel, joystick, pedal, or other device or article. Other input devices can optionally be included in interface systems and send input signals to microprocessors and/or computers. Such input devices can include buttons, such as buttons on joystick handles, used to supplement the input from the user to a game, simulation, GUI, etc. Also, dials, switches, voice recognition hardware, or other input mechanisms can be used.

A brief overview of vehicle specific architecture is provided herein. With respect to automobile steering system design, coherent haptic feedback is essential for driving real cars and simulators. Many force feedback strategies have been studied; however, the most important fact to come out of the research is that a "zero-torque" system makes driving almost impossible. The steering wheel force felt by the user is the resultant of the road contact forces applied to the tires, and of the kinematic arrangement of the steering system. To enhance user comfort, power steering systems are additionally added to the system to lower the effort required of the user. However, regardless if manual or power-assisted, a steering system needs to convey relevant information regarding the instantaneous dynamics of the vehicle. This information, related to speed and trajectory, is used to reinforce the visual and auditory information to perform the steering task.

The closed loop control system formed by the vehicle and the driver functions dynamically. The driver interfaces with the vehicle through control inputs such as the steering wheel and pedals, and through visual inputs, such as the dashboard readings and shift lights. The driver, as controller, is limited in his abilities to control the vehicle. As a result, the output behavior of the vehicle-driver system is dependent on the characteristics of the vehicle. The properties of the vehicle therefore play a major role in determining whether the vehicle-driver system's road holding behavior will remain stable to outside disturbances.

Therefore, the driver's main objective is to provide directional "control" of the vehicle, as well as maintaining "stability". In a classical sense, control can be either one of two main types: open loop, or closed loop. Open loop (FIG. 3) would be for example, giving the vehicle an initial direction with the steering wheel for instance and then driving "hands-off" assuming that the vehicle will maintain its intended direction. The vehicle would react only to the inputs provided by the driver and would not provide feedback from the outside.

In contrast, a closed loop system (FIG. 6) allows the driver to make continuous control corrections according to the feedback or feel that he gets from the vehicle, forces originating from the vehicle are felt by the user and impact user control. After the initial input, the vehicle will give some response, but it is unlikely to exactly match what the driver requires, therefore some corrective action is necessary. Corrective inputs will be based on the driver's "internal model", which consists of sensory cues and "feel." Feel exists on many levels and some aspects are purely subjective, while others have a scientific basis that can be assigned numerical values based on vehicle dynamics data.

A user's sensory inputs supply visual, tactile and inertial information. Through training and practice, users acquire an "internal model" or "feel" of the dynamic behavior of their vehicle in terms of handling and performance. This allows them to anticipate and plot a future course in response to their actions of the steering wheel. The learning of this "feel" is possible from visual information only, however research has shown that it is enhanced by the presence of relevant haptic feedback—namely steering feedback or "effort." Steering effort is an important feedback mechanism giving the user information on the stability and directional control of the vehicle.

Automobile racing is devoted to extracting the maximum performance from racecar and driver. Therefore, increasing performance in either element is of paramount importance. The racecar-driver interface must be able to control and exploit racecar performance improvements to affect increases in speed and reductions in lap times. Therefore, "optimum steering feedback" is necessary for the driver to extract the maximum performance from the racecar.

The link between the vehicle and steering wheel consists of a mechanically connected system operating in a closed-loop. The steering wheel is part of a vehicle steering "system" which is designed to impart changes in direction of the vehicle. The vehicle steering system is comprised of: a steering wheel, a steering column, one or more universal joints, a rack-and-pinion, and steering tie-rods connected to the front wheels.

When the steering wheel is turned, by the driver applying rotational "force", it converts that force into a steering wheel displacement about its axis, which is governed by the "steering ratio". The steering ratio is the ratio of the number of degrees turned at the steering wheel versus the number of degrees the front wheels are deflected about their axis. But, most importantly, steering ratio is also the mechanical advantage dictating the "force" required at the steering wheel necessary to deflect the front wheels about their axis. Therefore, force applied to the steering wheel, according to the real-time system dynamics, will dictate the amount of displacement of the front wheels. And, considering the link between the vehicle and steering wheel consists of a mechanically connected system operating in a closed-loop, the "cause" and "effect" of turning the steering wheel is equally valid in reverse. Therefore, "forces" acting on the front wheels, causing them to deflect about their steering axis, will translate through steering system dynamics into a corresponding change in rotational "position" and "force" upon the steering wheel. This bi-directional "position and force" translation in the steering system is governed by kinematic equations and vehicle-specific parameters and therefore not constant across all vehicles.

These equations include variables such as: steering ratio, steering column stiffness, damping, inertia, rack stiffness and modeling the steering column as a flexible element. The equations are well known by those skilled in the art, and provide the basis for building a sound mathematical model for steering system dynamics.

Figure 5:
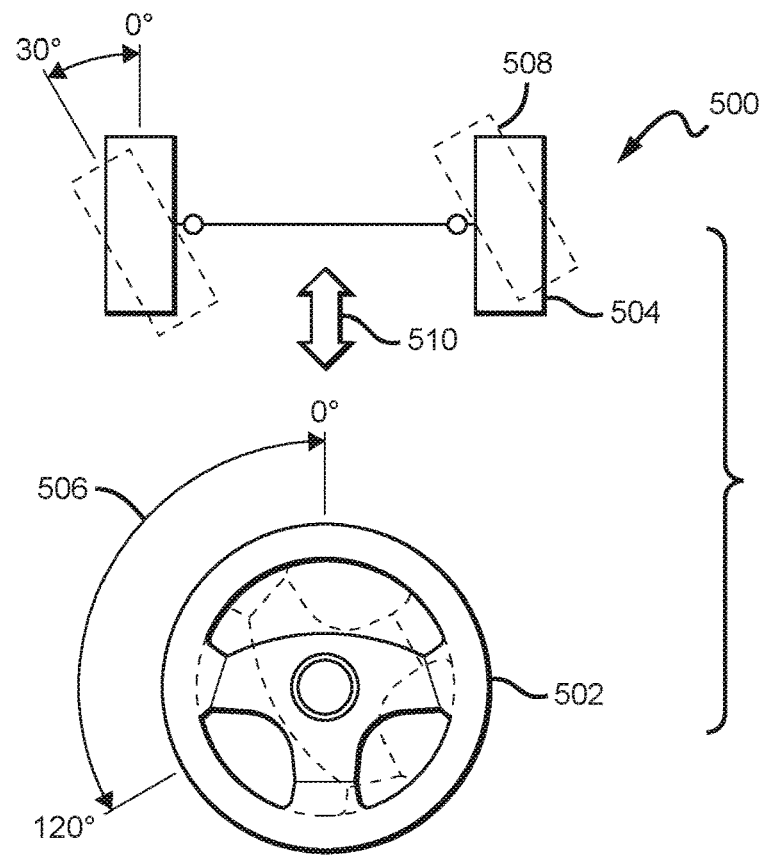
FIG. 5 is a diagram of a bi-directional force feedback system of an embodiment according to the present disclosure.
Figure 6:
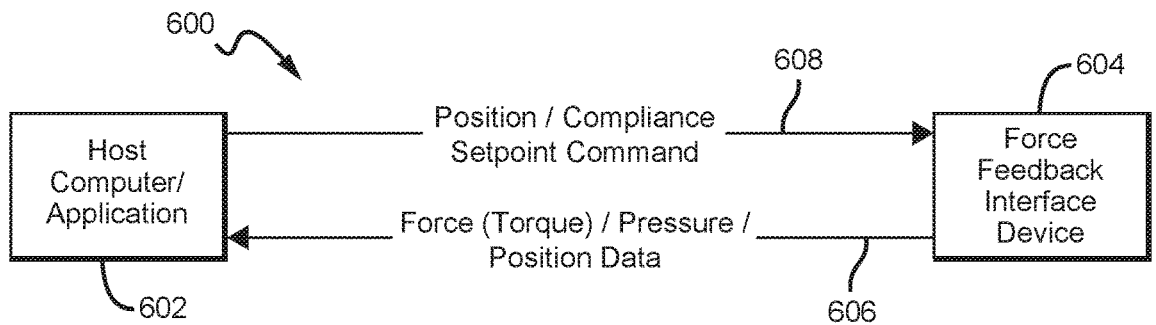
FIG. 6 shows a block diagram of the force feedback control loop of an embodiment according to the present disclosure.
Figure 2:
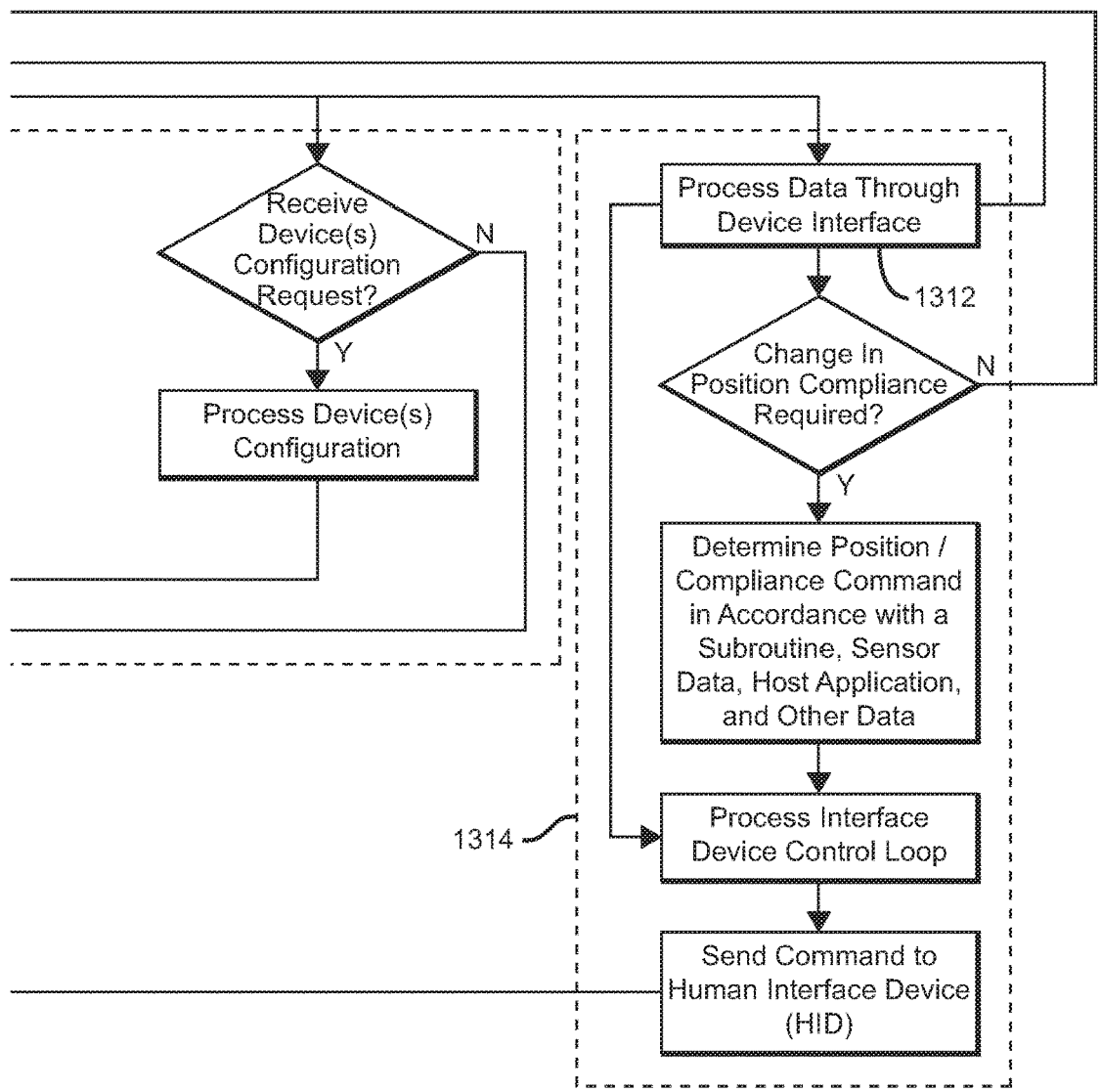
FIG. 2 is a diagram of position control mapping in prior art force feedback systems.

To match reality, a control loop that aligns with the vehicle-steering wheel interface and vehicle controls process would resemble FIGS. 5 and 6. In contrast to the system described above in relation to FIG. 2, the system in accordance to the present disclosure allows for both the displacement of objects in game, because of the displacement of an interface device, such as a joystick or steering wheel, and the displacement of the interface device because of in-game displacement of objects.

Prior art systems run in an open loop system, meaning inputs from interface devices impact in-game objects, but in-game objects and interactions do not impact the interface. Canned outputs and effects may be provided, however, these are merely for effect and do not provide true force feedback.

Systems according to the present disclosure provide a closed loop system, such that both outside of game inputs (interface inputs) and in-game events and objects impact each other. FIG. 5 shows an exemplary relationship 500 between the interface device 502 and in-game vehicle tires 504. Currently, displacement 506 of the device 502 causes displacement of the tires 508. In contrast to the prior art, this communication 510 is bi-directional. Events in the simulation or game do cause displacement of the tires 508, and therefore the device 502 is displaced because of in-game forces, resulting in true force feedback, not only displaced by effects, which are passed to the device 502 as force feedback. For example, even if force feedback on the interface device is disabled in simulation, the vehicle wheels will still move in response to in-game or in-simulation events. Because true force feedback is provided to the wheel, to provide realistic control of the vehicle, and tire movement in response to in-simulation events or conditions are used when force feedback is on or not on.

One achievement of the present invention is to provide a closed loop system which provides true force feedback. This closed loop system results in a control mechanism which supplies an interface device with stiff position control while maintaining variable compliance. In contrast to devices that are stiff or do not have variable compliance (which move to a specific position and remain in the position despite external forces), the control systems according to the present invention have variable compliance which allow deviations from their intended position depending on applied external forces. For example, mimicking a spring mechanism creating a position controlled adaptable spring. Specifically, with the example of a simulation related to a vehicle and an interface device like a steering wheel, an external force acting upon the tires of the vehicle that kinematically moves the tires by a certain degree would thereby move the steering wheel to a certain setpoint. However, the stiffness of the steering wheel at that setpoint, and the force required to move the steering wheel from that setpoint, could vary dramatically depending on numerous variables such as surface type (i.e., sand/gravel, pavement, snow, etc.), vehicle speed, etc., and the counter forces already being applied to the interface device, in this case a steering wheel. Most force feedback systems are actuated by stiff electrical drives that are designed to move against user interaction in a resistant manner. Oftentimes, these drives operate near or in a constant state of "stall," thereby inducing heat and damage to the mechanisms over time. Compliance in actuation can prevent damage from occurring, varying the equilibrium point of the virtual spring. One way to vary the compliance of an actuator is by software control of a stiff actuator. Based on the measurement of the external force or torque, a certain deviation is calculated by the controller and set by the stiff actuator. This type of compliant actuator requires an actuator, a sensor, and a controller that have a high frequency control loop that permits the adjustment of compliance during operation. This is therefore, Variable/Active Compliance.

An example of the closed loop system of this disclosure is shown in FIG. 6, which shows an exemplary true force feedback information loop 600. This loop is between the host computer or application 602 and the interface device 604. As shown, the interface device 604 sends force, pressure and position data 606 to the application 602. This data 606 instructs the in-simulation vehicle or tires to move and, in some cases, with what force to move. The application then sends true force feedback commands, including position and compliance setpoint information, 608 back to the interface device 604. This is a more realistic interaction loop as actual in-simulation interactions impact vehicle or interface device movement. The combination of both interface device and in-simulation object position information is both used to determine the in-game or in-simulation object position, rather than just the interface device. A complete bidirectional loop is created between the in-game object position and the interface device position. More specifically, in FIG. 6, the force feedback control loop consists of: (1) the host computer application sending a position setpoint with corresponding compliance/stiffness for that setpoint to the interface device, and (2) the interface device responding by sending back force (torque) data, "if" input by the user. This control loop is then aligned to the vehicle controls process. The vehicle controls process consists of: (1) the vehicle "presents" steering wheel to the driver based on front wheels location, (2) the driver then applies force (torque) to the steering wheel to effectuate vehicle direction change, (3) in which the steering system and vehicle dynamics determine a new location of the front wheels based on a summation of torques, and (4) leading to the steering system kinematics determining a change in steering wheel position, force (torque), inertia and friction. The loop then feeds back in which a new steering wheel position and compliance are "presented" to the driver and the process begins again.

Figure 7:
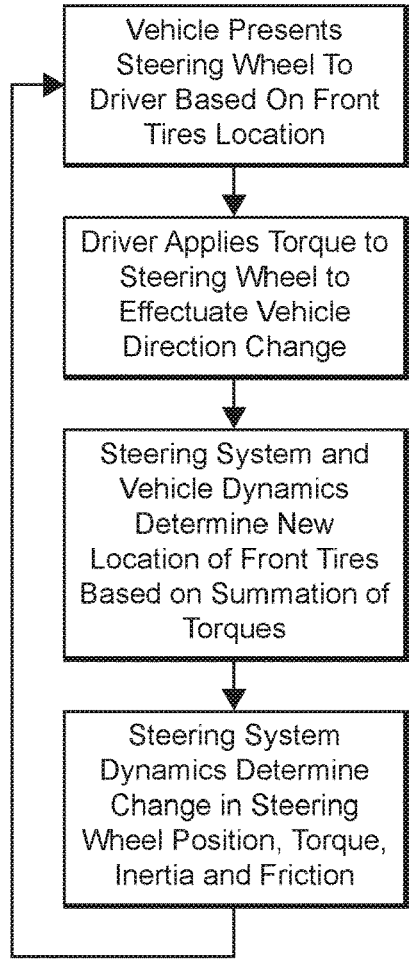
FIG. 7 shows a block diagram of the vehicle controls process of an embodiment according to the present disclosure.

The true force feedback loop of the present disclosure is similar to a real feedback loop in a vehicle, as shown in FIG. 7. This control loop is aligned to the vehicle controls process. The vehicle controls process consists of: (1) the vehicle "presents" steering wheel to the driver based on front wheels location, (2) the driver then applies force (torque) to the steering wheel to effectuate vehicle direction change, (3) in which the steering system and vehicle dynamics determine a new location of the front wheels based on a summation of torques, and (4) leading to the steering system kinematics determining a change in steering wheel position, force (torque), inertia and friction. The loop then feeds back in which a new steering wheel position and compliance are "presented" to the driver and the process begins again.

Figure 8A:
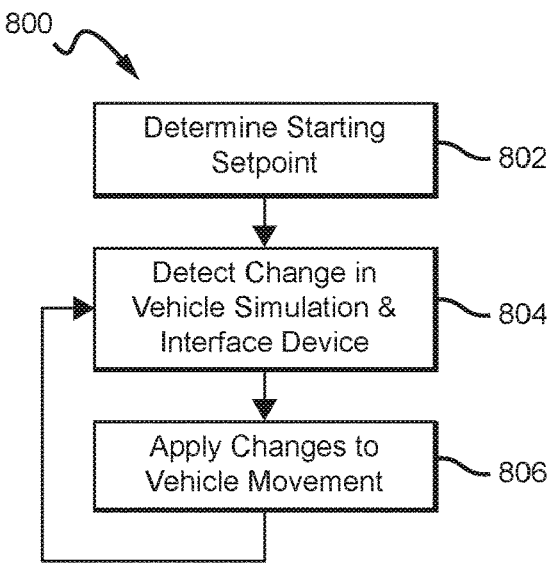
FIG. 8A shows an overview of a force feedback loop system according to an embodiment of the present disclosure.

FIG. 8A is an exemplary flowchart of how a system 800 utilizing a true force feedback loop may function. In the first step 802, a starting setpoint is determined for the system. Next, the system detects changes in both the vehicle simulation and interface device 804. Lastly, the changes detected in step 804 are combined and applied to the vehicle movement. Steps 804 and 806 continue to repeat until the simulation is over.

Figure 8B:
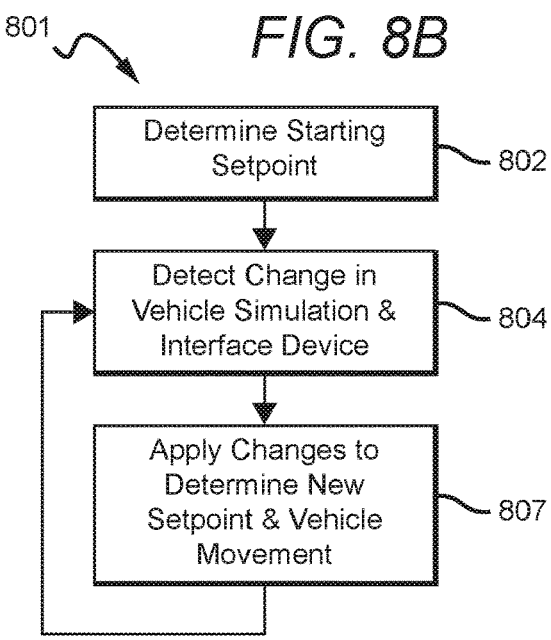
FIG. 8B shows an overview of another embodiment of a force feedback loop system according to the present disclosure.

FIG. 8B shows a similar but alternate embodiment. In this embodiment, steps 802 and 804 of the system 801 are the same as those in FIG. 8A; however, the third step 807 is slightly different. Following detecting changes, the system both applies these changes to impact vehicle movement and also uses this information to determine the new setpoint of the system. The setpoint may be considered the norm of the system, zero point, or at rest point.

Figure 9:
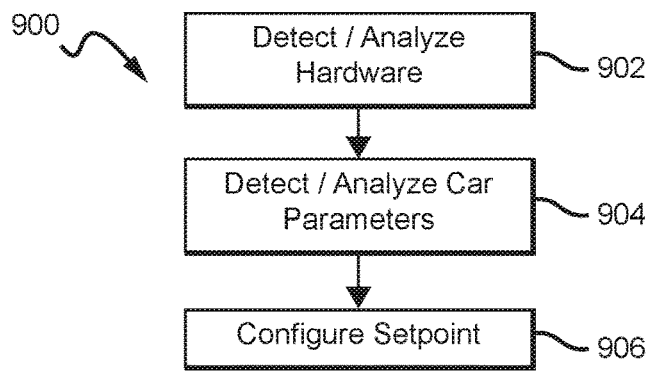
FIG. 9 shows a flowchart pertaining to determining a starting setpoint according to an embodiment of the present disclosure.

FIG. 9 shows a more detailed view 900 of the steps which may take place within the determining setpoint step 802 of FIGS. 8A and 8B. First, the system may detect or analyze the hardware being used with the system 902. For example, this may include detecting what peripheral devices are connected to a system, detecting specifically the capabilities of each of these peripheral devices, and calibrating these devices for the intended use. Next, the system may detect or analyze the vehicle parameters 904 to be used within the simulation. This can include detecting vehicle physics engine related characteristics, to more specific characteristics related to the steering rack, steering ratio, and other particulars. Next, the system configures the setpoint 906 based on the detected and analyzed information.

Figure 10:
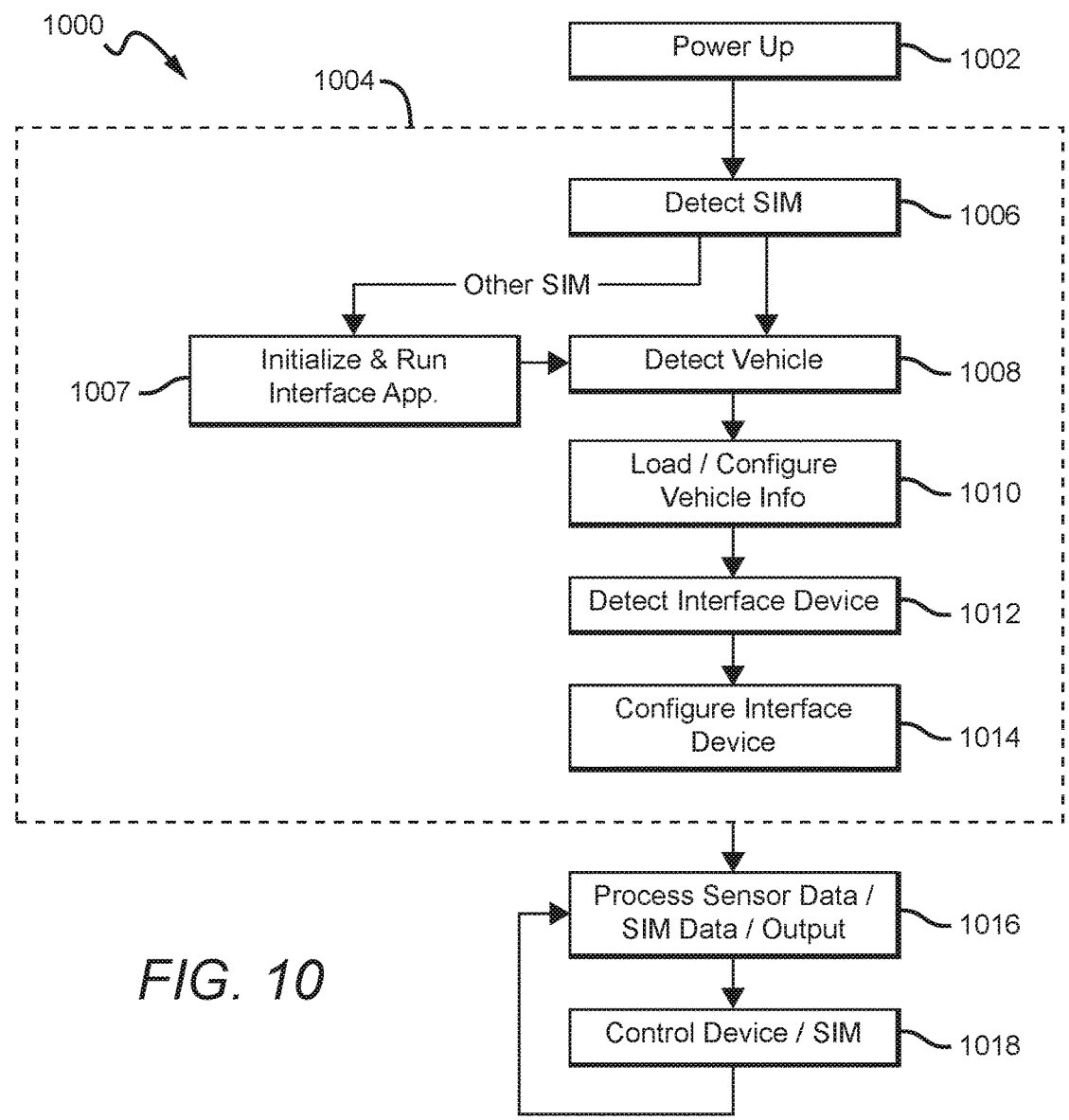
FIG. 10 shows an overview of a force feedback system according to an embodiment of the present disclosure.

FIG. 10 shows a flowchart representing how a system 1000 utilizing the true force feedback loop may function. In the first step 1002, the system must power up. This may be the powering on of a system or simply the instruction to run a particular simulation app or game. Next, the system enters what may be considered a setup mode 1004.

Within the setup mode 1004, the system must detect whether the simulation being run is native to the system or a $3^{rd}$ party simulation 1006. The distinction here is that a $3^{rd}$ party simulation may not natively be able or directed to use a true force feedback loop, instead originally created to use a traditional force feedback system which merely provides effects. If this is a native simulation, the system proceeds to step 1008. Otherwise, the system initializes and runs an interface application to interface or mediate between the system and $3^{rd}$ party simulation 1007. The system then proceeds to step 1008. In step 1008, the system detects the vehicle to be used in the simulation and the related variables associated with this vehicle. Next, in step 1010, the system loads and configures the detected vehicles variables, which would impact the operation and interaction of the vehicle and vehicle control. After simulation detection and vehicle detection is complete, the system moves on to step 1012, which includes detecting the interface devices. Following this detection step, the system configures the interface device 1014 to work with the system. These steps may include reading the device to see what types of sensors it includes, such as force or torque sensors, detecting different configurations of devices, and setting a setpoint of the device and system based on the previous steps. Additionally, it should be noted that these steps may differ based on whether the interface devices are native to the system or are $3^{rd}$ party devices, such that capabilities and sensor types will need to be investigated and improvised around. At this point the setup 1004 steps are complete and the system proceeds into running the simulation.

Following setup, the system begins to process sensor data from the interface device(s) and simulation data and outputs in step 1016. This data from both the device(s) and simulation are then combined to control both the device(s) and the simulation in step 1018. Steps 1016 and 1018 continuously loop until the simulation is terminated.

Figure 11:
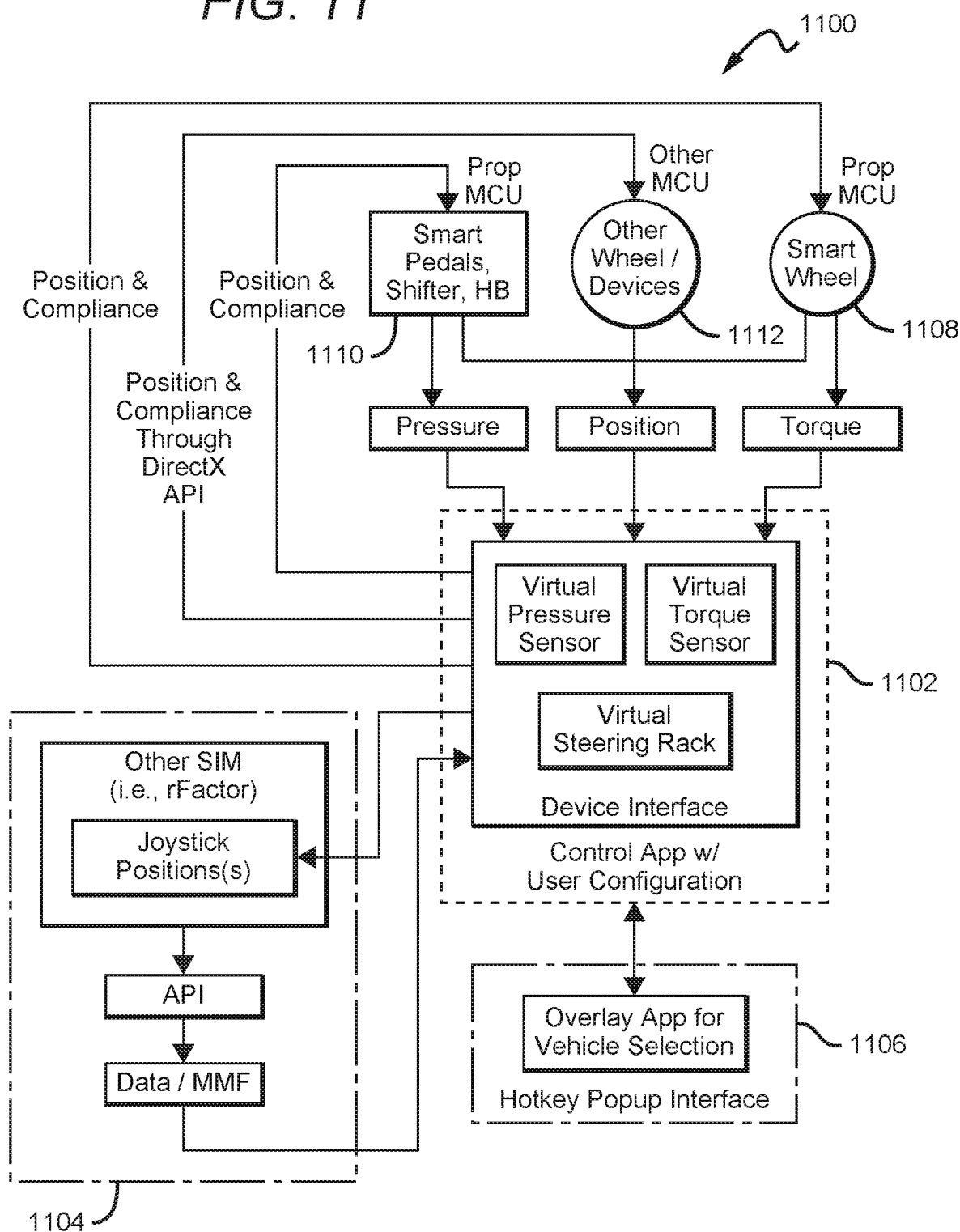
FIG. 11 shows an overview flowchart of a portion of a force feedback system pertaining to inputs and outputs of a (VSR) according to an embodiment of the present disclosure.

FIG. 11 is an exemplary chart showing the components of a system according to one embodiment of the current application. The system 1100 includes a VSR 1102 which accepts inputs from and outputs to interface devices (1108, 1110, 1112) and a simulation (1104, 1106). As described previously, the system according to the present disclosure may be used with associated interface devices 1108, 1110, or which $3^{rd}$ party devices 1112. Also, the system may be used with a native simulation (which may be a portion of the software that includes the VSR 1102) or with third $3^{rd}$ party simulations, which would require additional components, such as those shown in portions 1104 and 1106. As noted in FIG. 11, the use of portions 1104, 1106 will vary depending on the type of application. A simplified version of this figure is included as FIG. 12, which shows the same system using the native simulation rather than a $3^{rd}$ party.

As shown, the control application, which includes the VSR, accepts pressure, position, and torque data, whether native or interpreted from the sensor data, from both native interface devices 1108, 1100, and also from $3^{rd}$ party wheels or devices 1112. The control app and VSR also output position and compliance/stiffness data to the interface devices to provide feedback to the user in accordance with the true force feedback loops described above.

In embodiments where a native simulation is used, the simulation data and feedback is also processed and managed within the application, which contains the VSR. In other embodiments, where a $3^{rd}$ party simulation is used, the system may utilize an overlay or interface application to cooperate with the $3^{rd}$ party simulation. This may include a component for intercepting vehicle selection information 1106. This may also include a component for intercepting or interpreting simulation data, APIs and joystick position information 1104. Data may be saved in memory mapped files or elsewhere.

Figure 12:
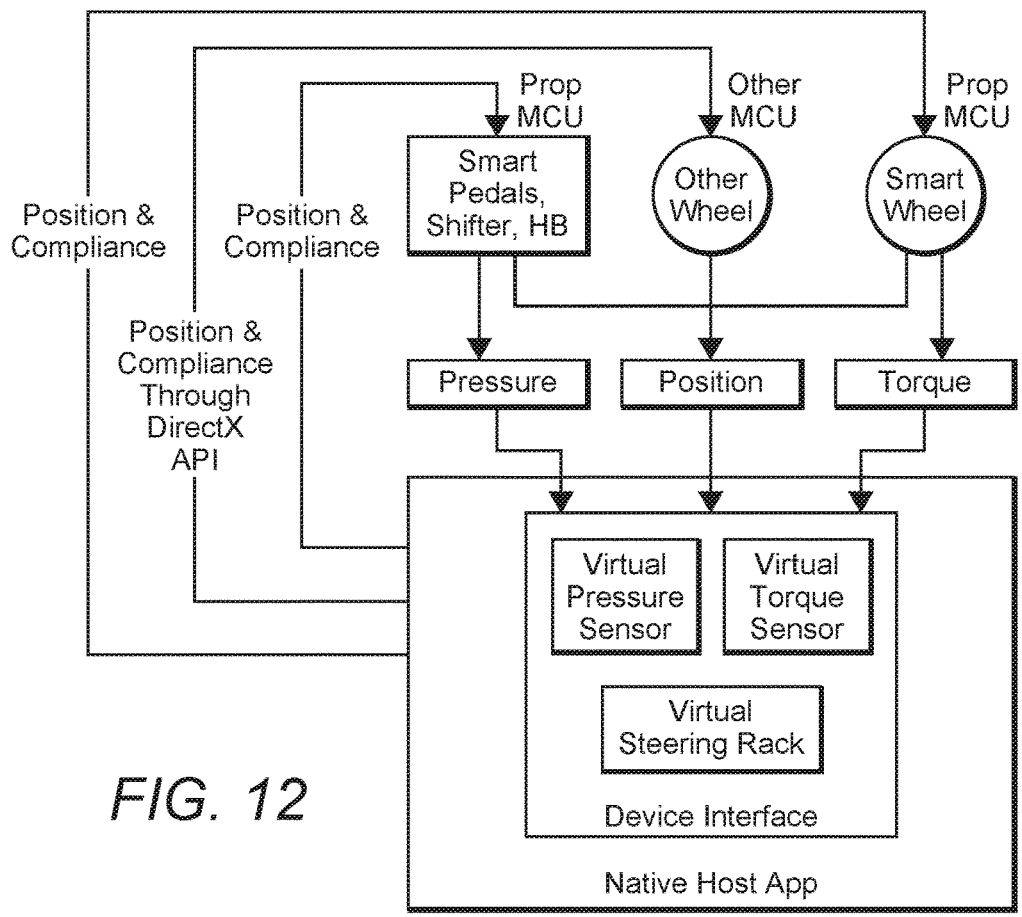
FIG. 12 shows an overview flowchart of a portion of a force feedback system pertaining to inputs and outputs of a VSR according to another embodiment of the present disclosure.

A variety of communication and processing methods may be used to execute the systems shown in FIGS. 11 and 12. For example, USB connection methods may be used between the system and the interface devices. However, it should be noted that any other type of communication channel may be used, such as Bluetooth or other wired and wireless connections. Additionally, the processing of the system data and comments may be executed by processors, which are on the main system, such as a computer; however, in other embodiments, some of this processing may be done on the interface devices, or independent processors.

Figure 13A:
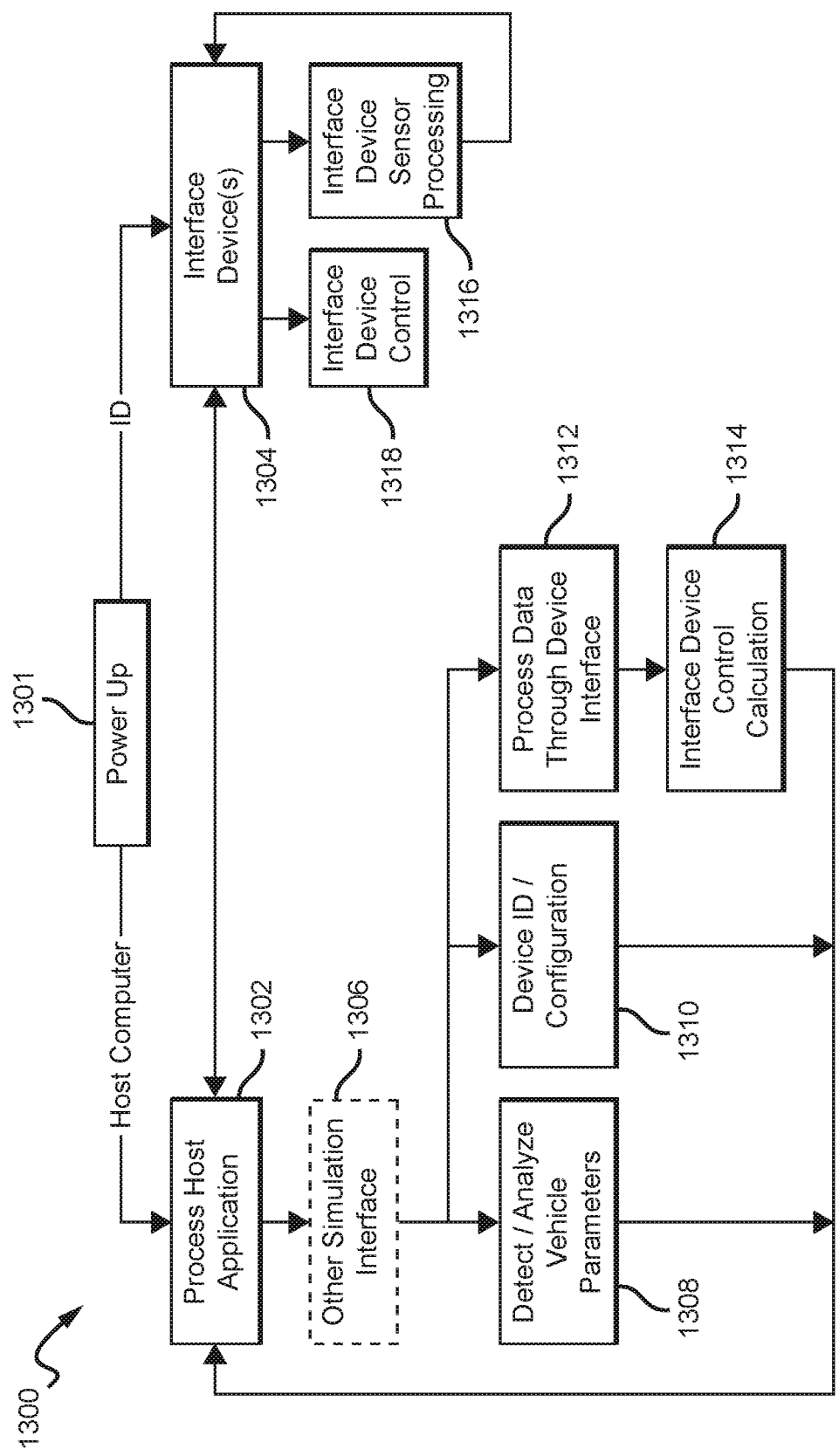
FIG. 13A shows a flow diagram illustrating an embodiment of a method according to the present disclosure for controlling a force feedback interface device.
Figures 1, 13B:
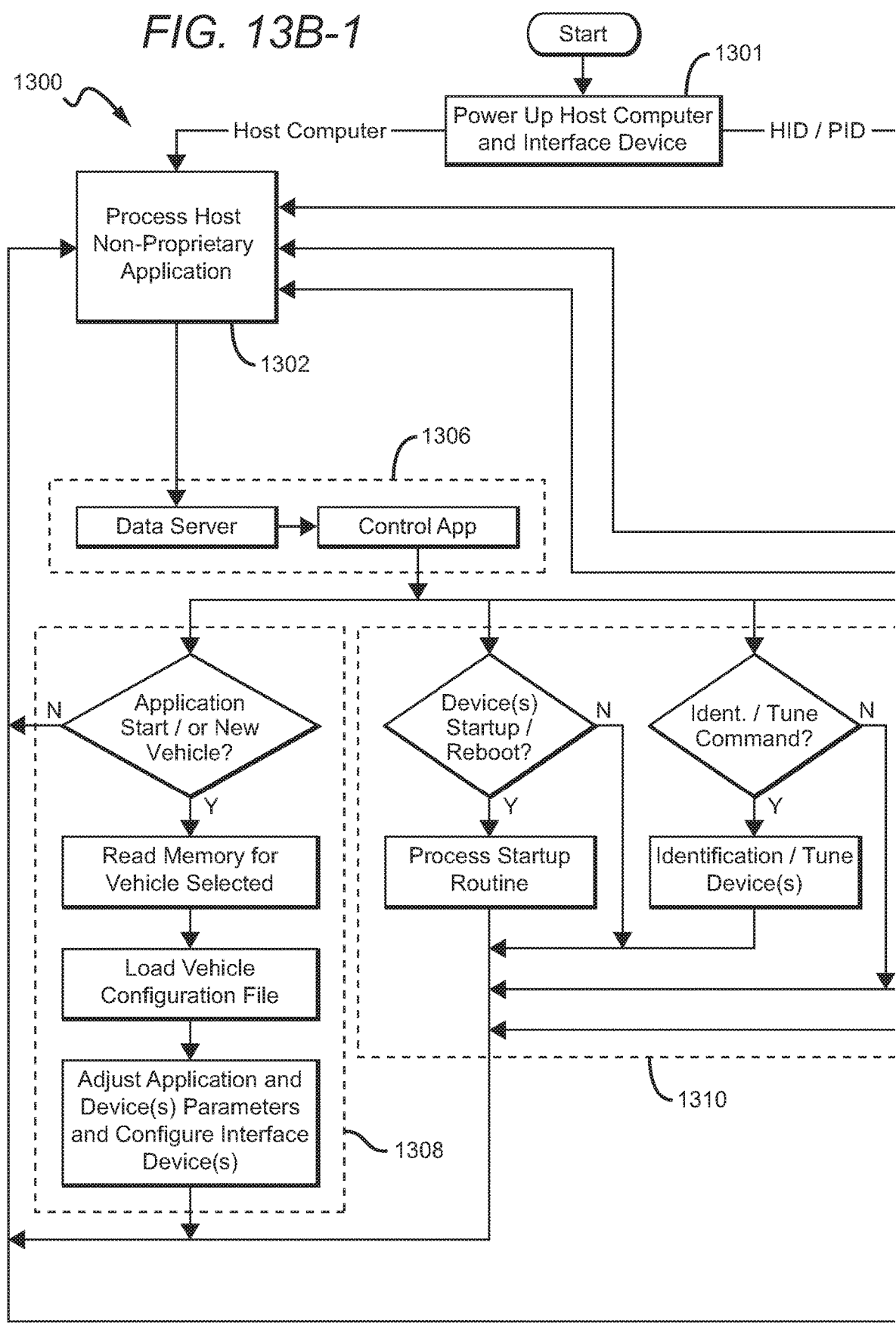
FIG. 1 shows a force feedback system, which includes a host computer and a force feedback interface device.
FIG. 13B (shown on two sheets as FIG. 13B-1 and FIG. 13B-2) shows a flow diagram illustrating a second embodiment of a method according to the present disclosure for controlling a force feedback interface device.
Figure 13B:
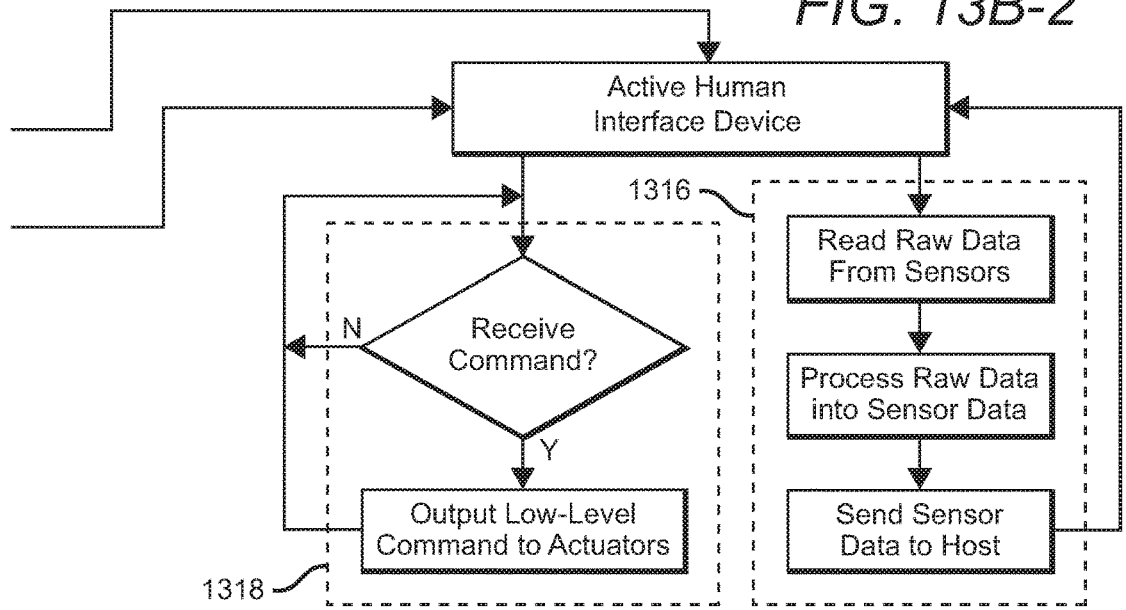

FIGS. 13A and 13B are flow diagrams illustrating an embodiment of a method 1300 for controlling a force feedback system and interface devices according to the present disclosure. Force feedback systems may be run using the systems own software for simulation or $3^{rd}$ party software. Additionally, the system may be run on the system's own interface devices and microprocessors, or $3^{rd}$ party devices and/or microprocessors. Method 1300 is directed to a "host-controlled" embodiment, in which host computer system 1302 maintains closed-loop stiff position control with variable compliance (or true force feedback) over an interface device compatible communication path. In some embodiments, the devices may be controlled by providing direct, low-level commands to the device's microprocessor using standardized USB "HID/PID" device protocols or APIs such as DirectInput, a component of Microsoft's DirectX™. It should be understood that other communication methods and processing levels may be used.

In embodiments which use the Universal Serial Bus ("USB") standard, vendor-specific drivers are not necessarily required of most devices. USB defines a number of "device classes", which define the behavior of devices belonging to this class. The primary class when dealing with input devices is "HID" (Human Input Device). HID devices, for example, are mice, keyboards and game controllers. However, HID devices are not designed to implement force-feedback. Therefore, an extension of the HID class, in the form of "PID" (Physical Interaction Devices) class was created to define the capabilities and standards of force feedback devices. PID class devices have a "descriptor" showing their input/output usages. "Usages" is a term from the HID specification that denotes information describing some aspect of a device. PID usages extend the HID usages with output functionality, such that a device can inform the host what forces, or "effects" it can impart on the interface object.

To impart these "effects" in the Windows-based environment, the DirectInput API in DirectX has become the standard for controlling PIDs. DirectInput defines a set of "effects", each of which has its specific parameters. Hardware vendors can add to the currently defined standard DirectX effects, allowing developers to take advantage of more specific device capabilities in the area of force-feedback. This approach is very flexible, however, is rarely used, since developers don't want to limit their applications to work on one particular device only, but on as many as possible. The standard effects defined by DirectInput are powerful enough to satisfy some needs, so there is hardly any use for vendor-defined effects. The currently defined "standard DirectInput forces" and their parameters are as described below, and can be split in two groups: Output only, and effects within a feedback loop. The standard DirectInput forces are the following: Constant Force: This is the simplest type of force. It represents a force vector with a direction and a magnitude, optionally with an envelope to modulate the force over time. The envelope effect is described below. The constant force effect is an output only effect. Ramp Force: A ramp force is the second most simple force type. A ramp force is defined as a variable constant force. Instead of having a constant magnitude, it has a beginning and ending magnitude and performs a linear sweep between these two ends during the duration of the effect's playback time. As with the constant force, it has a direction and optionally an envelope. The ramp force effect is an output only effect. Periodic: DirectInput defines a number of very similar effects, all of which belong to the group of the periodic effect type. These forces represent different periodical waveforms. All of them have the same parameters: frequency, phase, direction, magnitude, and optionally an envelope. The available waveforms are: square wave, sine wave, triangle wave, sawtooth up wave and sawtooth down wave. The periodic effect is an output only effect. Custom Force: similar to the periodics, a custom force is a periodical waveform. In contrast to the regular periodics, a custom force does not have a predefined waveform; rather, the application defines how the waveform looks by specifying all relevant points on the curve, much like a sound sample. The custom force has the same parameters as a periodic. The custom force effect is an output only effect. Springs: Spring forces apply a force, which changes linearly in response to the deflection from a defined center point. Damper: A damper is much like a spring; the difference is that it doesn't act on a deflection (distance) from a center, but on a difference in velocity from a reference point. Inertia: Again, inertia is very similar to the damper and spring, only that it acts on the acceleration of the controller. Friction: Friction is an effect, where a force gets played as soon as the joystick is moved.

DirectX was designed for, and targeted towards, game developers to allow them to directly and with little overhead communicate with existing hardware, without having to explicitly consider hardware-specific parameters. It can be viewed as a minimal abstraction of hardware. Between the game/simulation (application program) and the hardware there are device drivers, which realize the abstraction for their specific hardware.

FIGS. 13A and 13B show simplified and more detailed flowcharts, which show a method 1300 of controlling true force feedback systems and associated interface devices. The system begins with the initial step of powering up 1301. Once powered up, it can be seen that processing and control then splits into two theoretical branches, the host application/simulation 1302 and the interface device(s) 1304. It should be understood that in a configuration where the host application is native to the interface device, these branches may be combined. The host application 1302 may include the simulation itself or may be interfacing with an external simulation, as optionally shown by portion 1306. Regardless, the method continues by simultaneously detecting or analyzing vehicle parameters 1308, identifying and configuring interface devices 1310 and processing data through the device interface 1312 followed by interface device control calculations 1314. The outputs of these steps are then sent back to the host application 1302, which cooperates with the interface device(s) 1304. The interface device(s) 1304 process interface device sensors 1316 and physically control the interface device 1318 by sending signals and instructions to the interface device motors and actuators based on the sensor processing and outputs from the host application 1302.

More details are shown within each of the components in FIG. 13B. This is illustrated in method 1300, in which the process begins at step 1301. In step 1301, host application 1302 and interface device 1304 are powered up, for example, by a user activating power switches. After step 1301, the process branches into two parallel processes. One process is implemented on host computer system or application 1302, and the other process is implemented on local microprocessor associated with the interface device(s) 1304.

In the host application 1302 process, an application program is processed. This application can be a simulation, video game, training program, or other program. Images can be displayed for a user on an output display screen and other feedback can be presented, such as audio feedback. This step may also determine whether a $3^{rd}$ party simulation is being used or a native simulation. If a $3^{rd}$ party simulation is being utilized, optional steps 1306 are processed.

Referring back to the interface device(s), two branches exit interface device 1304 to indicate that there are two processes running simultaneously (multi-tasking). In one process, step 1316 is implemented, where sensor data is received, processed and sent to the host. The local processor can continually receive signals from sensors, processes the raw data, and sends processed sensor data to the host. "Sensor data", as referred to herein, can include position values, velocity values, and/or acceleration values derived from the sensors, which detect motion of one or more interface devices in one or more degrees of freedom. In addition, any other data received from other input devices can also be received by the host as sensor data in step 1316, such as signals indicating a button on an interface device has been activated by the user. Finally, the term "sensor data" also can include a history of values, such as position values recorded previously and stored in order to calculate a velocity, or torque applied to the interface device object in one or more degrees of freedom. Of course, the host also uses the sensor data as input for the host application to update the host application accordingly. The interface device implements the process branching from step 1314 and starting with step 1318 in parallel with the host computer process described above. In more detail, step 1316 is implemented by the processor reading raw data (sensor readings) from sensors. Such raw data preferably includes position values describing the position of the user object along provided degrees of freedom. Sensors are relative sensors that provide position values describing the change in position since the last position read. Processors can determine the absolute position by measuring the relative position from a designated reference position. In alternate embodiments, sensors can include velocity sensors and accelerometers for providing raw velocity and acceleration values of the interface device. The raw data read in step 1316 can also include other input, such as from an activated button or other control of interface device.

After sensor data is read in step 1316, the process continues to step 1318, where incoming sensor data or new position/compliance commands from parallel process's step 1314 updates the "low-level" HID/PID interface device control loop that manages the "position and compliance" values of the interface device. After step 1314 completes, step 1314 outputs the DirectInput API ConstantForce command to the interface device's microprocessor. This ConstantForce command typically includes a direction and magnitude value that was determined in accordance with the parameters described above. In other embodiments, where DirectX is not utilized, other variables and methods may be used to pass on the force, position and compliance variables. The process then returns to step 1304, which communicates with 1302, such that the host can update the application program in response to the user's manipulations of devices and any other user input received, as well as determine if position and compliance values need to be changed and applied in the parallel process. These steps are implemented in a continual loop of reading data from the local processor and updating the interface device position and compliance values.

The steps originating from the host 1302 are concerned with the process of the host computer or application determining position/compliance commands to provide force feedback to the user manipulating the interface device. If a $3^{rd}$ party simulation is being used, next the method continues with step 1306, in which a separate app/subroutine reads raw data from the host or $3^{rd}$ party simulation and stores it in a sharable memory-mapped file ("MMF") data structure. This data structure provides for seamless and rapid access to data. It also allows for the storing of data, which is not a capability of the simulation application. This process provides the capability of the data to be "served" to other applications downstream of the host application without inducing latency in the host application. This is critical for maximum host application performance. For example, a separate application/subroutine reads the raw data from the MMF file and processes it according to a set of kinematic algorithms. The algorithms are pre-defined and standardized but certain configuration variables are vehicle specific and aid in the accurate determination of position/compliance values for the user interface device using the Force-to-Position Interface (referred to herein as "F2PI").

In steps 1312 and 1314, a determination is made if a change in position/compliance is required of the interface device. If no change in position/compliance is currently required, then the process returns to the host to update the host application and return to the interface device to again start the processing loop until such a change in position/compliance is required. When such a change is required, interface device control calculations in step 1314 are implemented, in which a host computer determines appropriate DirectInput API ConstantForce commands to be sent to the local microprocessor of the interface device.

In step 1312, the received raw data into sensor data may be processed, if applicable. For example, this processing may include two steps: computing velocity and/or acceleration values from raw position data (if velocity and/or acceleration are needed to compute forces), and filtering the computed velocity and acceleration data. The velocity and acceleration values are computed from raw position data received and stored position and time values. Preferably, a number of position values and time values corresponding to when the position values were received may be stored either in the application or device. The velocity and acceleration can be computed using the stored position data and timing data, as is well known to those skilled in the art. The calculated velocity and/or acceleration values can then be filtered to remove noise from the data, such as large spikes that may result in velocity calculations from quick changes in position of interface devices. Thus, the sensor data in the described embodiment includes position, velocity, acceleration, and other input data. In an alternate embodiment, circuitry that is electrically coupled to but separate from the processor can receive the raw data and determine velocity and acceleration. For example, an application-specific integrated circuit (ASIC) or discrete logic circuitry can use counters or the like to determine velocity and acceleration to save processing time on the microprocessor. This raw data may be processed either on the interface device or the host application. This would require the host to filter and compute velocity and acceleration from the position data. Thus, it is preferred that the interface device do this processing to reduce the amount of processing performed on the host.

In other embodiments, the filtering can be performed on the host while the velocity and acceleration calculation can be performed on the interface device. Also, in embodiments where velocity and/or acceleration sensors are used to provide raw velocity and acceleration data, the calculation of velocity and/or acceleration can be omitted.

Step 1318 is concerned with the processor of the interface device controlling the actuators or other devices on the interface device to provide forces calculated by the host. This begins by checking if a command has been received. If not, the process continually checks for such a force command. When a force command has been received, the processor of the interface device outputs a low-level processor force command to the designated actuators to set the output force to the desired magnitude, direction, etc. This force command may be equivalent to the received DirectInput API ConstantForce command from the host, or optionally converted to an appropriate form usable by the actuator (or the actuator interface can perform such conversion). The process then returns to check for another force command.

In addition, a clear command may be available to the host. This command can include a parameter specifying particular degrees of freedom and allows the host computer to cancel all commands/forces in the specified degrees of freedom. This allows commands/forces to be removed before other commands/forces are applied.

Also, a configuration host command can be provided. This command can initially set up the interface device to receive particular communication parameters and to specify which input and output will be used for a particular application, e.g. the host can instruct a local microprocessor to report specific information to the host computer and how often to report the information. For example, a host computer or application can instruct a microprocessor to report position values from particular degrees of freedom, button states from particular buttons of interface devices, and to what degree to report errors that occur to the host. A "request information" command or enumeration can also be sent by the host to interface devices to receive information stored on the interface device at the time of manufacture, such as serial number, model number, style information, calibration parameters and information, resolution of sensor data, resolution of force control, range of motion along provided degrees of freedom, etc. This information may be necessary to the host so that the commands it outputs to the local processor can be adjusted and customized to the particular type of interface device. For example, this information would be processed in step 1310 during device identification and configuration. This is executed in parallel to vehicle parameter identification and configurations in step 1308 and the steps related to processing the VSR and interface device calculations in steps 1312 and 1314. Other information necessary to the interfaces can be provided to the host upon a request command, such as vendor identification, device class, and power management information.

Figures 1, 14:
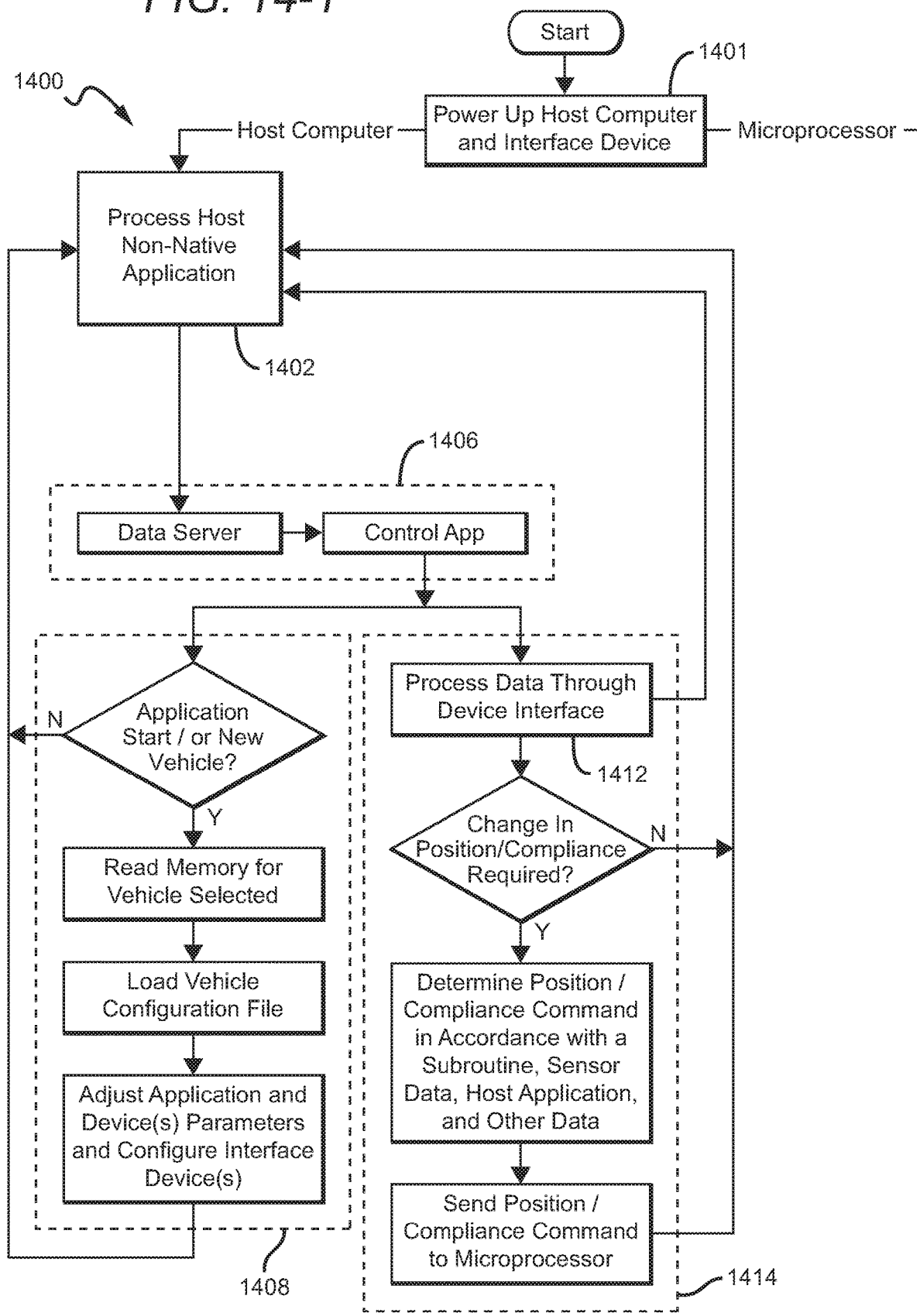
FIG. 14 (shown on two sheets as FIG. 14-1 and FIG. 14-2) shows a flow diagram illustrating a first embodiment of a method according to the present disclosure for controlling a force feedback interface device.
Figures 2, 14:
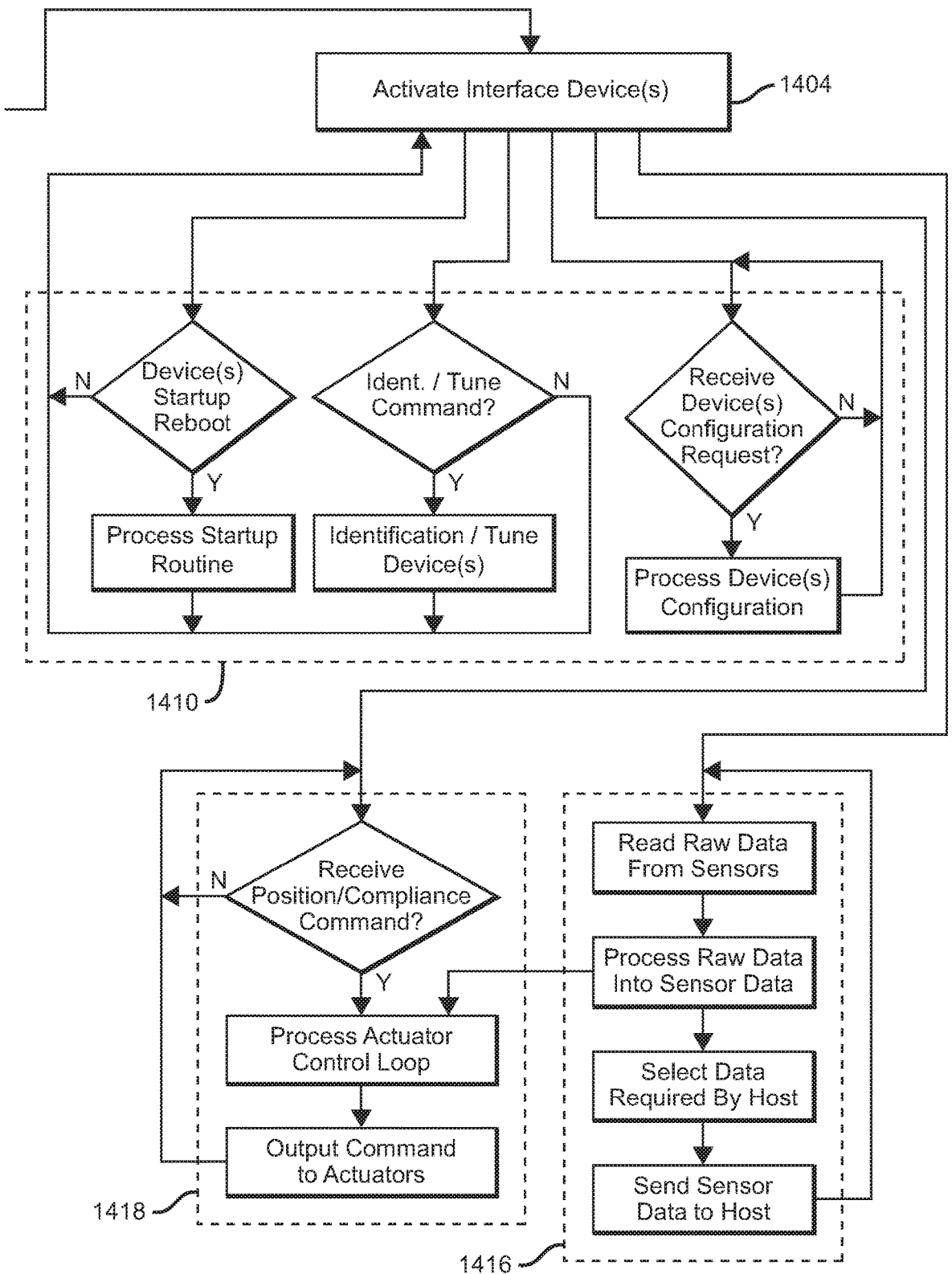

FIGS. 13A and 13B refer to systems configured to work with either $3^{rd}$ party interface devices or native interface devices. FIG. 14 depicts a similar system 1400; however, this system is specifically configured to work with native interface devices, which do not require extra steps to accommodate for extra processing or interpretation of data from various $3^{rd}$ party devices. The system begins with powering up 1401. Then parallel processes are carried out within the host application 1402 and interface devices 1404.

The host application 1402 must detect whether a $3^{rd}$ party simulation or native simulation is being run and thereby choose to run optional step 1406 for $3^{rd}$ party applications or proceed directly to steps 1408 and 1412. Step 1406 serves to read data files related to the $3^{rd}$ party application and interpret these, so that the host application can operate as an intermediary, in a sense, between the host application and $3^{rd}$ party simulation. Next, the system proceeds by processing vehicle parameter detection and analysis 1408, in order to calibrate the system to the particular vehicle parameters. Simultaneously, the host processed data through the device interface 1412, such as the VSR, virtual torque sensors, and other such virtualizations. This data is then sent to the simulation data processing component 1414, which calculates whether a change in position or compliance is required, determines these changes, and sends the data to the host application, simulation and the interface device, such that the simulation and device must maintain a closed true force feedback loop.

During these processes, the interface device is running parallel processes to identify, configure, and setpoint the device 1410, and also process device sensor data 1416 and provide physical device control 1418.

FIG. 14 may more specifically be described in relation to another embodiment. FIG. 14 is a flow diagram illustrating a first embodiment of a method 1400 for controlling a force feedback system of the present disclosure. Method 1400 is directed to a "hybrid-controlled" embodiment, in which a host computer system maintains closed-loop position with variable compliance control over the interface device by providing high-level commands to a microprocessor, and the microprocessor independently manages low-level closed-loop control using sensors and actuators to achieve and maintain the required position and corresponding compliance of the interface device object in accordance with the high-level commands.

The "hybrid-controlled" embodiment of FIG. 14 is designed for high speed communication interfaces, such as USB; however, since the use of a local microprocessor can relieve most of the computational burden from the host processor it is also suitable for low speed communication buses.

The process begins at 1401. In step 1401, the host computer system and interface device are powered up, for example, by a user activating power switches. After step 1401, the process 1400 branches into two parallel (simultaneous) processes. One process is implemented on the host computer system, and the other process is implemented on the local microprocessor. These two processes branch out of step 1401 in different directions to indicate this simultaneity.

In the host computer system process, step 1402 is first implemented, in which an application program is processed or updated. This application can be a simulation, video game, training program, or other program. Images can be displayed for a user on the output display screen and other feedback can be presented, such as audio feedback. After step 1402, option steps 1406 may be executed if the host application is not a part of the system, but is instead a 3rd party application.

In one process, step 1412 is implemented, where sensor data is received by the host computer from a local microprocessor. As detailed below in the microprocessor process, the local processor continually receives signals from sensors, processes the raw data, and sends processed sensor data to the host computer. Alternatively, the local processor sends raw data directly to host computer system. "Sensor data", as referred to herein, can include position values, velocity values, and/or acceleration values derived from the sensors, which detect motion of an object in one or more degrees of freedom. In addition, any other data received from other input devices can also be received as sensor data in step 1418, such as signals indicating a button on the interface device has been activated by the user. Finally, the term "sensor data" also can include a history of values, such as position values recorded previously and stored in order to calculate a velocity, or torque applied to the interface device object in one or more degrees of freedom.

After sensor data is read in steps 1416 and 1418, the process returns to step 1402, where the host computer system can update the application program in response to the user's manipulations of objects and any other user input received in step 1416 and 1418, as well as determine if position and compliance values need to be changed and applied to objects in the parallel process in step 1414. Step 1416 and 1418 is implemented in a continual loop of reading data from local processor.

Two branches exit step 1402/1406 to indicate that there are two processes running simultaneously (multi-tasking) on the host computer system. The second branch from step 1402 is concerned with the process of the host computer determining position/compliance commands to provide force feedback to the user manipulating object. The second branch continues, after step 1412, with step 1414, in which a separate app/subroutine reads raw data from the host app and stores it in a sharable Memory-Mapped File (MMF) data structure, an addressable space in virtual memory readily understood by those skilled in the art. This data structure provides for seamless and rapid access to the host application data. It also allows for the storing of data which is not a capability of the host application. This process provides the capability of the data to be "served" to other applications downstream of the host application without inducing latency in the host application. This is critical for maximum host application performance.

Through step 1414, a separate application/subroutine reads the raw data from the MMF file and processes it according to a set of kinematic algorithms. The algorithms are pre-defined and standardized, but certain configuration variables are vehicle specific and aid in the accurate determination of position/compliance values for the user interface device using the Force-to-Position Interface (referred to herein as "F2PI").

Step 1414 is where a determination is made if a change in position/compliance is required of the interface device. If no change in position/compliance is currently required in step 1414, then the process returns to step 1402 to update the host application and return to step 1414 to again start the processing loop until such a change in position/compliance is required. When such a change is required, step 1414 is implemented, in which host computer determines appropriate position/compliance commands to be sent to the local microprocessor of the interface device.

A position/compliance command determined is output to a microprocessor. This position/compliance command typically includes a position/compliance value that was determined in accordance with the parameters described above. The process then returns to step 1402 to process/update the host application program.

The process continues where the host computer checks if a different position/compliance command should be output, as determined by the parameters described above. If so, a new position/compliance command is determined and output. If no change of position/compliance is required, the host computer does not issue another command, since the microprocessor continues to manage the low-level control loop of the actuators in response to the last position/compliance command (alternatively, host computer can continue to output commands, even if no change of position/compliance is required). Subsequent force commands output in step can be determined in accordance with the same process, or a different process, depending on the parameters of step.

In addition, the host computer preferably synchronizes any appropriate visual feedback, auditory feedback, or other feedback related to the host application with the application of forces through position/compliance on a user object. For example, in a video game application, the onset or start of visual events, such as an object colliding with the user on a display screen, should be synchronized with the onset or start of forces felt by the user, which correspond to or complement those visual events.

The local microprocessor implements the process branching from step 1401 and starting with step 1404 in parallel with the host computer process described above. In step 1404, the interface device is activated. For example, signals can be sent between the host computer and the interface device to acknowledge that the interface device is now active. From step 1404, two processes branch to indicate that there are two processes running simultaneously (multi-tasking) on local processor.

In one process, step 1416 is implemented, in which the processor reads raw data (sensor readings) from sensors. Such raw data preferably includes position values describing the position of the user object, along with provided degrees of freedom. In one embodiment, sensors are relative sensors that provide position values describing the change in position since the last position read. The processor can determine the absolute position by measuring the relative position from a designated reference position. In alternate embodiments, sensors can include torque sensors, velocity sensors and accelerometers for providing raw torque, velocity and acceleration values of object. The raw data read in step 1416 can also include other input, such as from an activated button or other control of interface device.

Step 1416 continues by the processor processing the received raw data into sensor data, if applicable. In one embodiment, this processing includes two steps: computing velocity and/or acceleration values from raw position data (if velocity and/or acceleration are needed to compute forces), and filtering the computed velocity and acceleration data. The velocity and acceleration values are computed from raw position data received in step 1416 and stored position and time values. Preferably, the processor stores a number of position values and time values corresponding to when the position values were received. The processor can use its own or a local system clock to determine the timing data, or a common clock. The velocity and acceleration can be computed using the stored position data and timing data, as is well known to those skilled in the art. The calculated velocity and/or acceleration values can then be filtered to remove noise from the data, such as large spikes that may result in velocity calculations from quick changes in position of the object. Thus, the sensor data in the described embodiment includes position, velocity, acceleration, and other input data. In an alternate embodiment, circuitry that is electrically coupled to, but separate from the processor can receive the raw data and determine velocity and acceleration. For example, an application-specific integrated circuit (ASIC) or discrete logic circuitry can use counters or the like to determine velocity and acceleration to save processing time on the microprocessor.

During this process, the processor checks if torque sensor data has been received from sensors or other inputs. If no torque sensor exists, and therefore no data has been processed, the processor reads the position sensor data and processes it through the Position-to-Force Interface (herein referred to as "P2FI"), thereby creating a Virtual Torque Sensor (herein referred to as "VTS") data stream. In using the VTS by way of the P2FI, the interface object position displacement data is translated into the appropriate corresponding interface object torque values of the vehicle being simulated in the host application. In alternate embodiments, where no torque sensor exists, the VTS can also measure force applied to the actuators by using "current sensing". These calculations can take place within 1412. When either real or virtual torque sensor data has been received, the process proceeds to step 1414 for processing that includes two steps: mapping vehicle specific torque values to the corresponding displacement of the interface object, then converting the interface object displacement into a USB HID joystick input. After these steps 1414 are implemented, in which the processor sends the processed sensor data to the host computer, the process then returns to step 1416 to read raw data. Steps 1414, 1416, and 1418 are thus continuously implemented to provide current sensor data to host computer system.

The second branch from step 1404 is concerned with processor controlling the actuators to provide stiff position control and corresponding compliance calculated by the host computer to object. The second branch starts with steps 1414, in which the processor checks if a high-level position/compliance command has been received from the host computer over bus. If not, the process continually checks for such a position/compliance command. When a position/compliance command has been received, in which the processor maintains closed-loop control of the position and corresponding compliance of the interface object by low-level command to the designated actuators. The process then returns to the beginning of step 1414 to check for another position/compliance command from the host computer.

Steps 1408 and 1401 refer to set up procedures. Step 1408 is related to setting up vehicle specific parameters and step 1410 pertains to setting up the interface devices themselves.

Figure 15:
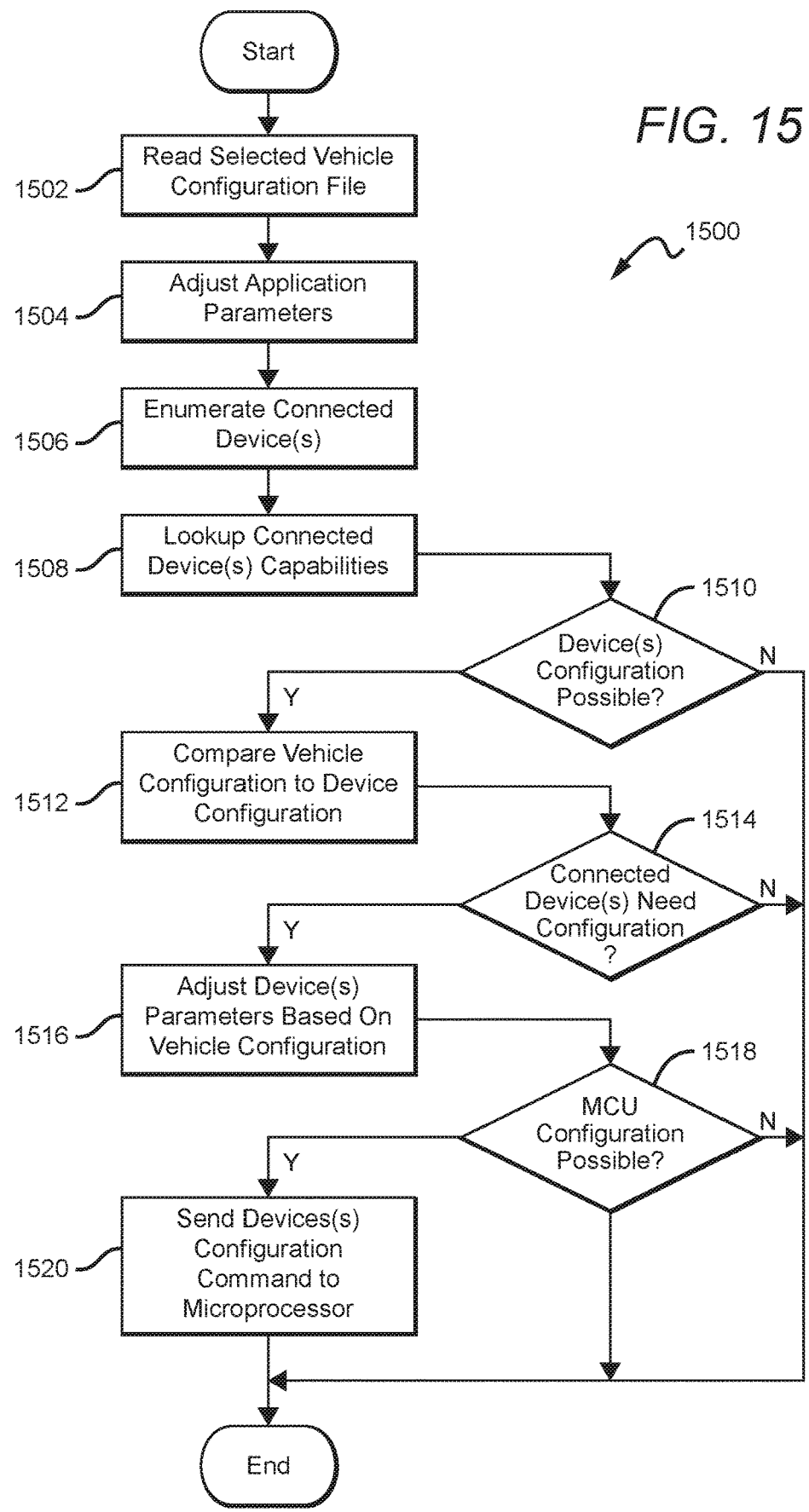
FIG. 15 shows a diagram illustrating a method of adjusting application and device parameters according to an embodiment of the present disclosure.

FIG. 15 is a flowchart showing an embodiment of a more detailed view of components 1308 and 1408, which handle the detection and analysis of vehicle parameters 1500. In the first step 1502, the vehicle configuration file is read from the simulation. Next 1504, the application parameters are adjusted in line with this configuration file. For example, the VSR is adjusted. Following this, the connected devices are enumerated 1506 and device capabilities are looked up 1508. The following step is determined on whether the device(s) are configurable 1510. If the device(s) are not configurable, the setup is complete. If the device(s) are configurable, the device configuration is compared to the vehicle parameters of configuration 1512. Next, if this comparison 1514 reveals that no configuration is needed, set up is complete. If configuration is needed, the configuration is adjusted 1516. Finally, the system detects whether a configurable microprocessor is available 1518 and, if so, sends configuration commands to this microprocessor 1520, completing this portion of the system set up.

Figure 16:
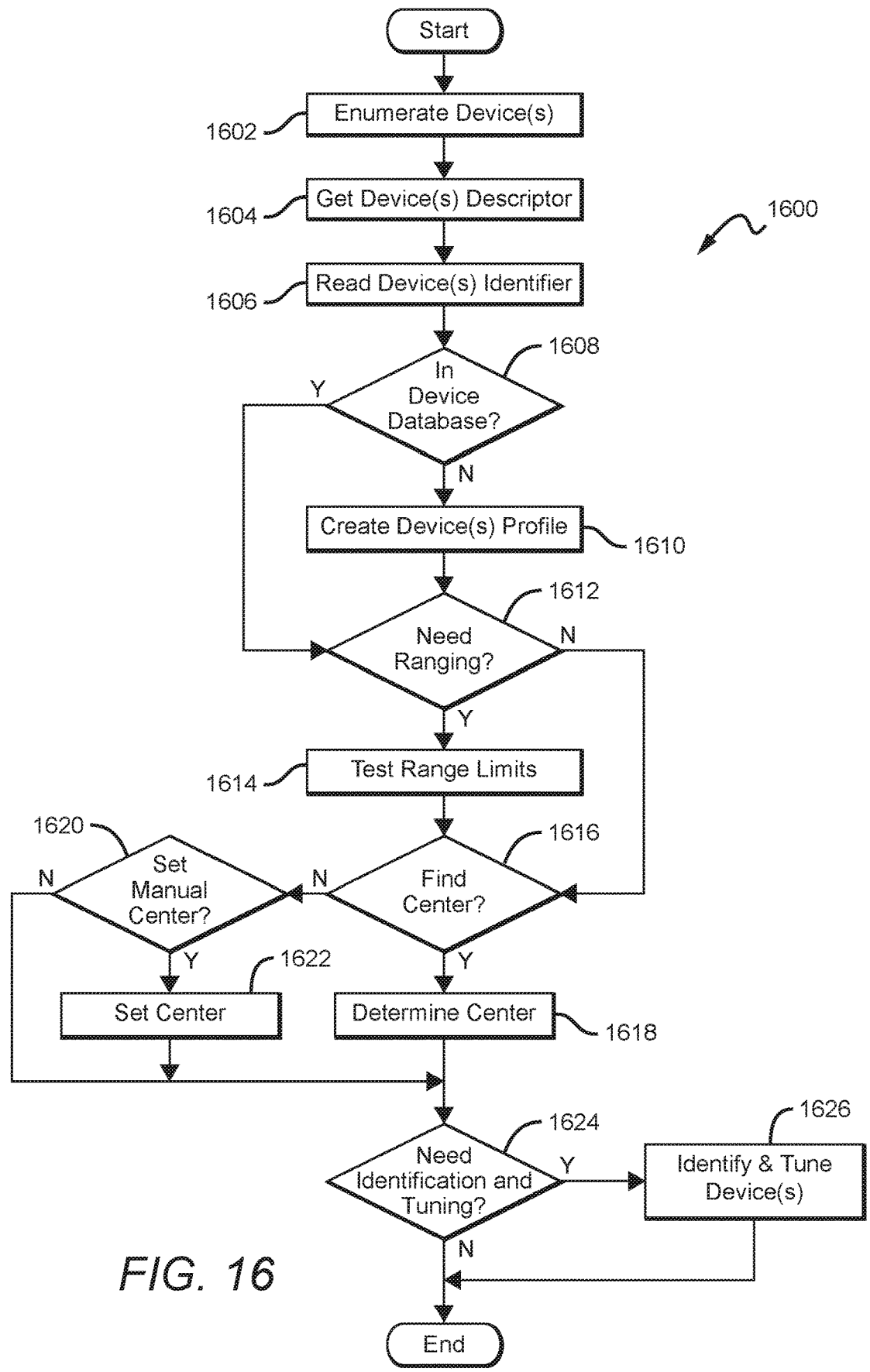
FIG. 16 shows a diagram illustrating device start up routines according to an embodiment of the present disclosure.
Figure 17:
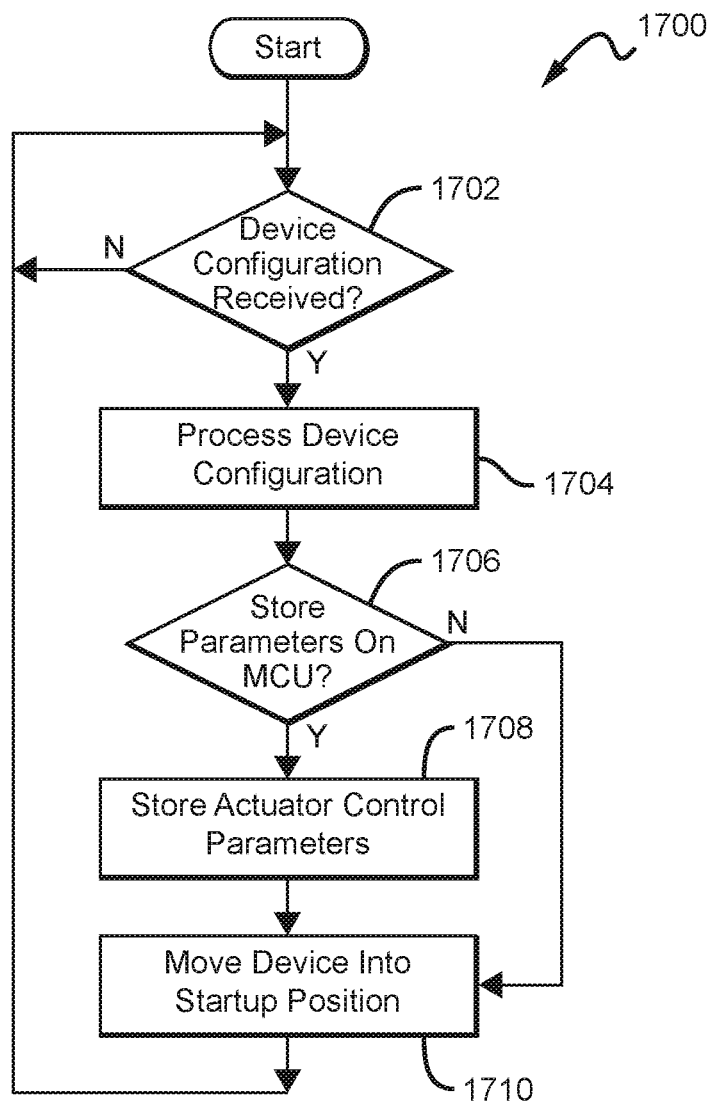
FIG. 17 shows a diagram illustrating device configuration according to an embodiment of the present disclosure.
Figure 18:
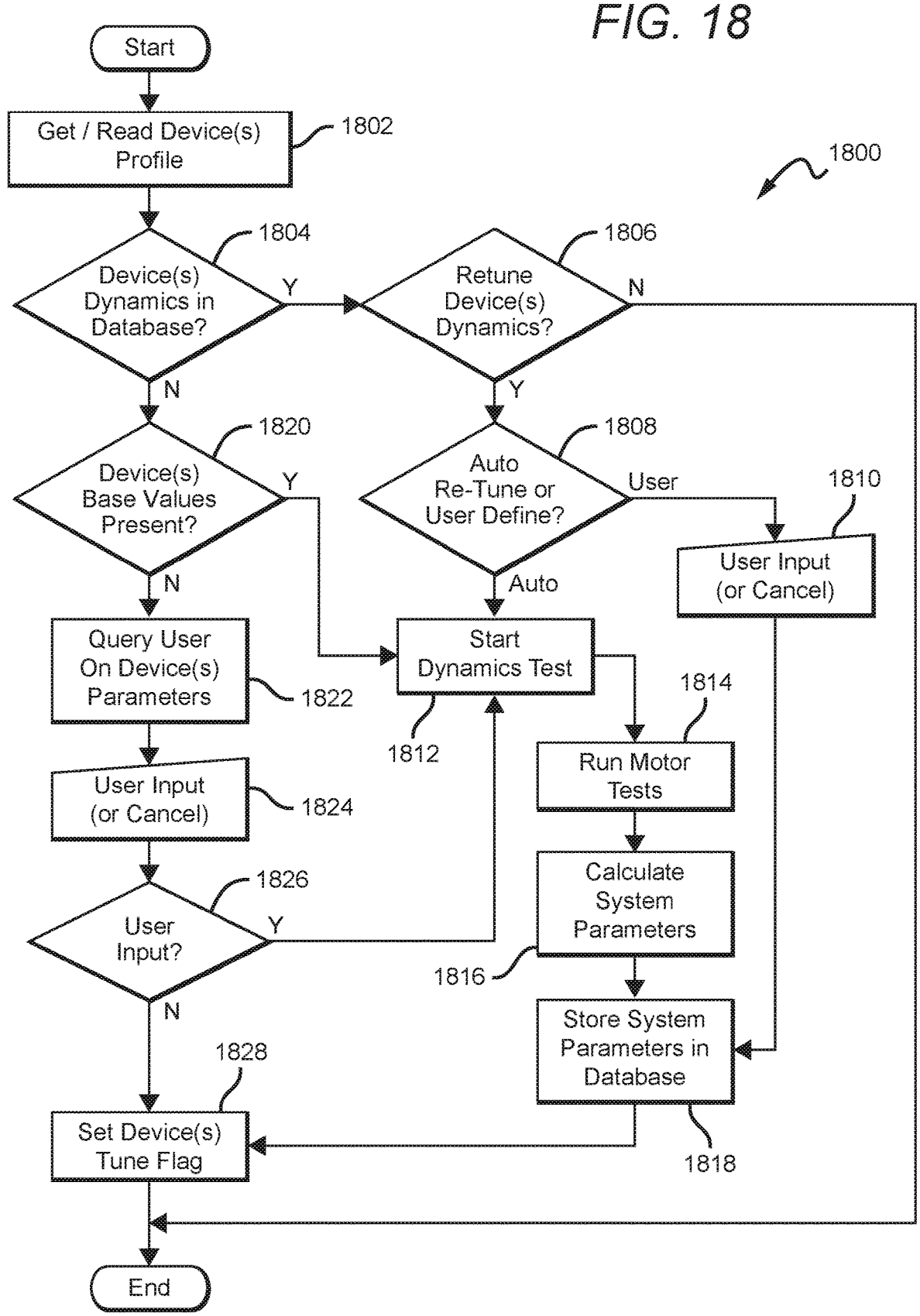
FIG. 18 shows a diagram illustrating system identification and tuning according to an embodiment of the present disclosure.
Figure 19A:
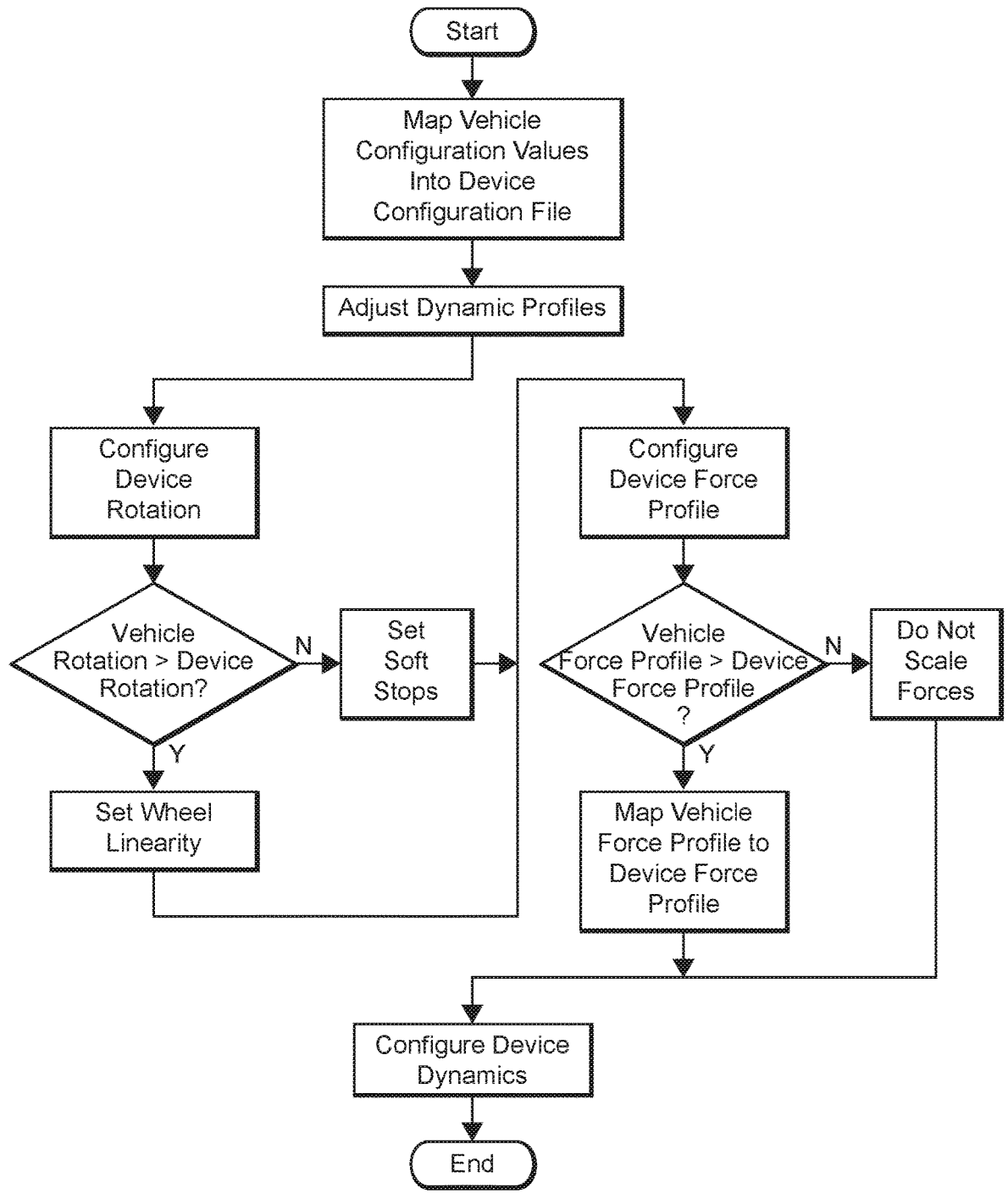
FIG. 19A shows a diagram illustrating wheel configuration according to an embodiment of the present disclosure.
Figure 19B:
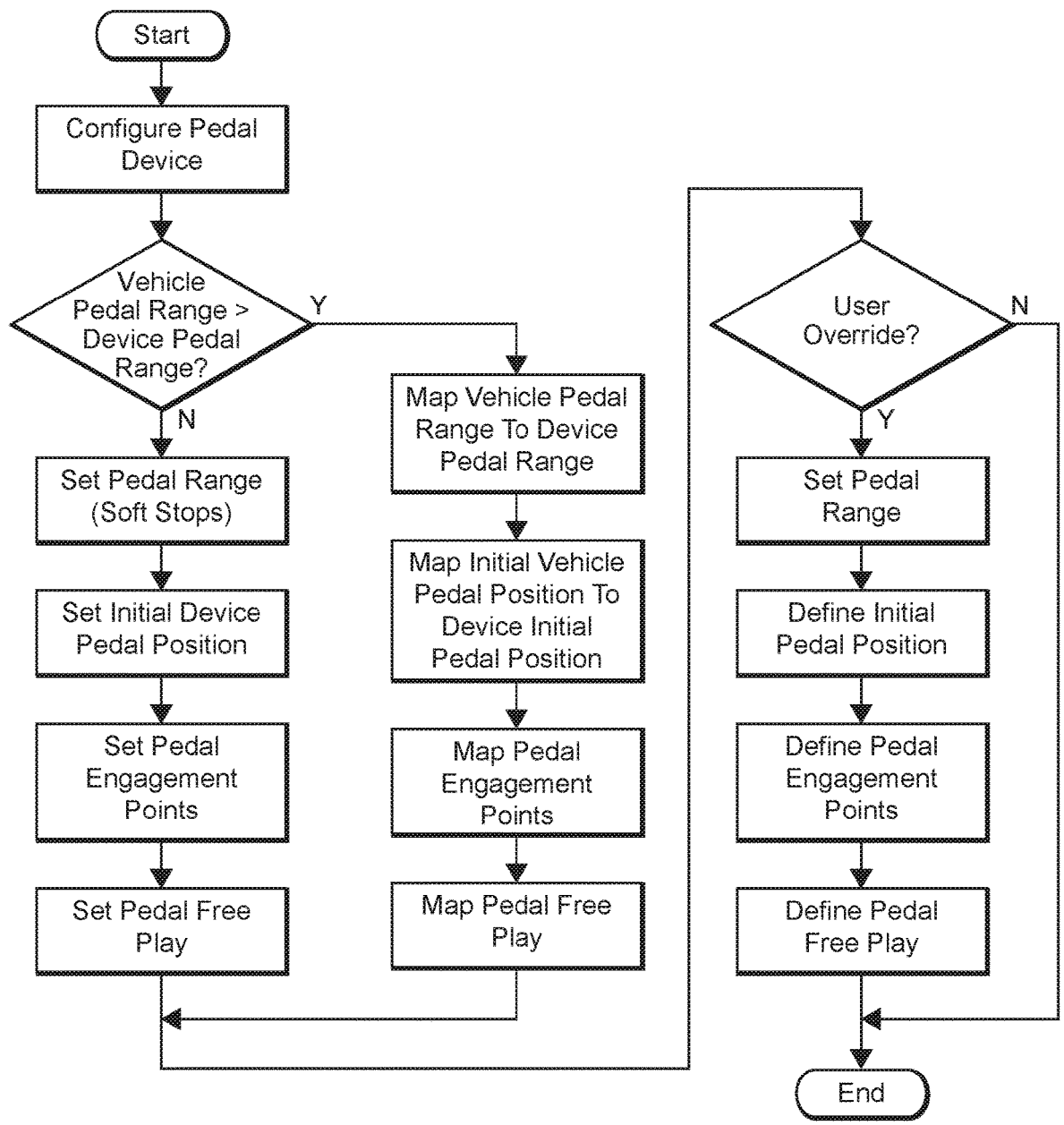
FIG. 19B shows a diagram illustrating pedal configuration according to an embodiment of the present disclosure.
Figure 19C:
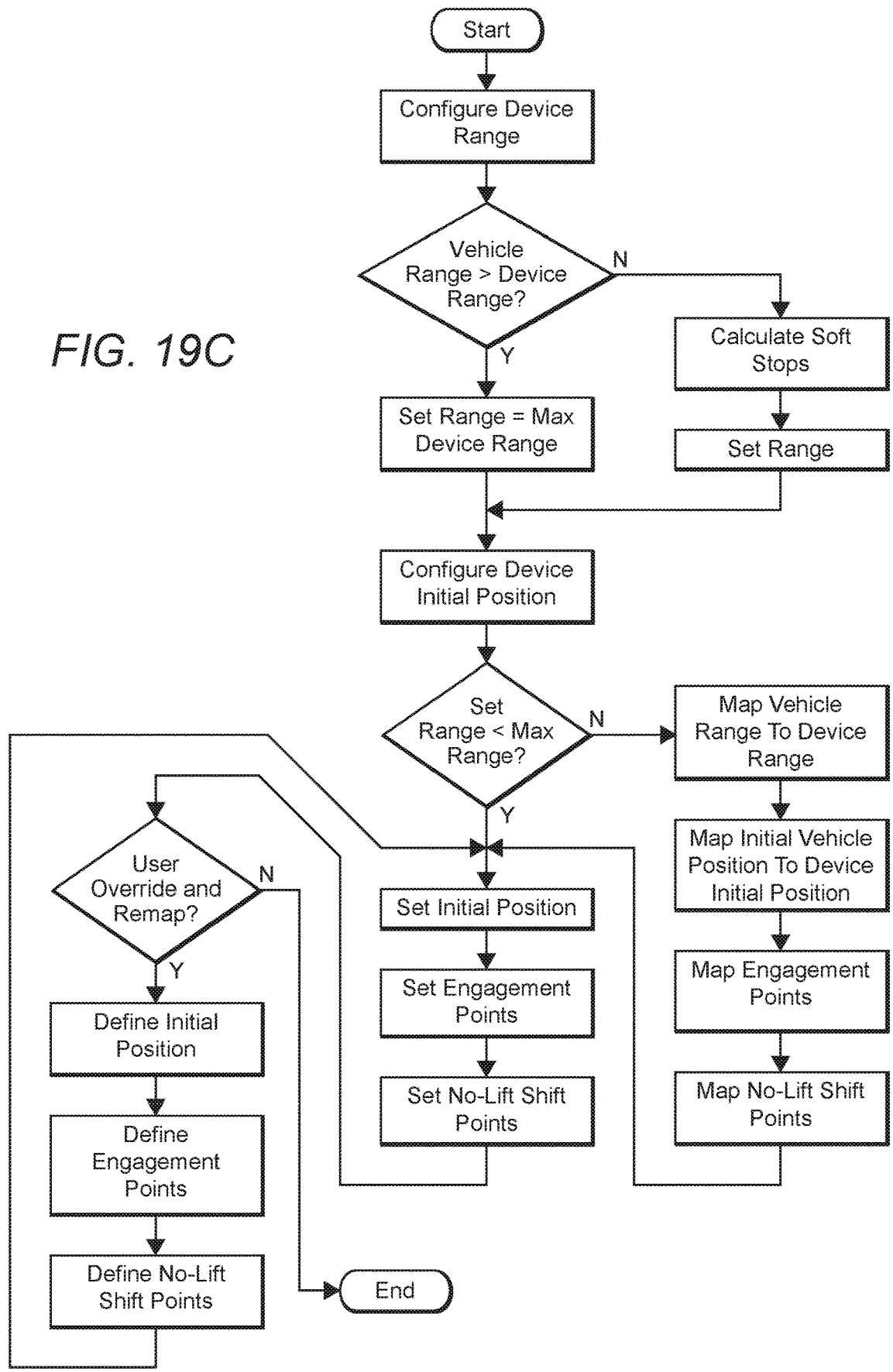
FIG. 19C shows a diagram illustrating shifter configuration according to an embodiment of the present disclosure.
Figure 19D:
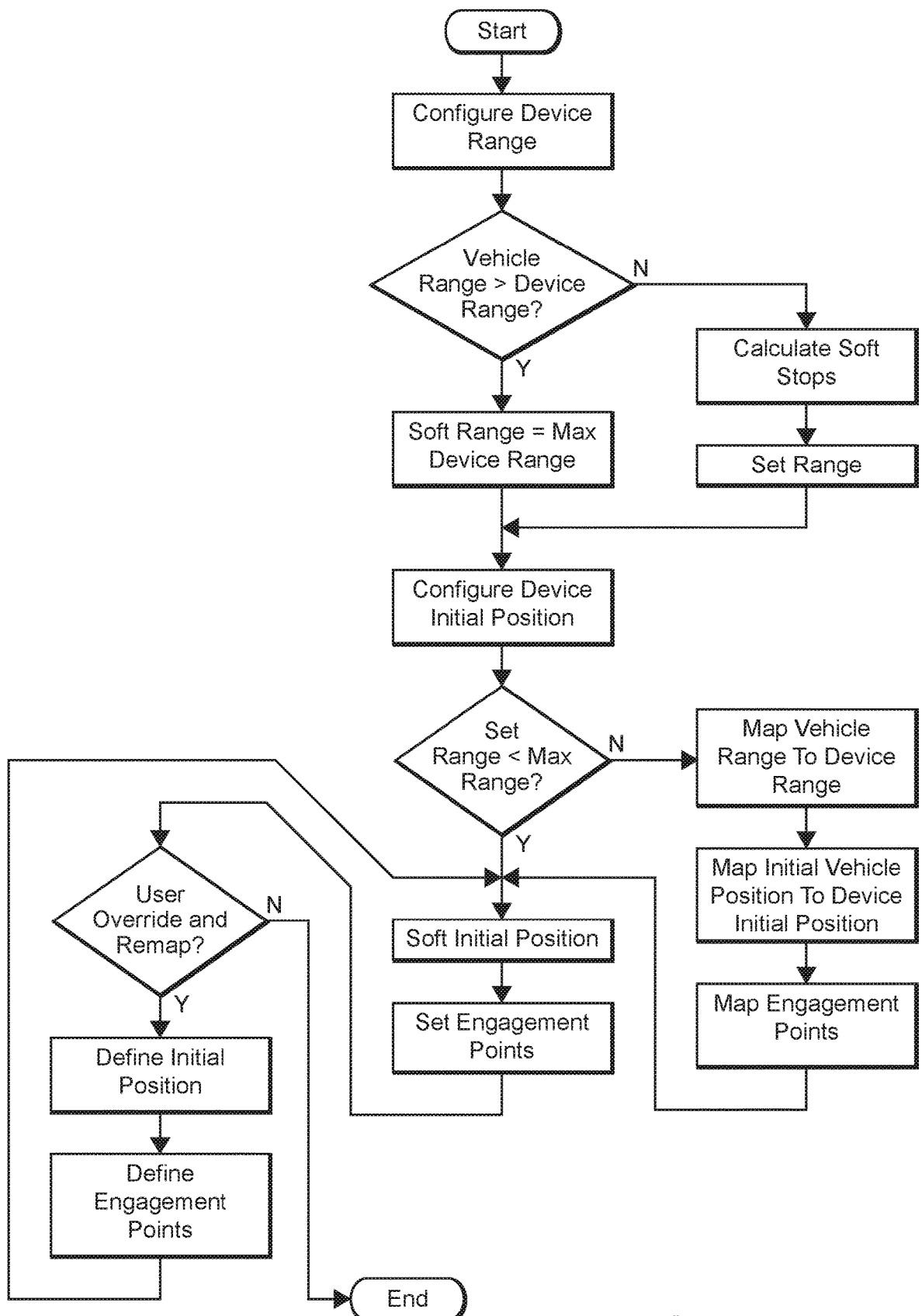
FIG. 19D shows a diagram illustrating handbrake configuration according to an embodiment of the present disclosure.

FIGS. 16-18 show detailed views of one embodiment of the process set out in the device identification and configuration steps 1310, 1410 of FIGS. 13A, 13B and 14.

FIG. 16 shows a flowchart depicting one embodiment of the device startup routine 1600. The routine begins with enumerating the devices 1602. Next, device descriptors and identifiers are read 1604, 1606. Following these steps, the system checks whether these devices are in the device database or not 1608. If they are not, the device is added to the database by creating a profile 1610. Once a device profile is found or created, the system ascertains whether the device ranges must be tested 1612. If so, the range limits are tested 1614. If ranges are known or tested, the system proceeds by finding the center of the device 1616, by either determining the center 1618 or setting the manual center 1620, 1622. Next, the system checks whether identification and tuning of devices is necessary 1624 and either ends or proceeds to that process 1626 which is shown in more detail in FIG. 18.

FIG. 17 depicts an embodiment of the device configuration process 1700. First the system determines whether a device configuration has been received 1702. If so, the system proceeds to the last step of moving the device to startup position 1710. If not, the system processes device configuration 1704, such as adjusting wheels, shifters, pedals and handbrakes. Next, if desired, the adjustment or configurations are stored 1706, for example, on a microprocessor or a data storage system. Next, the system may also store device physical control parameters 1708. These may be actuator control parameters or other movement specific control parameters. Finally, the system proceeds to move the device(s) into startup position or initial position 1710.

FIG. 18 depicts an embodiment of a process of system identification and tuning 1800, which is a portion of the device configuration and set up process and a portion of the process of FIG. 16. In the first step, the system gets and/or reads device(s) profiles 1802. Next, the system determines whether the devices are in the database 1804. If so, the system then optionally re-tunes the device dynamics 1806. The system may then determine 1808 whether to auto re-tune 1812 or manually re-tune via the user 1810. During auto re-tune the system runs a dynamics test 1812, which consists of run motor tests 1814, calculating system parameters 1816, and storing these system parameters in a database 1818 (user or auto parameters). If the device(s) dynamics are within the database, the system instead proceeds to evaluate whether the device base values are present 1820. If yes, the system then proceeds to the same dynamics test 1812. If not, the user may be queried on device parameters 1822, such as motor voltage or power supply specifications. The user may input these 1824, 1826, or end the process, triggering either the dynamics test 1812 or setting the device tune flags 1828.

Some exemplary system identification tests may include motor or system tests, such as speed vs. voltage, spin-up/spin-down, brake friction torque, or step input voltage. The tests may also include parameter identification tests, such as calculating motor or system parameters, curve fit test output to transfer function, calculating speed/torque slope, calculating torque at stall (max), verifying the stall current, calculating efficiency, calculating mechanical and electrical time constants, calculating angular acceleration (max), calculating peak current to max torque, and calculating torque to power supply capacity.

FIGS. 19A-19D depict various embodiments of various configuration routines for a variety of devices. FIGS. 20A-20E show the various configuration parameters of some of these devices.

Figure 21:
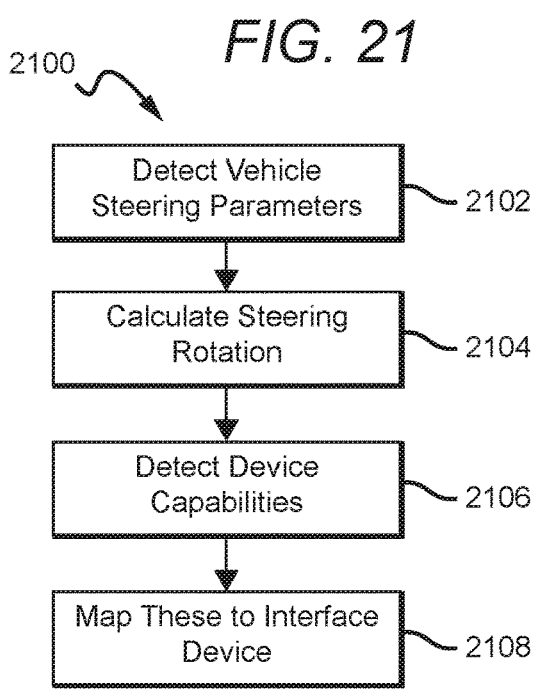
FIG. 21 shows a diagram illustrating VSR set up according to an embodiment of the present disclosure.
Figure 22:
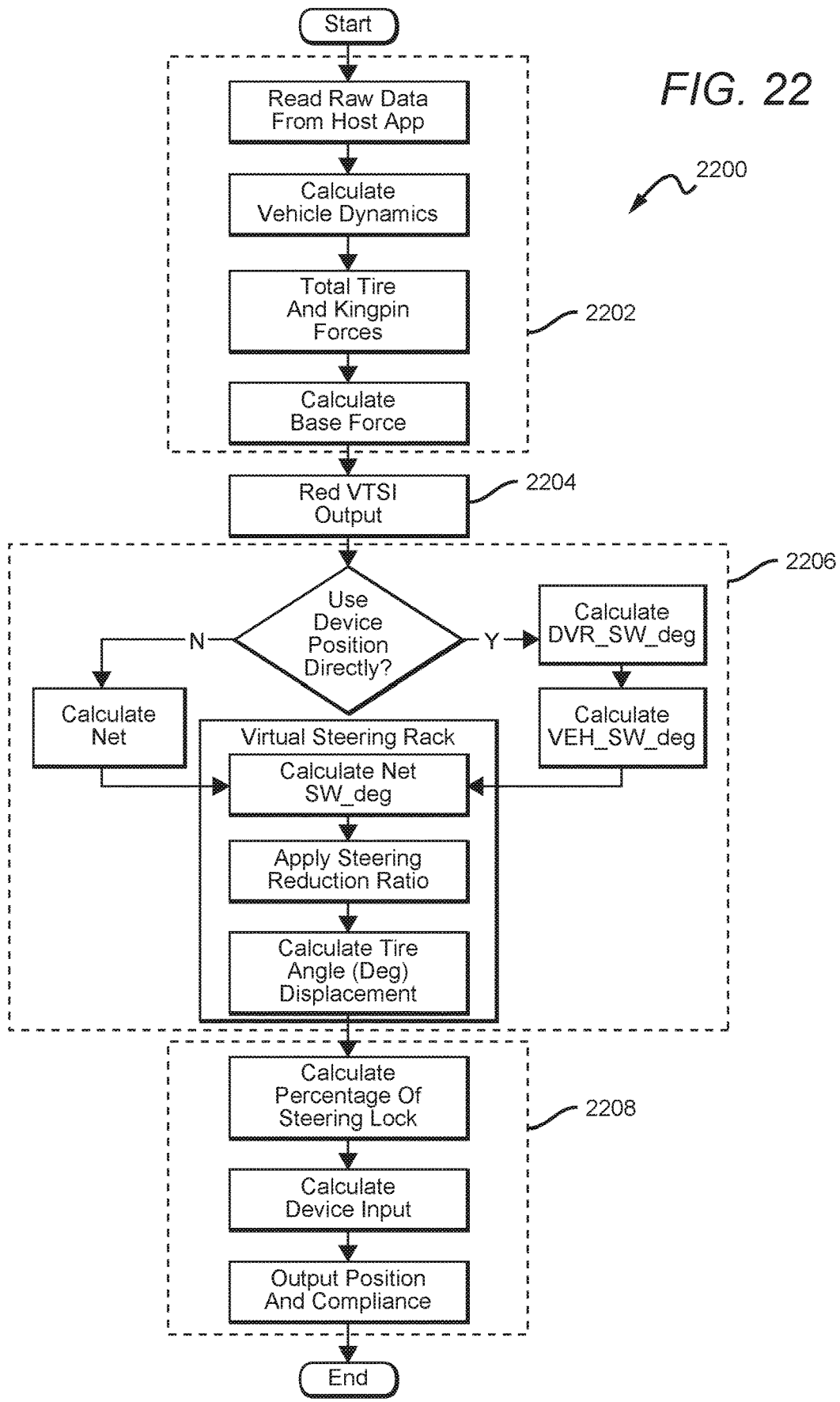
FIG. 22 shows a flowchart of the use of a VSR according to an embodiment of the present disclosure.
Figure 23:
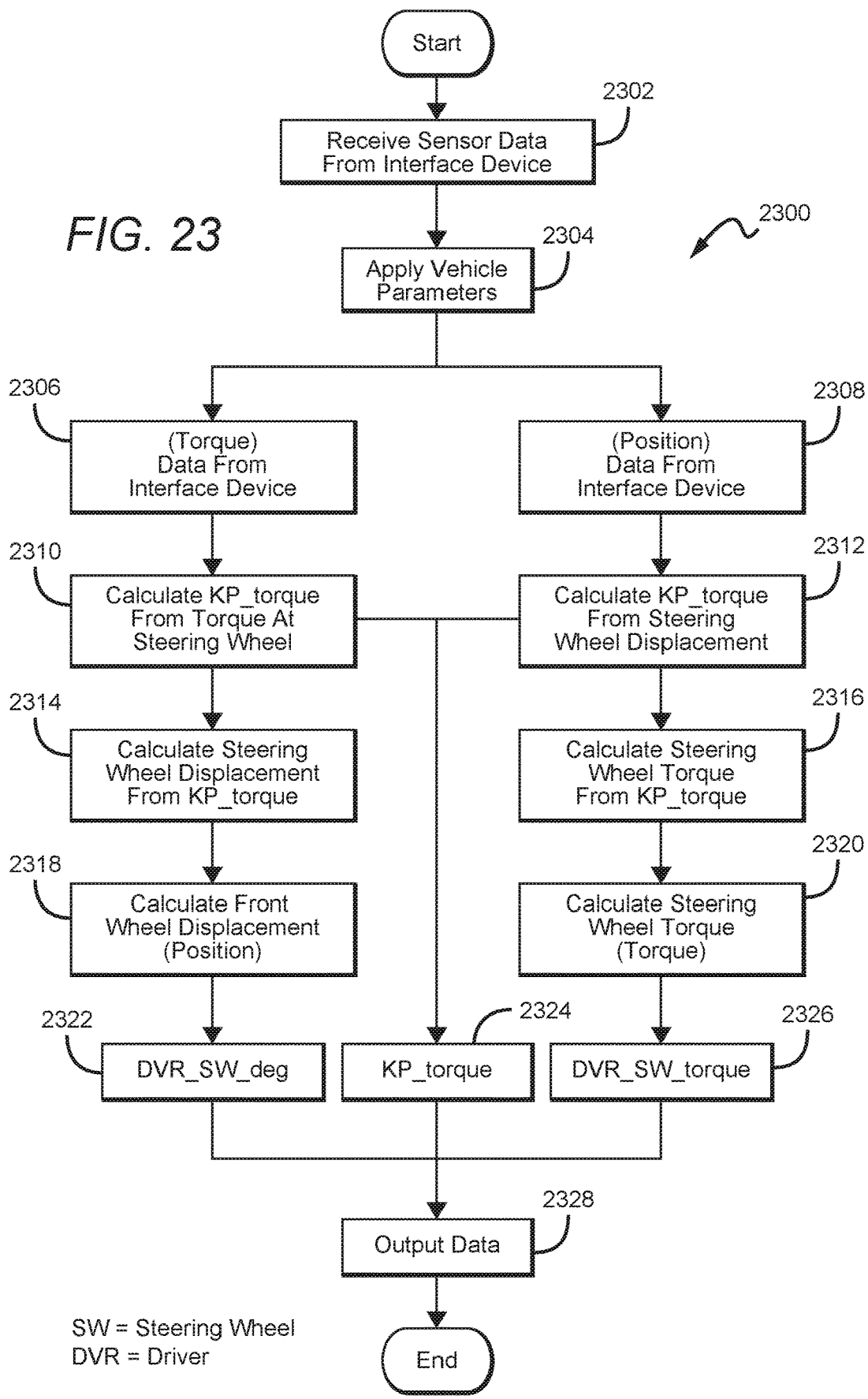
FIG. 23 shows a flowchart illustrating a virtual torque sensor interface according to an embodiment of the present disclosure.

FIGS. 21-23 depict embodiments and usages of the VSR and Virtual Torque Sensor Interfaces ("VTSI") components of the system. These components calculate and output the device setpoint and compliance or stiffness in response to the simulation and also measure or calculate torque on the device to impact the simulation. FIG. 21 specifically sets out an embodiment of a process for setting up the VSR 2100. In the first step, the system detects the specific vehicle steering system parameters 2102. Next, the system calculated steering rotation 2104, based on these parameters. After this, the system detects the interface device(s) capabilities 2106, such as force, friction, inertia. Lastly, the system maps the parameters to the interface device 2108 to create a VSR.

FIG. 22 depicts a more detailed view of an embodiment of the VSR system 2200. The system begins with calculating vehicle dynamics 2202. This portion of the system assesses the current variables and status. It begins with pulling or reading the data from the host application. This may be an associated simulation, a $3^{rd}$ party simulation or a proprietary software. Data may be in any sort of file or format, but in some cases it may be possible to extract raw data. Next, the vehicle dynamics are calculated based on this raw data, unless dynamics themselves are provided. Following vehicle dynamics calculations, the total tire and kingpin forces are calculated. Next, base forces are calculated, which can in turn be used to determine compliance or stiffness. After the conclusion of calculating the vehicle dynamics 2202, the system reads the VTSI (or virtual torque sensor) output 2204. This step is described in more detail in FIG. 23.

The system then calculates vehicle kinematics 2206, where the vehicle dynamics are combined with the VTSI outputs. In this portion, the interface device position may be used directly, such that device and vehicle steering wheel position is calculated, or indirectly by calculating the net position using torque. Next, the VSR is employed to calculate the new steering wheel position, apply steering reduction ratios, and calculate tire angle or degree displacement on the virtual vehicle. Lastly, the system calculates and outputs the interface device controls 2208. This begins by calculating the percentage of steering lock. This percentage is scaled as a percentage depending on the type of device being used. Next, the device input is calculated, such as the position. Finally, interface device position and compliance (or stiffness) is output.

FIG. 23 shows, in more detail, an embodiment of a VTSI 2300 which would be used within a VSR system. As the VSR needs torque and position information from the interface device, it is desirable to create this information if the interface device does not have both torque and positional sensors. This exemplary VTSI works by accepting or receiving sensor data from the interface device 2302 and applying the vehicle parameters 2304. Next, in parallel, torque data (if available) from the device is converted into position data (2306, 2310, 2314, 2318, 2322); position data (if available) is converted to torque data (2308, 2312, 2316, 2320, 2326); and king pin torque 2324 is calculated from the combination of these.

Figure 20A:
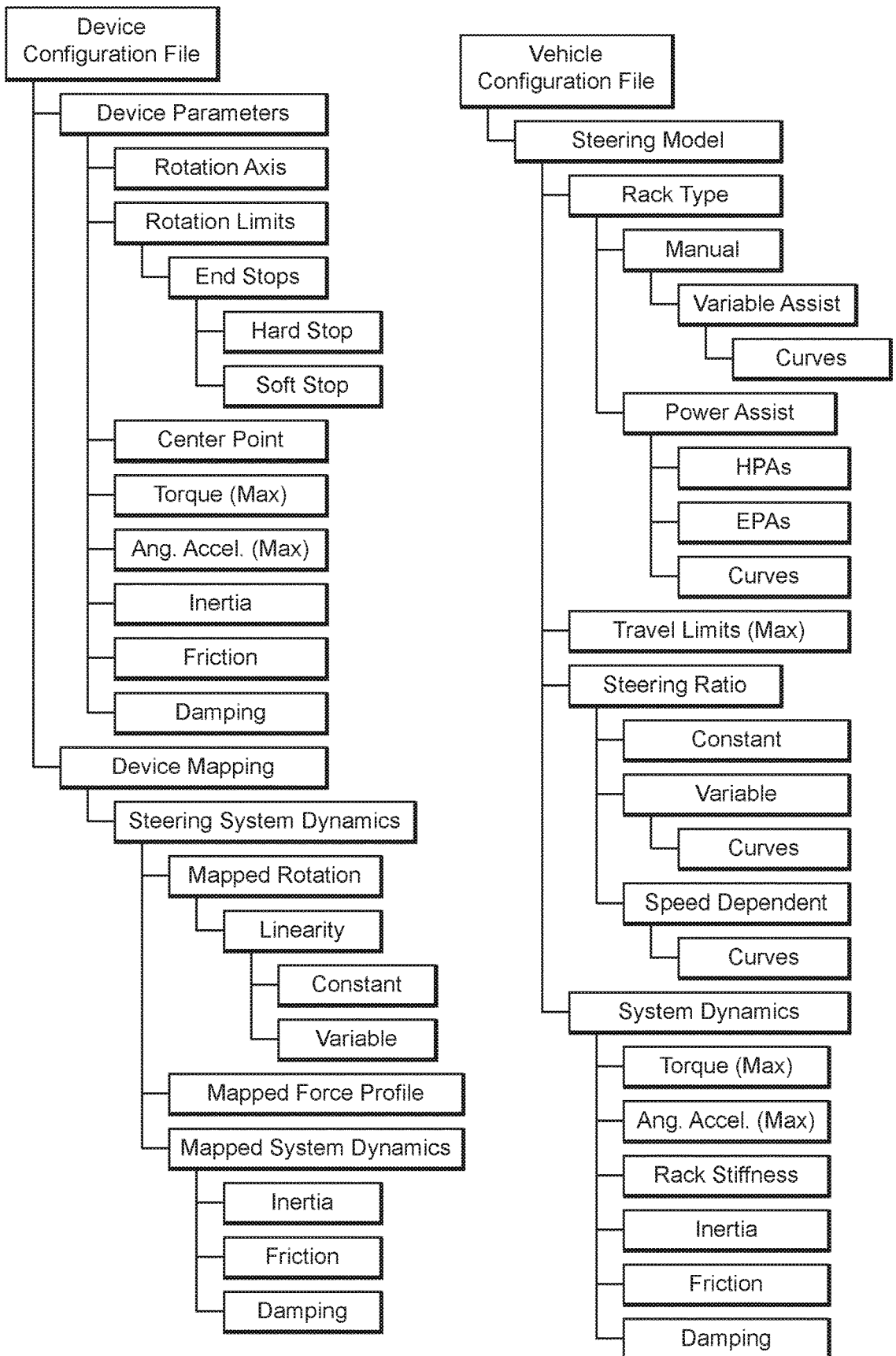
Figure 20E:
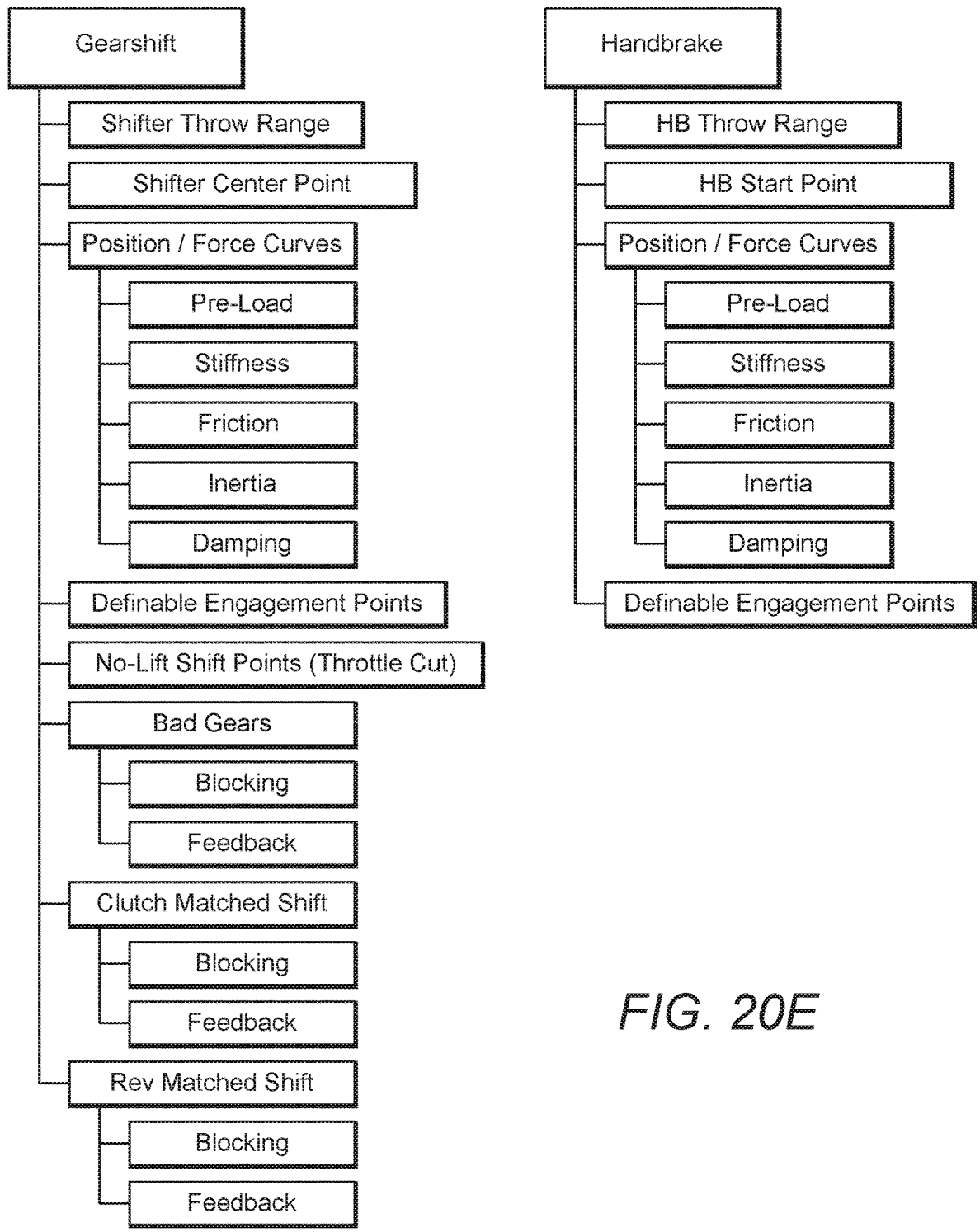

The application of vehicle parameters 2304 of the VTSI relates to, for example, applying the wheel configuration parameters shown in FIG. 20A, or other configuration parameters, as they relate to the vehicle steering model. In general practice, vehicles have a set of design intent kinematic equations that govern how the system reacts, responds and presents an interface to the driver. The vehicle is also beholden in how it presents that interface based on the physical components used and their assembly. Most importantly though, each system can be characterized by the steering type, steering ratio and the accompanying system dynamics, such as inertia, friction and damping.

These factors aide in the determination of, for example, torque-from-position, by applying parameters related to the vehicle model through equations that calculate that if, for instance, the driver rotated the steering wheel "x" degrees, given the steering system dynamics such as inertia, friction, damping and rack stiffness, it would require "y" amount of driver exerted torque to achieve that displacement. Therefore, a driver-steering wheel torque value can be determined from this information. As the system is about connecting the virtual system to a physical and real world experience or vehicle, these conversions may be vital to the translation of the experience from virtual to real, and real to virtual.

If torque data is available from the interface device 2306, this is used to calculate king pin torque from the torque at the steering wheel 2310. Next, steering wheel displacement is calculated based on the king pin torque 2314 and from wheel displacement or position is calculated 2328. This process allows the calculation of the driver steering wheel position 2322.

If position data is available from the interface device 2308, this is used to calculate king pin torque 2312 based on steering wheel displacement. Next, steering wheel torque is calculated 2316 based on the king pin torque, and steering wheel torque is calculated 2320. This allows the calculation of the driver steering wheel torque. The king pin torque calculated via steering wheel torque 2310, or steering wheel displacement 2312 is output as the king pin torque variable 2324. This process allows the calculation of driver steering wheel position, driver steering wheel torque and king pin torque, regardless of whether the interface device only has sensors for position, torque, or both. Thereby, creating a process which creates a virtual torque sensor. The driver steering wheel position, driver steering wheel torque and king pin torque data is then output back to the remainder of the system to be used to control the vehicle and interface device, as described in relation to the VSR.

Figure 24:
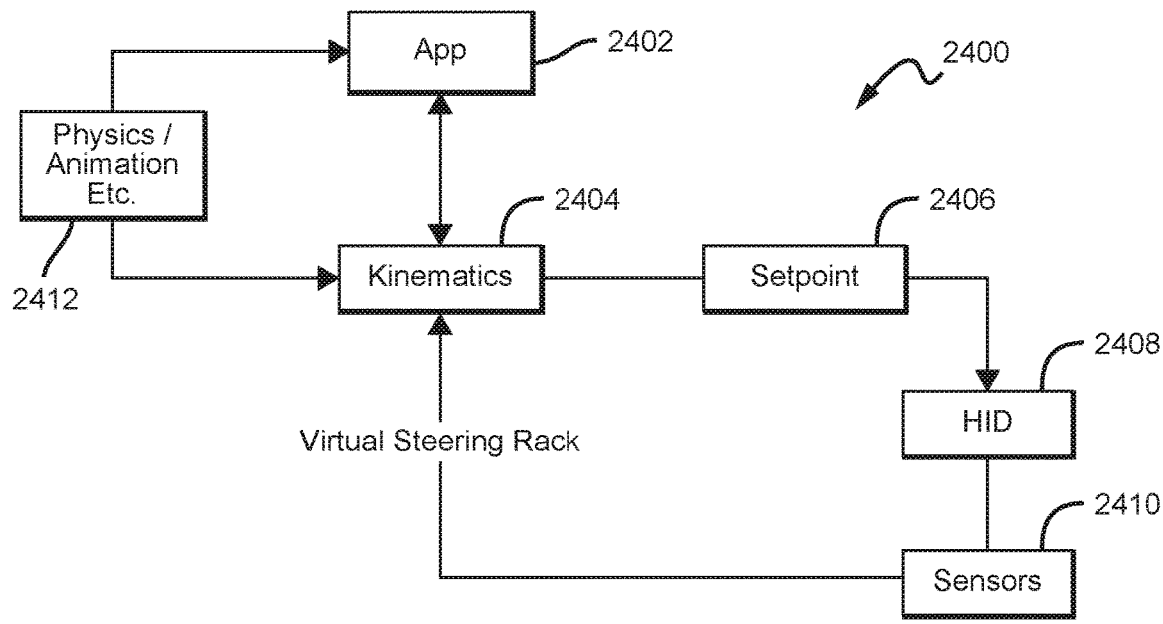
FIG. 24 shows an overview of a force feedback system according to an embodiment of the present disclosure.

FIG. 24 shows a general overview of an exemplary system 2400 according to one embodiment of the present disclosure. The virtual vehicle control system 2400 of FIG. 24 includes an application 2402, which may be a simulation or video game. The application 2402 communicates with a kinematics engine 2404, which controls the VSR. The kinematics engine 2404 determines a set point 2406 for each clock cycle, which is communicated to the interface device 2408. The interface device 2408 includes sensors 2410. The interface device information and sensor information from the present clock cycles is returned to the kinematics engine to then calculate the next set point. The kinematics engine communicates with a physics or animation engine 2412 and combines the kinematic information (including outputs from the device and sensors and how these impact the vehicle) with the physics rules of the application environment, outputting this information back to the application or simulation to display the vehicle.

Other features of the system include stiff position control of interface devices. As the system detects and outputs position, each clock cycle (continuously, creating a constant loop and calculation) and stall state of the interface device is reduced, unlike traditional systems, which instruct the device to exert a force over a certain amount of time regardless of what happens during that time frame. A traditional system may instruct an interface device wheel to spin in a particular direction for a certain amount of time, regardless of intervening events or user interaction. These systems wait for the user to stop the force, which creates a stall in the motors. The current system uses position control at each clock cycle, therefore the wheel moves to a particular position and current is then lowered to hold this position. Thereby, a stall state is not ever achieved. Additionally, the system also recalculates the position based on user interaction and also reduces stall in this manner. Reducing the frequency of a stall state is significant, as it may reduce motor wear and heat.

Additionally, in other embodiments, users can set preferences for steering feel, such as more or less road feel and other preferences. In other embodiments, steering feel may be adjusted for different tire models or steering system types.

The following information is related to other components of the system. These are exemplary configurations based on one embodiment and other configurations or embodiments may be used. Also, combinations and variations of these may be used.

Figure 25:
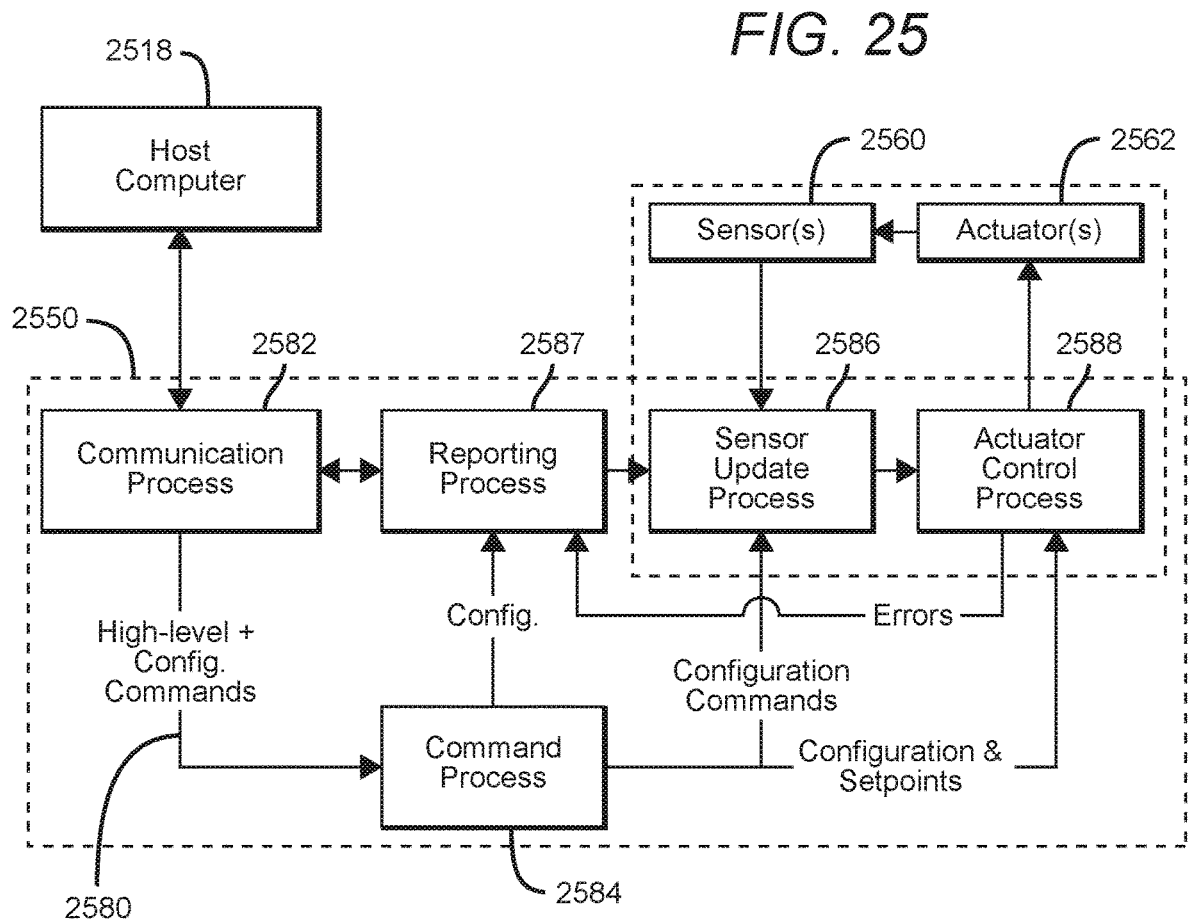
FIG. 25 is a block diagram illustrating an implementation of the local microprocessor of an embodiment according to the present disclosure for controlling a force feedback interface device.

FIG. 25 is a block diagram illustrating an example of a functional microprocessor 2550 implementation 2580 of the present invention for processing the host commands and configuration parameters to output force feedback to user object by way of maintaining stiff position control with variable compliance. Implementation 2580 is preferably provided on the microprocessor 2550 using instructions stored in memory. The use of program instructions to perform operations on a microprocessor is well known to those skilled in the art, and can be stored on a "non-transitory computer readable medium." Herein, such a medium includes, by way of example, memory such as ROM, magnetic disks, optically readable media, such as CD ROMs, semiconductor memory, etc. In each case, the medium may take the form of a portable item, such as a small disk, SD Card, USB Flash Drive, etc., or it may take the form of a relatively larger or immobile item, such as a hard disk drive.

Preferably, various sub-processes 2582, 2584, 2586, 2587, and 2588 run in parallel on the microprocessor 2550 to optimize responsiveness of the force feedback interface device. These processes are also referred to as "processors" herein. Various parameters and data are shared by the sub-processes of implementation 2580 in a preferred embodiment.

Communication process 2582 maintains the communication link between the microprocessor 2550 and the host computer 2518. Communication process 2582 receives high-level host commands and configuration parameters from the host 2518 and sends this data to a command process 2584. Process 2582 also receives sensor data from a reporting process 2587 described below. Process 2582 directly relays information received from process 2587 to the host 2518. Preferably, process 2582 manages an input buffer on microprocessor 2550, which is used to buffer incoming commands and data from host computer 2518. The input buffer is especially useful in embodiments, including the USB interface and other interfaces with high communication rates.

The command process 2584 processes incoming high-level host commands and configuration parameters from the host 2518 and transmitted via the communication process 2582. Based on the incoming commands, the command process 2584 sets configuration parameters for the sensor update process 2586, reporting process 2587, and actuator control process 2588, as well as process high-level host commands to be sent to actuator control process 2588. The configuration parameters for processes 2586, 2587 and 2588 are internal parameters of microprocessor 2550.

For instance, the reporting parameters are internal parameters that specify to the microprocessor 2550 which particular data, and at what rate to report to host computer 2518. The reporting parameters can, for example, specify whether to report positions, velocities or torque of user object for particular degrees of freedom, a communication speed, or whether, and in what way, errors are reported. The reporting parameters are derived from the configuration commands received from the host computer 2518 and are provided to the sensor update process 2586, and reporting process 2587 so that process 2587 knows which information to report to the host computer 2518 via the communication process 2582.

The sensor update process 2586 receives reporting and configuration parameters from the command process 2584. Based on the parameters received, process 2586 reads sensors 2560 and clock and stores sensor reading histories and timing histories. Process 2586 also can compute values, such as velocity or acceleration values, derived from sensor position data, the sensor data histories, timing data, or combinations of this data. Herein, the term "sensor data" refers to both data received directly from the sensors (sensor readings) and/or values derived from the sensor readings, including histories of sensor data. "Timing data" or "time data" refers to specific values representing a period of time, including histories of timing data. Periodically, reporting process 2587 reads data provided and stored by process 2586 (or process 2586 could send the data to process 2587 directly). The sensor and timing data is also "sent" to the actuator control process 2588. The term "sent" or "received" herein refers to one process providing data that another process eventually receives. The actual implementation to send and receive data between processes can vary in different embodiments. For example, the sending process may store computed data in memory and the receiving process can retrieve the data from memory at its own rate.

Reporting process 2587 receives sensor data from sensor update process 2586 and reports this data to host computer 2518 at appropriate times or upon receiving a request from the host 2518 through communication process 2582. Reporting parameters are sent to process 2587 by command process 2584. In addition, general status and error information may be sent to reporting process 2587 from actuator control process 2588. The process implemented by reporting process 2587 is described in greater detail with respect to FIG. 22. In alternate embodiments, reporting process 2587 can be merged with background process 2582, for example, if reporting data to the host at a regular rate (in "stream" mode).

Actuator control process 2588 uses position/compliance commands from the command process 2584 and sensor data from sensor update process 2586 to compute forces to be applied to user object by controlling actuator(s) 2562 in a closed-loop. The actuator control parameters are derived from configuration parameters that characterize various Control Law models, such as (PID, PI, PD, Feed Forward, Cascaded PI, etc.), as is well known to those skilled in the arts. Process 2588 computes a resultant PWM signal to be applied to actuators.

It should be emphasized that the processes 2582, 2584, 2586, 2587, and 2588 within the implementation 2580 in FIG. 25 preferably run in parallel on the microprocessor 2550, e.g., using a multi-tasking environment. Running all these processes sequentially would dramatically slow the force feedback response to user manipulation of the user object.

The implementation 2580 shown in FIG. 25 is intended as an example of a way to divide the various sub-processes of microprocessor 2550 into logical divisions. In other embodiments, various other implementations can be provided to join or separate some or all of the described functions of microprocessor 2550.

Figure 26:
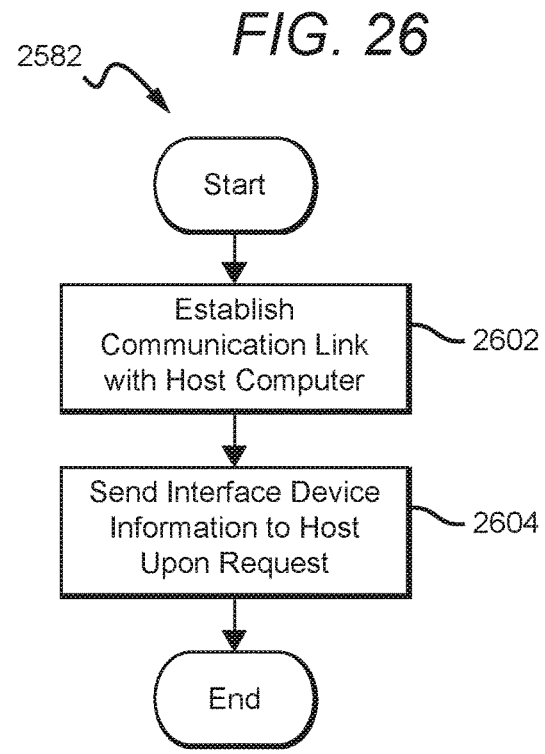
FIG. 26 is a flow diagram illustrating a host communication process of FIG. 25.

FIG. 26 is a flow diagram illustrating the communication process 2582 of FIG. 25 in greater detail. Initially, the host computer will establish a communication link with an interface device in step 2602. This can be accomplished by sending a predetermined signal or information, which the interface device is waiting to receive. The interface device then can send an answer signal indicating it is ready to receive commands.

If the USB communication interface is being used, the command process 2582 preferably requests a USB address from the host, which the processor 2582 then receives and stores. Whenever a data packet is then sent from the host, the command processor can check the address of the data packet and compare it to the stored address to determine if the packet is meant for the microprocessor 2550. In addition, if USB is being implemented, the command processor can check for data in the USB communication protocol and reporting processor can send out data in this protocol. This protocol includes a token packet, followed by a data packet, which is followed by a handshake packet, as is well known to those skilled in the art. The host commands can be encrypted in the data packets.

In next step 2604, the host computer may require the characteristics of the interface device so that appropriate commands suited to the particular interface device can be provided by the host computer. These characteristics may include, for example, the serial number, model number, number of provided degrees of freedom of the user object, calibration parameters, and reporting rate of the interface device. Upon receiving a request for such information from the host computer, such as a "request information" command, the microprocessor 2550 sends the information to the host computer in step 2604. The host computer would normally request these characteristics only at power-up or at the start of force feedback implementation.

Figure 27:
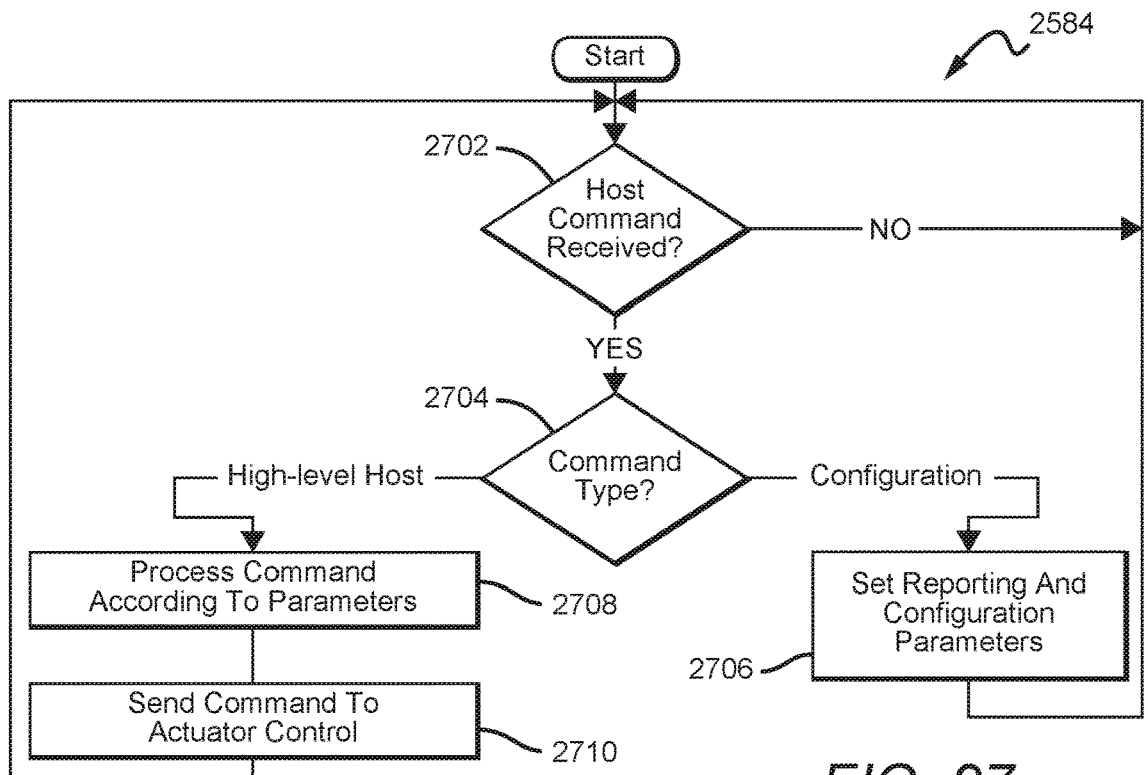
FIG. 27 is a flow diagram illustrating a command process of FIG. 25.

FIG. 27 is a flow diagram illustrating command process 2584 of FIG. 25 in greater detail. In next step 2702, the process checks if a host command has been received. If not, step 2702 loops continuously until a host command is received.

If a host command is received, step 2704 is then implemented, in which the process determines whether the received command(s) is a configuration command. If the command is a configuration command, step 2706 is implemented in which the parameters are set for the reporting process, the sensor update process, and the actuator control process.

If step 2704 determines that the received command is not a configuration command, then step 2704 has detected a high-level host command, which controls force feedback functionality of the interface device. If a high-level host command is detected, step 2708 processes the host command according to the actuator control parameters, and then sends the command to the actuator control processor in step 2710. After step 2706 or 2710 is complete, the process loops control back to step 2702 to wait to receive another host command.

In addition, in the preferred embodiment, process 2584 is also regularly checking for/receiving a heartbeat signal from the host computer after a predetermined time interval. This signal would be a safety check to indicate that the host computer is still connected to an interface device and that the host has an "OK" status. If no heartbeat signal is received within the time interval, the interface device can deactivate and wait for an initialization command from the host. The heartbeat signal can be a normal signal or host command, or it can be a signal specifically used as a heartbeat signal that the host computer can send if no other signals have been sent within the time interval. After a signal has been received in step 2702, process 2584 preferably stores the time that the signal was received in a particular memory location.

Figure 28:
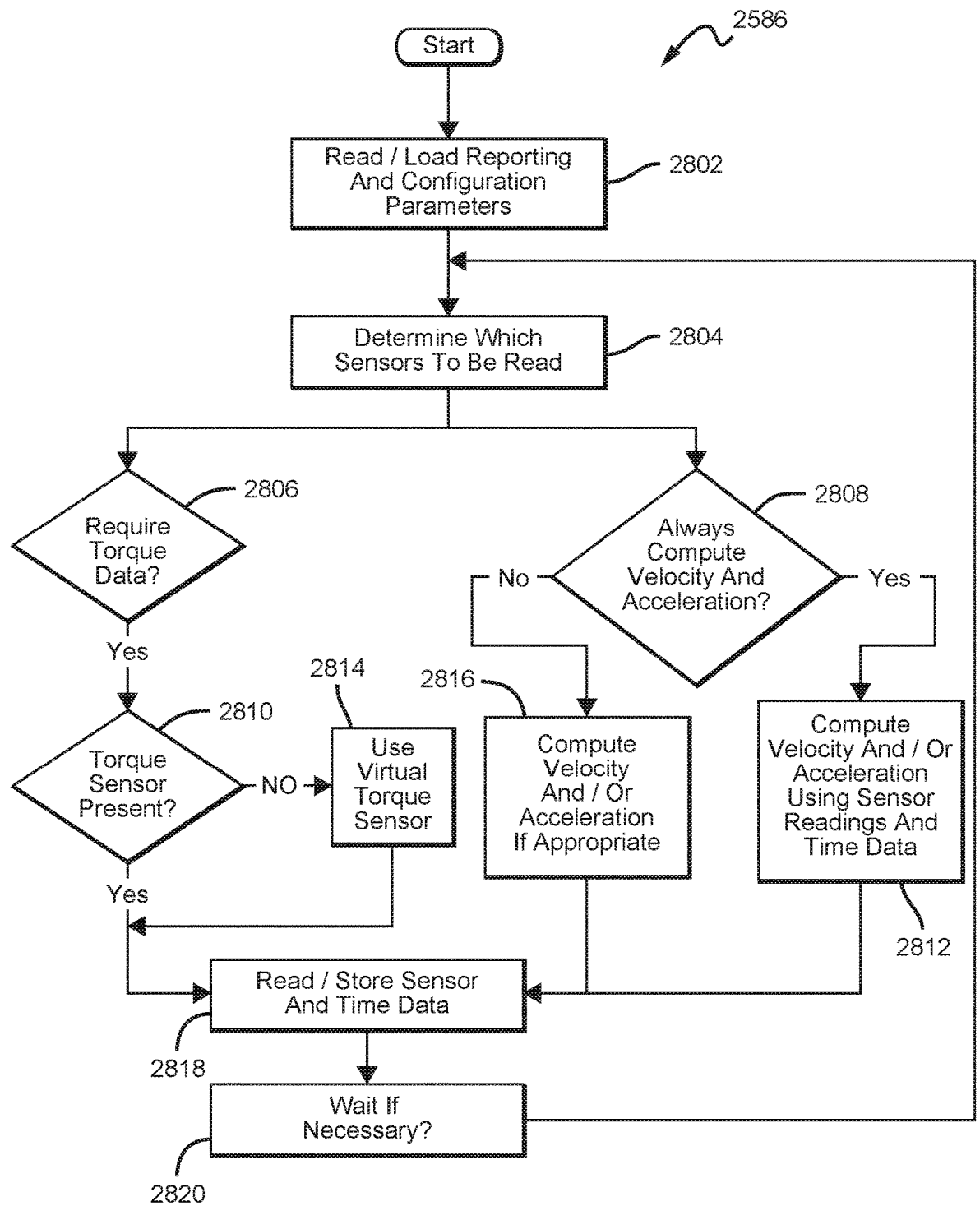
FIG. 28 is a flow diagram illustrating a sensor update process of FIG. 25.

FIG. 28 is a flow diagram illustrating the sensor update process 2586 of FIG. 25. In step 2802, the process 2586 examines the reporting and configuration parameters set by the command process 2584. Preferably, process 2586 examines the reporting and configuration parameters in memory, which have been updated by command process 2584. From both the reporting and configuration parameters, step 2804 determines which sensors will be read. The configuration parameters determine which sensor data is necessary for the actuator control process 2588 and what sensor data is required to be reported to the host.

For example, if the configuration parameters determine that position and force needs to be controlled about the x-axis and not the y-axis, then the sensor data from the y-axis is not needed. The reporting parameters determine which sensor data to report to the host computer. Thus, the reporting parameters may also specify that y-axis sensor data does not have to be sent to the host computer, since the host computer is ignoring that particular data. Thus, since the y-axis data is both not being used to compute a force and is not needed by host, the microprocessor 2550 determines in step 2804 not to read the y-axis sensors.

Step 2808 determines whether velocity and/or acceleration are always computed. The result of this step depends on the particular embodiment that is implemented. In some embodiments, it may be simpler and require less processing time if velocity and/or acceleration data are always computed, regardless of whether the velocity/acceleration data is needed to compute forces or to be sent to host. In other embodiments, the velocity/acceleration data can be computed only if such data is necessary to compute position/force values or if the host requires these values. In yet other embodiments, the mode ("always compute" or "compute only when necessary") can be set depending on the particular application or other determining factor.

In an embodiment that always computes velocity and acceleration, steps 2808 and 2812 are implemented, in which the velocity and/or acceleration values are computed using sensor readings and timing data. For example, a history of recorded position values and associated time intervals can be used to calculate velocity. The process then continues to step 2818. If such an embodiment is not being used, then step 2816 computes the velocity and/or acceleration values only if appropriate. The process 2586 can examine the configuration parameters and reporting parameters, similarly as in step 2804, to determine if velocity and/or acceleration values should be computed.

Step 2806 determines whether torque data is required to be read and stored. If torque data is required in step 2806, then step 2810 checks if a torque sensor is available in the force feedback system. If it is determined that a torque sensor is unavailable, step 2814 uses a Virtual Torque Sensor (VTS) to provide the required data through the Position-to-Force Interface.

After step 2810, 2808, 2814 or 2816, step 2818 is performed, in which the process 2586 stores in memory the sensor data and timing data read from sensors, clock, and computed in step 2808 or 2816. The sensor data and timing data may also include data pertaining to other input devices, e.g., if a button has been pressed (sensor data) on the interface device. As noted above, process 2586 is preferably sharing the microprocessor's 2550 processing time since multiple processes are running in parallel (multi-tasking). In this case, the process 2586 may need to wait at step 2820 until the microprocessor 2550 is available or to purposely allow another waiting process to use microprocessor 2550.

Figure 29:
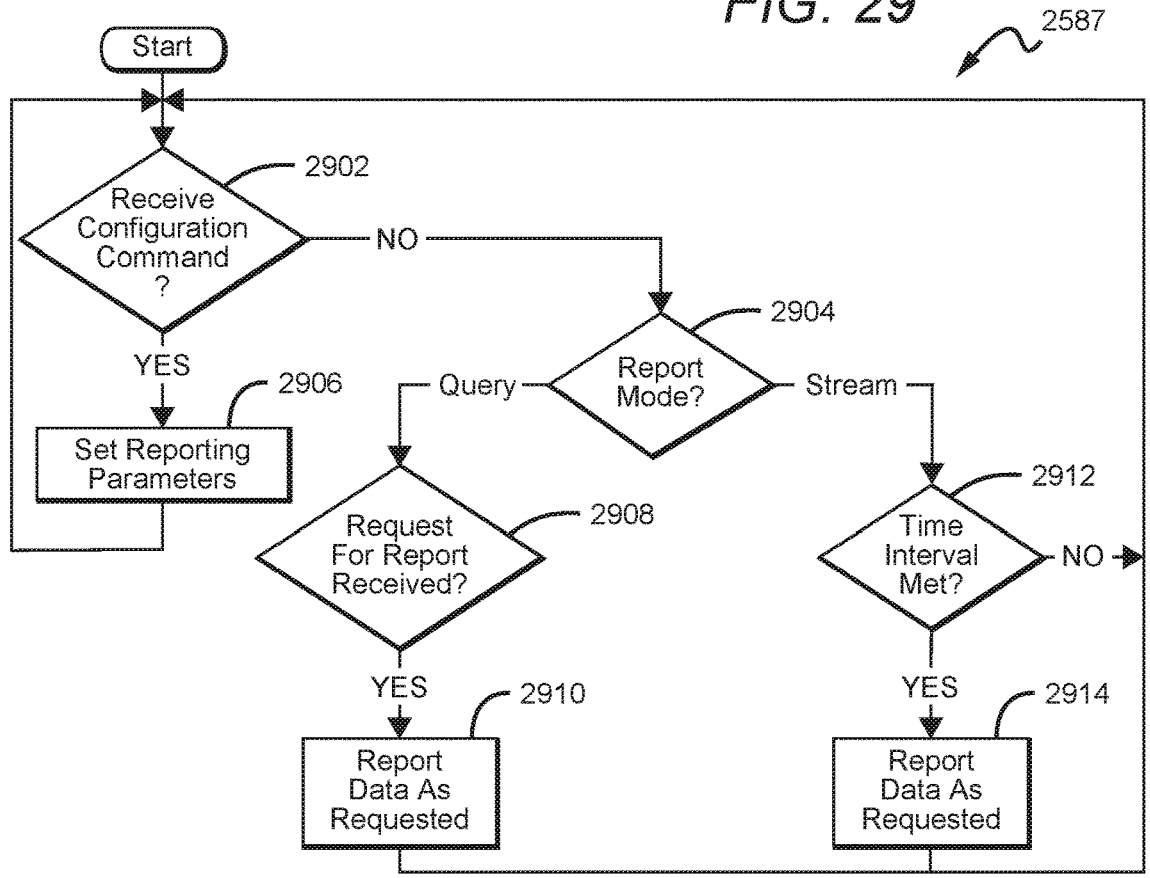
FIG. 29 is a flow diagram illustrating a reporting process of FIG. 25.

FIG. 29 is a flow diagram illustrating reporting process 2587 of FIG. 25 to report data to the host computer. Step 2902 determines if a configuration command is received by command process 2584. If a configuration command is received, step 2906 sets the reporting parameters as specified, then the process loops back to step 2902 to wait to receive another command. If a configuration command is not received, the process continues to step 2904.

Step 2904 determines whether reporting is done in query or stream mode. In this discussion, query mode uses an asynchronous reporting method based on requests for information from the host computer, and stream mode uses a synchronous reporting method based on predetermined time intervals.

In query reporting mode, step 2908 determines whether a request for a report has been received from the host computer. The request can be received directly by reporting process 2587, or, alternatively, the request can be relayed to reporting process 2587 through command process 2584. When the request is received, step 2910 reports (i.e., sends out) sensor data and timing data stored in step 2818 in FIG. 28 and error information and force values from process 2588 to the host. The particular data sent out depends on the reporting parameters specified by the configuration commands and the request received from the host. For example, in some embodiments, the host may be able to request particular information. The process then returns to step 2904 to determine if query or stream mode is being used. Thus, in the described embodiment, modes can be switched at any time during data transmission. In alternate embodiments, one particular reporting mode may be the only option available. Alternatively, both modes may be available, but once one mode is selected at the beginning of the operation of an interface device, that mode may not be switched.

In stream reporting mode, step 2912 determines whether the reporting time period has expired. Preferably, a standard reporting time period is set when the interface device and host computer are first set up. When the time period has expired, step 2914 reports data stored in step 2818 of FIG. 28 in accordance with the reporting parameters. If time has not expired, the process returns to step 2904 to again determine the reporting mode.

Figure 30:
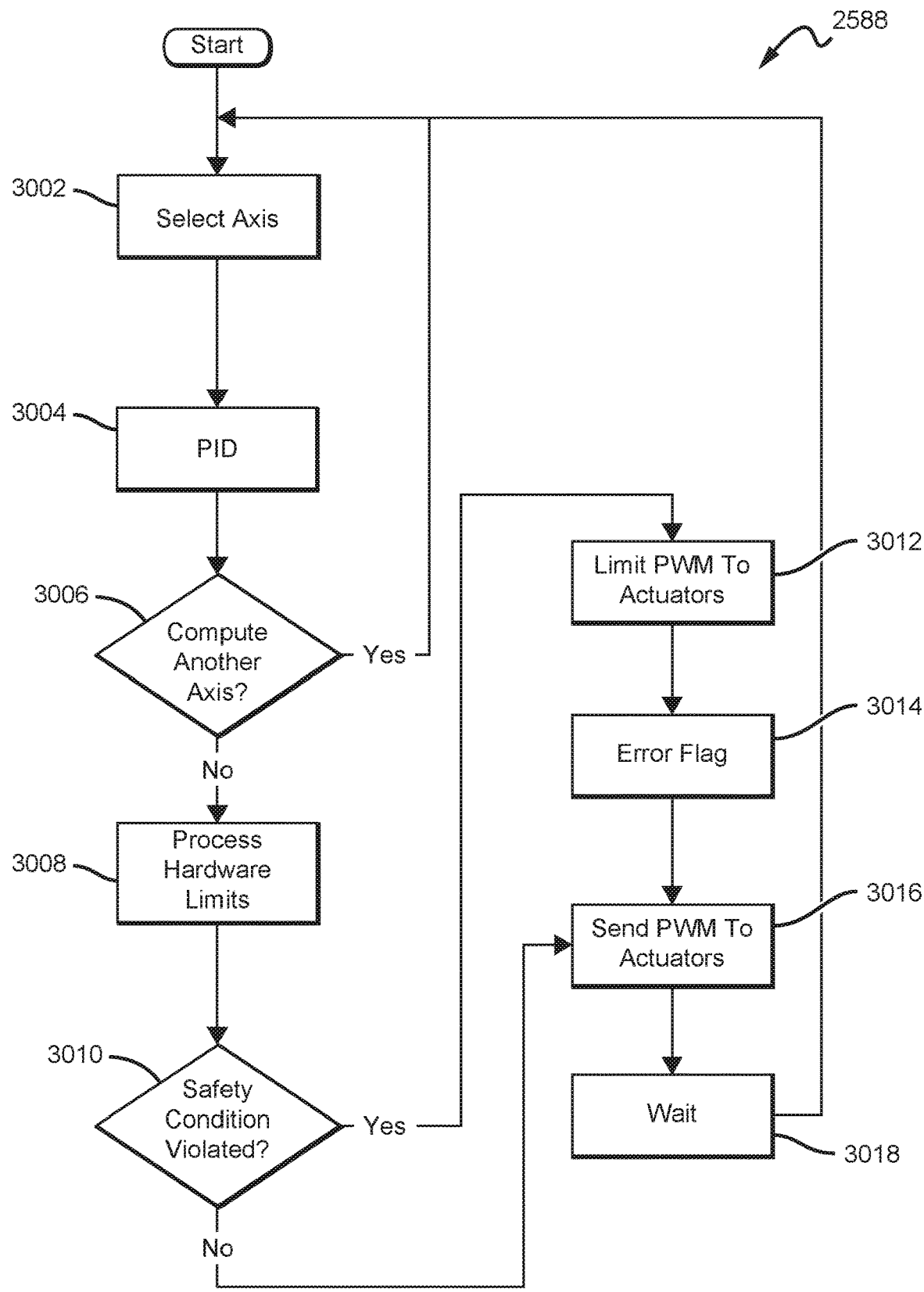
FIG. 30 is a flow diagram illustrating force algorithm computation and actuator control process of FIG. 25.

FIG. 30 is a flow diagram illustrating the actuator control process 2588 of FIG. 25. Preferably, all combined position/compliance setpoints in each degree of freedom are initialized to zero before this process at power up or upon receipt of a clear command from the host computer. Thereafter, process 2588 would begin at step 3002. In step 3002, an axis or degree of freedom for which a position/compliance setpoint is to be applied is selected. Herein, "axis" is synonymous with a degree of freedom provided by the interface device.

In step 3004, process 2588 manages a feedback control system in accordance with configuration parameters, such as a proportional-integral-differential ("PID") control system. Such a control system is a standard system whose properties are well known. FIG. 24 illustrates the structure of a PID control loop, which is well known in the prior art. The PID control loop includes a PID controller and a process which is to be controlled. A process variable PV associated with the process is measured and compared to a setpoint value SP. An error value, defined as the difference of the setpoint and the process value, is supplied as the input to the PID controller. The output of the PID controller drives the "process".

The "process" of a PID controller can include many objectives, but usually this form of a controller is employed to move actuators to the commanded position. For example, in position control, the PID controller will directly command the position of the output mechanism. For instance, if a load is placed on the mechanism, the system will adjust the PWM signal to apply as much power is necessary to reach and maintain the mechanism in the commanded position. By changing the commanded "position", using the PWM signal, one can make the mechanism move in a controlled manner.

The PWM ("pulse width modulation") signal is one method for controlling the actuator(s). In PWM control, the power that is input into the actuator is controlled by arbitrarily changing the width of pulses of a predetermined voltage, during which electricity is supplied. Microprocessor 2550 provides two signals to each actuator: a direction signal and a pulse width modulation signal. The direction signal instructs the actuator(s) to provide force along one of the two directions within its degree of freedom. The PWM signal controls the magnitude of the force by providing a signal having a constant frequency (e.g., 24 kHz) and a varying duty cycle. A high duty cycle provides high magnitude forces, and vice versa. The direction and PWM signals from microprocessor 2550 are input to the actuator interface. Actuator interface provides the control signals from microprocessor 2550 to drive actuators at the proper high current level supplied by power supply.

Process 2588 thus retrieves the necessary sensor data, timing data, actuator control process parameters and/or other data required by step 3004 to manage the feedback control system and thereby compute a PWM signal value for the actuators.

In step 3006, process 2588 determines whether another axis (degree of freedom) needs to have a position/compliance value computed. If so, steps 3002 and 3004 are repeated for other axes until the total position/compliance values for the other axes are computed.

If step 3006 determines that there are no more axes (degrees of freedom) for which forces need to be computed, step 3008 may limit the PWM signal on each axis. Since the total force on an axis computed above may exceed hardware specifications of the interface device, such as actuator force output, step 3008 sets the PWM signal to lie within the hardware's design range. The PWM signal value is limited to a predetermined and user configurable, percentage of the maximum dynamic range of the actuator(s), such as 75% of maximum output. This is done, for example, when the user is placing a load on the mechanism, the system's output capability will not be fully saturated and will have the ability to adjust the PWM signal to apply more power to reach and maintain the commanded position/compliance setpoint. Step 3008 also may modify the total force computed above when it may be unsafe to the user, as indicated by an error flag. For instance, in the preferred embodiment, an error flag may be set if a safety condition is violated, as described in steps 3010-3014 below. This causes the output PWM signal to be zero.

Next, step 3010 applies safety conditions to the total force on each axis resulting from step 3008. Safety conditions may be violated when a specific command is sent by the host computer. When the safety conditions are violated, forces on the actuator(s) are set to zero in step 3012. The error flag is then set in step 3014 indicating the violation and timing information is written as to when the error occurred. Process 2588 then waits in step 3018 until the microprocessor is once again ready to proceed.

As an additional safety feature, process 2588 preferably examines memory to determine if the host's heartbeat signal has been received within the required time interval. If process 2588 determines that the last signal was received outside of the allowed interval, then process 2588 assumes that the host has been disconnected or has had an error. All power to actuators is thus turned off as a safety measure until an appropriate initializing command is received from the host.

If the safety conditions are not violated in step 3010, in step 3016 the PWM signal for each axis is sent to the appropriate actuators to apply corresponding forces on those axes of the user object. In addition, process 2588 can send any error information and any force values that have been output to reporting process 2587, which determines whether to send the data to the host as described above (error information is sent to process 2587 regardless of safety conditions). Preferably, process 2588 writes this information to memory where reporting processor 2587 may retrieve it. Subsequently, process 2588 waits at step 3018 until the microprocessor 2550 is ready. After step 3018, the process returns to step 3002 to select another axis in a new iteration of position/compliance setpoint computation and application.

As stated previously, the systems and methods described herein may be used to control any object in a simulation with any force feedback capable interface device. Although vehicles and steering wheels are used in the examples, they are merely exemplary. These methods and systems may be used with any devices and simulations, for example, joysticks or novel interface devices and first person shooters or other games. These may also be used in aircraft simulations. Aircraft, big and small, typically have a plurality of flight control surfaces—ailerons for roll, elevators for pitch, and the rudder for yaw. Various types of control systems exist for the control of the major flight operating components of modern aircraft. Depending upon the size and type of aircraft, such control systems vary from a yoke or stick connected to a mechanical cable linkage to the latest control technology termed "fly-by-wire." Like vehicles, aircraft systems also provide a mechanical closed-loop that transfers the aircraft dynamics "back" into the cockpit controls. Control systems in aircraft which convert stick, wheel, and pedal motions into control surface deflections constitute the interface between pilot and airframe. The aspect of an aircraft control system which concerns force cues provided to pilots is called the Control Loading System (CLS). Aircraft flight simulators familiarize pilots with the control forces required to perform well-executed maneuvers.

Like vehicles, the CLS must take in inputs from the simulator and pilot and provide outputs for the pilot and simulator. Inputs are application of force and aircraft states and outputs are flight control position and forces. CLSs also include "active side-stick" technology which provides electrical servos that enable the cockpit controls to mimic the action of mechanically linked controls. Data flows from the control to the fly-by-wire system and also from the digital flight controls back to the side-sticks. Data from the flight control computers causes the side-sticks to move together and also moves the side-sticks as the autopilot makes inputs to the flight control system. These may also provide tactile cues for structural and aerodynamic limits, and stick shakers and pushers for stall barrier protection. However, previous to the application of the methods and systems in this application, accurate tactile feedback is not provided on these systems.

In simulations or in actual cockpits, the present methods and systems may be used to provide position control of aircraft control systems and accurately convey force cues from an aircraft or aircraft simulation to a force feedback interface device, such as those modeled after components in a cockpit. The same continuous closed loop system can be used to convey both interface device interactions/forces and aircraft object interactions/forces to the other. As such, stiff position control with variable compliance may be provided to these interface devices, as well.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

For example, many possible types of actuators and sensors can be used in the present invention. Also, many types of mechanisms can be included to provide one or more degrees of freedom to object. In addition, different types of interfaces can be used to connect the host computer to the local microprocessor. A wide variety and types of forces can be transmitted to a user object by the present invention. Many different types of actuator control law models can be implemented in many distinct processes running on the microprocessor, only some of which are described herein.

Furthermore, certain terminology has been used for the purposes of descriptive clarity, and not to limit the present invention. It is therefore intended that the following appended claims include all such alterations, modifications and permutations as fall within the true spirit and scope of the present invention.

It is understood that embodiments presented herein are meant to be exemplary. Embodiments of the present invention can comprise any combination of compatible features shown in the various figures, and these embodiments should not be limited to those expressly illustrated and discussed.

Although the present invention has been described in detail with reference to certain preferred configurations thereof, other versions are possible. Therefore, the spirit and scope of the invention should not be limited to the versions described above.

I claim:

1. A system comprising:
  a computer having a processor and memory containing a vehicle simulation application;
  a simulation interface device configured to provide simulation interface device information to a true force feedback information loop operationally connecting the simulation interface device and the vehicle simulation application;

wherein the true force feedback information loop is configured to provide accurate interaction between the simulation interface device and the vehicle simulation application by adjusting the simulation interface device information in accordance with physics rules programmed into the vehicle simulation application;

wherein the vehicle simulation application is configured to control movement of an in-simulation object based upon in-simulation interaction information, in accordance with the physics rules, and configured to operate without interruption regardless of whether the simulation interface device is providing simulation interface device information;

wherein the vehicle simulation application is configured to compute an error value between a physical orientation and a target orientation of the simulation interface device, the target orientation being based upon a state of the in-simulation object; and wherein the vehicle simulation application is further configured to manage a process of minimizing the error value by:
transmitting commands to the simulation interface device as an output mechanism, the commands moving the simulation interface device to a commanded orientation and maintaining the simulation interface device in the commanded orientation despite external forces being applied to the simulation interface device, wherein deviations from the commanded orientation due to external forces are permitted only if in agreement with in-simulation interaction information, in accordance with the physics rules.

2. The system of claim 1, wherein the moving of the simulation interface device to the commanded orientation is achieved by position control.

3. The system of claim 1, wherein said object in said simulation is at least a portion of a simulated vehicle.

4. The system of claim 1, wherein the simulation interface device is at least a steering wheel.

5. The system of claim 1, wherein interactions of said object are customized by object parameters.

6. The system of claim 1, further comprising a virtual steering rack to control the interactions between said object and said simulation interface device, wherein said virtual steering rack calculates and outputs said commanded orientation.

7. The system of claim 1, further comprising a virtual torque sensor, wherein said virtual torque sensor uses said simulation interface device position displacement to calculate corresponding simulation interface device torque values.

8. A method of providing real-time force feedback comprising:
receiving sensor information from a force feedback interface device;
providing at least one of position and torque information to said force feedback interface device;
receiving data from a simulation related to an object and object position;
providing at least one of position and force data related to said object;
forming a continuous closed loop control system for controlling said object within said simulation, wherein communication within said closed loop control system is bi-directional between said object and said force feedback interface device; and
providing position control of said force feedback interface device, wherein displacement of the force feedback interface device causes displacement of said object, and wherein forces on said object in the simulation cause displacement of the object and displacement of the force feedback interface device;
wherein the position of said force feedback interface device is mapped from said simulation; and
wherein the position of said force feedback interface device is controlled using stiff position control while maintaining variable compliance;
further comprising moving said force feedback interface device to the position.

9. The method of claim 8, wherein said object in said simulation is at least a portion of a simulated vehicle.

10. The method of claim 8, wherein said force feedback interface device is at least a steering wheel.

11. The method of claim 8, further comprising configuring said force feedback interface device, wherein said configuring step comprises detecting said force feedback interface device parameters and setting a setpoint of said force feedback interface device based on said detecting step.

12. The method of claim 8, further comprising configuring said object parameters.

13. The method of claim 8, further comprising configuring a virtual steering rack in order to determine interactions between said object and said force feedback interface device, wherein said virtual steering rack calculates and outputs said force feedback interface device setpoint and compliance or stiffness.

14. The method of claim 13, wherein said virtual steering rack is created by mapping object parameters and force feedback interface device parameters to said force feedback interface device.

15. The method of claim 8, further comprising creating a virtual torque sensor by reading position sensor data from said force feedback interface device and processing said position sensor data through a Position-to-Force Interface.

16. The system of claim 1, wherein the vehicle simulation application is further configured to manage the process of minimizing the error value by adjusting the simulation interface device information to be in agreement with in-simulation interaction information, in accordance with the physics rules.

17. A system comprising:
a force feedback interface device for engagement by a user; and
a simulation, with an object within said simulation;
wherein said force feedback interface device cooperates with said simulation to form a continuous closed loop control system for controlling said object, wherein communication within said closed loop control system is bi-directional between said object and said force feedback interface device;
wherein displacement of said force feedback interface device causes displacement of said object, and wherein forces on and/or interactions with said object in the simulation cause displacement of said object and displacement of said force feedback interface device;
wherein a mapped position of said force feedback interface device is mapped from said simulation; and
wherein a physical position of said force feedback interface device is controlled using stiff position control while maintaining variable compliance so as to minimize any difference between the mapped position of said force feedback interface device and the physical position of said force feedback interface device.

18. The system of claim 17, wherein the physical position of the force feedback interface device is based on physics rules of the simulation.

19. The system of claim 17, wherein the physical position of the force feedback interface device is controlled using a proportional-integral-differential (PID) control system.

20. The system of claim 17, wherein said simulation outputs a setpoint value to said force feedback interface device.

21. The system of claim 20, wherein said setpoint value is a positional value corresponding to the mapped position of the force feedback interface device.

22. The system of claim 21, wherein said simulation compares said setpoint value to a process value based on the physical position of said force feedback interface device, and wherein said physical position is permitted or not permitted based on physics rules of the simulation.

23. The system of claim 17, wherein forces on and/or interactions with said object in the simulation cause displacement of said object regardless of whether there is input from said force feedback interface device.

* * * * *